US006199599B1

(12) United States Patent
Gregg et al.

(10) Patent No.: US 6,199,599 B1
(45) Date of Patent: Mar. 13, 2001

(54) CHEMICAL DELIVERY SYSTEM HAVING PURGE SYSTEM UTILIZING MULTIPLE PURGE TECHNIQUES

(75) Inventors: John N. Gregg, Marble Falls, TX (US); Craig M. Noah, Mountain View, CA (US); Robert M. Jackson, Burnet, TX (US)

(73) Assignee: Advanced Delivery & Chemical Systems Ltd., Austin, TX (US)

( * ) Notice: Subject to any disclaimer, the term of this patent is extended or adjusted under 35 U.S.C. 154(b) by 0 days.

(21) Appl. No.: 09/325,838

(22) Filed: Jun. 4, 1999

Related U.S. Application Data

(63) Continuation-in-part of application No. 09/105,423, filed on Jun. 26, 1998, and a continuation-in-part of application No. 09/046,907, filed on Mar. 24, 1998.

(60) Provisional application No. 60/134,584, filed on May 17, 1999, provisional application No. 60/133,936, filed on May 13, 1999, provisional application No. 60/091,191, filed on Jun. 30, 1998, provisional application No. 60/088,405, filed on Jun. 8, 1998, and provisional application No. 60/052,219, filed on Jul. 11, 1997.

(51) Int. Cl.[7] ................................ B65B 1/04; B65B 3/04

(52) U.S. Cl. .................................. 141/1; 141/47; 141/49; 141/63; 141/104; 137/209; 137/240

(58) Field of Search .......................... 141/1, 4, 5, 47–49, 141/63, 64, 104, 100, 18, 21, 56, 57; 137/209, 240; 222/152

(56) References Cited

U.S. PATENT DOCUMENTS

| | | | |
|---|---|---|---|
| 2,160,062 | 5/1939 | Drake et al. . | |
| 2,536,273 | 1/1951 | Gahagan . | |
| 2,777,914 | 1/1957 | Brown . | |
| 3,034,543 | 5/1962 | Du Bois . | |
| 3,081,905 | 3/1963 | Schulze et al. . | |
| 3,419,695 | 12/1968 | Dinkelkamp et al. . | |
| 3,646,293 | 2/1972 | Howard | 200/84 |
| 3,653,549 | 4/1972 | Cannon | 222/132 |
| 3,731,805 | 5/1973 | Schniers | 210/86 |
| 3,930,591 | 1/1976 | Hawerkamp | 220/66 |
| 4,056,979 | 11/1977 | Bongort et al. | 73/313 |
| 4,064,755 | 12/1977 | Bongort et al. | 73/313 |
| 4,134,514 | 1/1979 | Schumacher et al. | 220/85 |
| 4,298,037 | 11/1981 | Schumacher et al. | 141/1 |

(List continued on next page.)

OTHER PUBLICATIONS

"Announcing A New Era In Liquid Chemical Delivery" Transfill II; Schumacher; Apr. 1990.
"B/W Unifloat® Liquid Level Control System".
"Gas Cylinder Enclosures and Optional Temperature Control" Semi–Gas Systems, Inc.; Bul. No. 8603; Apr. 1990.
"MDOT™ Mass Flow Control System"; Schumacher; 1991 Air Products and Chemicals, Inc. Aug. 1991, Rev. 1.

*Primary Examiner*—Henry J. Recla
*Assistant Examiner*—Tuan Nguyen
(74) *Attorney, Agent, or Firm*—O'Keefe, Egan & Peterman, LLP

(57) ABSTRACT

A chemical delivery system which utilizes multiple techniques to achieve a suitable chemical purge of the chemical delivery system is provided. A purge sequence serves to purge the manifold and canister connection lines of the chemical delivery system prior to removal of an empty chemical supply canister or after a new canister is installed. More particularly, a purge technique which may utilizes a variety of combinations of a medium level vacuum source, a hard vacuum source, and/or a liquid flush system is disclosed. By utilizing a plurality of purge techniques, chemicals such as TaEth, TDEAT, BST, etc. which pose purging difficulties may be efficiently purged from the chemical delivery system. The chemical delivery system may also be provided with an efficient and conveniently located heater system for heating the chemical delivery system cabinet.

93 Claims, 63 Drawing Sheets

U.S. PATENT DOCUMENTS

| | | | |
|---|---|---|---|
| 4,425,949 | 1/1984 | Rowe, Jr. | 141/1 |
| 4,436,674 | 3/1984 | McMenamin | 261/64 |
| 4,576,552 | 3/1986 | Smith | 417/2 |
| 4,676,404 | 6/1987 | Yamazaki et al. | 222/56 |
| 4,730,491 | 3/1988 | Lew | 73/308 |
| 4,859,375 | 8/1989 | Lipisko et al. | 261/20 |
| 4,976,146 | 12/1990 | Senghaas et al. | 73/313 |
| 4,979,545 | 12/1990 | Fair | 141/83 |
| 4,979,643 | 12/1990 | Lipisko et al. | 222/83 |
| 5,038,840 | 8/1991 | Fair | 141/83 |
| 5,041,267 | 8/1991 | Randtke et al. | 422/102 |
| 5,069,244 | 12/1991 | Miyazaki et al. | 137/209 |
| 5,079,950 | 1/1992 | McKiernan et al. | 73/313 |
| 5,090,212 | 2/1992 | Keltner et al. | 62/149 |
| 5,103,673 | 4/1992 | Sawada et al. | 73/313 |
| 5,137,063 | 8/1992 | Foster et al. | 141/98 |
| 5,148,945 | 9/1992 | Geatz | 222/1 |
| 5,279,338 | 1/1994 | Goossens | 141/95 |
| 5,285,812 | 2/1994 | Morales | 137/393 |
| 5,329,963 | 7/1994 | Jones et al. | 141/6 |
| 5,465,766 | 11/1995 | Siegele et al. | 141/198 |
| 5,479,959 | 1/1996 | Stotelmyer et al. | 137/559 |
| 5,551,309 | 9/1996 | Goossens et al. | 73/863 |
| 5,562,132 | 10/1996 | Siegele et al. | 141/198 |
| 5,590,695 | 1/1997 | Siegele et al. | 141/21 |
| 5,607,002 | 3/1997 | Siegele et al. | 141/198 |
| 5,628,342 | 5/1997 | McNealy et al. | 137/587 |
| 5,711,354 | 1/1998 | Siegele et al. | 141/198 |
| 5,878,793 | 3/1999 | Siegele et al. | 141/63 |

CHEMICAL DELIVERY SYSTEM HAVING PURGE SYSTEM UTILIZING MULTIPLE PURGE TECHNIQUES

This application is a continuation-in-part of Ser. No. 09/046,907 filed Mar. 24, 1998 and a continuation-in-part of Ser. No. 09/105,423 filed Jun. 26, 1998, which claims priority to provisional application Ser. No. 60/052,219 filed Jul. 11, 1997; and this application claims priority to the following additional U.S. provisional applications Ser. No. 60/088,405 filed Jun. 8, 1998, Ser. No. 60/091,191 filed Jun. 30, 1998, Ser. No. 60/133,936 filed May 13, 1999, and Ser. No. 60/134,584 filed May 17, 1999; and this application claims priority to PCT application number PCT/US98/14373 filed Jul. 10, 1998, which in turn claims priority to Ser. No. 08/893,913 filed Jul. 11, 1997, and provisional Ser. No. 60/057,262 filed Aug. 29, 1997; the disclosures all of which are expressly incorporated herein by reference.

BACKGROUND OF INVENTION

This invention generally pertains to systems and manifolds for delivering chemicals from bulk delivery canisters to manufacturing process tools such as chemical vapor deposition (CVD) devices, and more particularly for process tools utilized in the fabrication of integrated circuits.

The production of electronic devices such as integrated circuits is well known. In certain steps in such production, chemical may be fed to certain process tools which use the chemical. For instance, a CVD reactor is commonly employed to generate a layer of a given material, such as a dielectric or conductive layer. Historically, the process chemicals were fed to the CVD reactor via bulk delivery cabinets. The chemicals used in the fabrication of integrated circuits must have a ultrahigh purity to allow satisfactory process yields. As integrated circuits have decreased in size, there has been a directly proportional increase in the need for maintaining the purity of source chemicals. This is because contaminants are more likely to deleteriously affect the electrical properties of integrated circuits as line spacing and interlayer dielectric thickness decrease. The increasing chemical purity demands also impact the chemical delivery systems.

Thus, there exists a need for improved chemical delivery systems such that impurities are not introduced into the process tools during chemical canister replacement or refilling procedures, and other maintenance procedures. The impurities of concern may include particles, moisture, trace metals, etc. In order to meet these more demanding requirements, improved manifold systems are required.

Further as chemical purity demands have increased, the variety of chemicals utilized in integrated circuit manufacturing have increased. Moreover, some of the chemicals being contemplated for integrated circuit manufacturing exhibit more demanding physical properties and/or are more toxic than previous chemicals utilized, thus placing additional demands upon the chemical delivery system. For example, very low vapor pressure chemicals having a vapor pressure of less than 100 mT and even less than 10 mT are contemplated for use in integrated circuit manufacturing. One such chemical, TaEth (tantalum pentaethoxide) has a vapor pressure of less than 1 mT and is contemplated for use in the CVD formation of dielectric layers. Another such chemical, TDEAT (tetrakis(diethylamido)titanium) has a vapor pressure of approximately 7 mT and is contemplated for use in the CVD formation of titanium nitride layers. Yet another low vapor pressure chemical is TEASate (triethyl arsenate). Additional low vapor pressure chemicals may be those utilized to deposit conductor layers formed of copper or TaN. Because the vapor pressures of such chemicals are so low, traditional methods of purging the manifold system of a chemical delivery system are inadequate. While existing manifolds adequately allow traditional compounds to be removed from the lines and manifold through repeated vacuum/gas purge cycles, such vacuum/gas purge cycles may not adequately remove very low vapor pressure materials. Thus, a need exists for an improved method and apparatus for purging a manifold system such that very low vapor pressure chemicals may be adequately purged from the various components of the chemical delivery system. Further, materials such as TaEth may require heating of the chemical cabinet. It is thus desirable to have a chemical delivery system which efficiently incorporates a heating system into the gas cabinet.

Other chemicals also place increased demands upon the purging techniques utilized. For example, chemicals which include solid compounds in solution with a liquid may also be used as reactants in the manufacture of integrated circuits. The solid compounds are typically stored in chemical canisters as dispersions in an organic liquid. For example, solid reactants such as barium/strontium/titanate (BST) cocktails (solutions) utilized for forming dielectric layers may be dispersed in a liquid such as tetrahydrofuran (THF) or triglyme. A wide variety of other solid materials may also be used in conjunction with other organic liquids, such as for example as described in U.S. Pat. No. 5,820,664 the disclosure of which is incorporated herein by reference.

When such solid compositions are sold and used in canisters, the canisters are often adapted such that they may be connected to a manifold for distribution of the chemical, such as described in U.S. Pat. Nos. 5,465,766; 5,562,132; and 5,607,002. However, when the canister is changed, existing manifolds do not adequately accommodate the ability to clean out the manifold and lines prior to change out. Thus, if a vacuum/gas purge cycle is used with a solid/liquid composition, the liquid will be evaporated away to leave solid compounds in the lines. This is unacceptable, especially if the canister is being changed out to another compound since the line is contaminated. Particle contamination and chemical concentration variation may cause severe process problems at the process tool. A solution to this problem would be highly desirable.

Further, it is desirable to improve the clean out and purge processes because the chemicals utilized may be highly toxic, noxious, etc. Thus, it is desirable to reduce the residual levels of low vapor pressure chemicals (such as discussed herein) within the manifold and lines of the chemical delivery system.

Moreover, at least some of the chemicals contemplated for use in deposition systems have ambient temperature requirements which may require elevated temperatures to prevent solidification. Thus, a chemical delivery system which addresses the above described problems while efficiently and economically providing a controlled temperature environment is desirable.

SUMMARY OF INVENTION

The present invention provides a solution to one or more of the disadvantages and needs addressed above. More particularly, a chemical delivery system which utilizes multiple techniques to achieve a suitable chemical purge of the chemical delivery system is provided. A purge sequence serves to purge the manifold and canister connection lines of the chemical delivery system prior to removal of an empty chemical supply canister or after a new canister is installed. More particularly, a purge technique which may utilize at least one of a variety of combinations of a medium level vacuum source, a hard vacuum source, and/or a liquid flush system is disclosed. By utilizing a plurality of purge techniques, chemicals such as TaEth, TDEAT, BST, etc. which pose purging difficulties, may be efficiently purged from the chemical delivery system. The chemical delivery system may also be provided with an efficient and conveniently located heater system for heating the chemical delivery system cabinet. Advantageously, the manifold of this invention enables improved purge efficiency for low vapor pressure materials and toxic chemicals.

In one respect, the present invention may include a method of purging a low vapor pressure chemical from a chemical delivery system having a plurality of valves and lines. The method may include utilizing a first purging technique to remove chemical, gas, or contaminants from within at least some of the valves and lines; utilizing a second purging technique to remove chemical, gas, or contaminants from within at least some of the valves and lines; and utilizing a third purging technique to remove chemical, gas, or contaminants from within at least some of the valves and lines. In this method, each of the first, second and third purging techniques may be different. The first purging technique may be a first vacuum step, the second purging technique may be a flowing purge step utilizing an inert gas, and the third purging technique may be a liquid flush step. Alternatively, the third purging technique may be a second vacuum step, the first and second vacuum steps utilizing different types of vacuum sources.

Another method according to the present invention is a method of operating a chemical delivery system for delivery of chemicals to a semiconductor process tool. The method may include providing at least one liquid chemical from the chemical delivery system to the semiconductor process tool; purging at least a portion of the chemical delivery system of gas, the liquid chemical or contaminants, the purging including the use of at least three different purging techniques; and changing at least one canister of the chemical delivery system, the canister containing the at least one liquid chemical.

In yet another embodiment of the present invention, a method of purging a low vapor pressure liquid chemical from a chemical delivery system is provided. The method may include providing the low vapor pressure liquid chemical to at least one line or valve of the chemical delivery system; and purging the at least one line or valve of the low vapor pressure liquid chemical, the purging including the use of at least three different purging techniques. The low vapor pressure liquid chemical may be TaEth, TDEAT or BST or other low vapor pressure chemicals.

In another embodiment, a method of forming a dielectric layer upon a semiconductor substrate is provided. The method includes providing the semiconductor substrate, the substrate having one or more layers; providing a deposition process tool; and coupling a chemical delivery system to the deposition process tool to provide a low vapor pressure liquid chemical to the deposition process tool. The method further includes periodically purging at least a portion of the chemical delivery system of the low vapor pressure liquid chemical, the purging including the use of at least three different purging techniques; and depositing the dielectric layer upon the semiconductor substrate by utilizing the low vapor pressure liquid chemical within the deposition process tool. The low vapor pressure liquid chemical may be TaEth or BST.

In still another embodiment, a method of forming a layer containing titanium upon a semiconductor substrate is provided. The method may include providing the semiconductor substrate, the substrate having one or more layers; providing a deposition process tool; and coupling a chemical delivery system to the deposition process tool to provide a low vapor pressure liquid chemical to the deposition process tool. The method may also include periodically purging at least a portion of the chemical delivery system of the low vapor pressure liquid chemical, the purging including the use of at least three different purging techniques; and depositing the layer containing titanium upon the semiconductor substrate by utilizing the low vapor pressure liquid chemical within the deposition process tool. The low vapor pressure liquid chemical may be TDEAT. The layer may comprise titanium nitride.

In one embodiment, the present invention may be a chemical delivery system. The chemical delivery system may include at least one canister inlet and at least one canister outlet line; a plurality of manifold valves and lines; a first purge source inlet coupling a first purge source to the plurality of manifold valves and lines; a second purge source inlet coupling a second purge source to the plurality of manifold valves and lines; and a third purge source inlet coupling a third purge source to the plurality of manifold valves and lines, the first, second and third purge sources each being different types of purge sources. The first purge source may be a first vacuum source, the second purge source may be a gas source and the third purge source may be a liquid source. Alternatively, the third purge source may be a second vacuum source, the first and second vacuum sources being different types of vacuum sources.

In another embodiment, a chemical delivery system for delivery of low vapor pressure liquid chemicals to a semiconductor process tool is provided. The system may include at least one chemical output line, the chemical output line coupled to the manifold of the chemical delivery system and operable to provide the low vapor pressure liquid chemical to the semiconductor process tool; at least three purge source inlet lines, the purge source inlet lines coupling at least three different purge sources to the manifold; and one or more refillable canisters coupled to the manifold. The one or more refillable canisters may comprise at least a first canister and a second canister. Further the low vapor pressure liquid chemical may be provided to the semiconductor process tool from the second canister, the chemical delivery system being capable of refilling the second canister from the first canister. The system may alternatively be capable of providing liquid chemical from both the first canister and the second canister to the semiconductor process tool.

Another embodiment of the invention disclosed herein may include a cabinet for housing a chemical delivery system. The cabinet may include a plurality of cabinet walls forming an interior cabinet space, at least one of the cabinet walls being a door, at least one heater element disposed in or adjacent to the door, and an air flow passage in close proximity to the at least one heater element. The cabinet may further include at least one heat exchange element within the air flow passage, the heat exchange element being thermally coupled to the heater. The heat exchange element may be a plurality of fins. The air flow passage may be formed along a back side of a wall of the door and the heater element may be formed along a front side of the wall of the door. The door of the cabinet may have a cavity and an interface structure within the cavity, the interface structure forming at least a portion of the wall of the door. The heater may be recessed within the door.

Another embodiment of disclosed invention may include a temperature controlled cabinet for housing a liquid chemical delivery system. The cabinet may include at least one door, at least one heater element disposed in or on the door; an air vent within the door; and an air flow passage in close proximity to the at least one heater element, the air flow passage thermally communicating with the at least one heater element, the air vent providing an air inlet for the air flow passage.

In still another embodiment, a temperature controlled cabinet for housing a liquid chemical delivery system is provided. The cabinet may include a plurality of cabinet walls; and at least one heater element disposed in or on at least a first cabinet wall, the heater element being located on exterior side of the first cabinet wall and thermal energy from the heater being coupled to the interior of the cabinet through the first cabinet wall. The first cabinet wall may be at least a portion of a cabinet door. The cabinet may further comprise an air passage adjacent an interior side of the first cabinet wall.

Yet another embodiment of the present invention is a method of controlling the temperature of a cabinet housing a chemical delivery system. The method may include providing a plurality of cabinet walls forming an interior cabinet space; locating at least one heater element within or in close proximity to at least a first cabinet wall; and thermally transferring energy from the heater to the interior cabinet space utilizing the first cabinet wall as a heat transfer mechanism.

In yet another embodiment, a method of controlling the temperature of a cabinet housing a liquid chemical delivery system is provided. The method may include providing a plurality of cabinet walls forming an interior cabinet space; locating at least one heater element on an exterior side of at least a portion of a first cabinet wall; thermally transferring energy from the heater to an interior side of the first cabinet wall, utilizing the first cabinet wall as a heat transfer mechanism; and heating the interior cabinet space by flowing air across the interior side of the first cabinet and circulating side air within the interior cabinet space.

Still another embodiment of the present invention is a chemical delivery system manifold useful for delivery of liquid chemicals from a canister. The manifold may include a vacuum supply valve coupled to a vacuum generator; a pressure vent valve coupled to the vacuum generator; and a carrier gas isolation valve coupled to a carrier gas source. The manifold further includes a process line isolation valve coupled to a bypass valve and a canister outlet line, the canister outlet line capable of being coupled to a canister outlet valve; a flush inlet valve coupled between the carrier gas isolation valve and the bypass valve, the flush inlet valve capable of being connected to a liquid flush source; and a canister inlet line capable of being coupled between a canister inlet valve and the bypass valve.

Also disclosed is a chemical delivery system manifold useful for delivery of liquid chemicals from a canister. The system may include a first vacuum supply valve for coupling the manifold to a first vacuum source; a second vacuum supply valve for coupling the manifold to a second vacuum source, the first and second vacuum sources being different types of vacuum sources; and a pressure vent valve coupled to either or both of the first and second vacuum sources. The system may also include a carrier gas isolation valve coupled to a carrier gas source; a process line isolation valve coupled to a bypass valve and a canister outlet line, the canister outlet line capable of being coupled to a canister outlet valve; and a canister inlet line capable of being coupled between a canister inlet valve and the bypass valve. The manifold may also include a flush inlet valve coupled between the carrier gas isolation valve and the bypass valve, the flush inlet valve capable of being connected to a liquid flush source.

In another embodiment a chemical delivery system is disclosed. The chemical delivery system may include (1) a vacuum supply valve; (2) a vacuum generator; (3) a carrier gas isolation valve; (4) a bypass valve; (5) a process line isolation valve; (6) a liquid flush inlet valve; (7) a low pressure vent valve; (8) a canister inlet valve; and (9) a canister outlet valve. The system may be configured such that the vacuum supply valve is connected to the vacuum generator; the carrier gas isolation valve is connected to the liquid flush inlet valve; and the liquid flush inlet valve is connected to the bypass valve. Also, the bypass valve is further connected to the process line isolation valve; the low pressure vent valve is connected to the vacuum generator; the process line isolation valve is also connected to the canister outlet valve; and the canister inlet valve is connected to the canister outlet valve.

Also disclosed is a method of purging a low vapor pressure liquid chemical from a chemical delivery system. The method may include providing a manifold. The manifold may comprise a vacuum supply valve coupled to a vacuum source, a pressure vent valve coupled to the vacuum supply valve, a carrier gas isolation valve coupled to a carrier gas source, a process line isolation valve coupled to a bypass valve and a canister outlet line, the canister outlet line capable of being coupled to a canister outlet valve, a flush inlet valve coupled between the carrier gas isolation valve and the bypass valve, the flush inlet valve capable of being connected to a liquid flush source, and a canister inlet line capable of being coupled between a canister inlet valve and the bypass valve. The method also comprises providing the low vapor pressure liquid chemical to at least one line or valve of the chemical delivery system; and purging the at least one line or valve of the low vapor pressure liquid chemical, the purging including the use of at least three different purging techniques.

In still another embodiment, a method of purging a low vapor pressure liquid chemical from a chemical delivery system is provided. The method may include providing a manifold. The manifold may comprise a vacuum supply valve coupled to a vacuum source, a pressure vent valve coupled to the vacuum supply valve, a carrier gas isolation valve coupled to a carrier gas source, a process line isolation valve coupled to a bypass valve and a canister outlet line, the canister outlet line capable of being coupled to a canister outlet valve, and a canister inlet line capable of being coupled between a canister inlet valve and the bypass valve. The method may further comprise providing the low vapor pressure liquid chemical to at least one line or valve of the chemical delivery system; purging the at least one line or valve of the low vapor pressure liquid chemical, the purging including the use of at least three different purging techniques.

BRIEF DESCRIPTION OF THE DRAWINGS

FIGS. 5A–5M illustrate a dual tank chemical delivery system having a medium level vacuum, flowing purge and flush liquid purge.

FIGS. 7A–7M illustrate a dual tank chemical delivery system having a medium level vacuum, flowing purge, flush liquid purge and hard vacuum.

DETAILED DESCRIPTION OF THE INVENTION

Figure 1A:
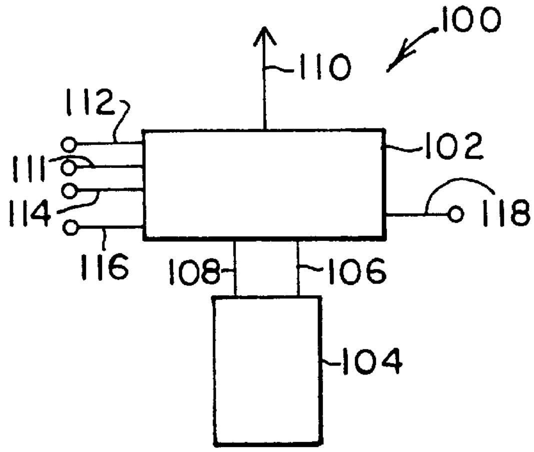
FIGS. 1A and 1B depict a representative chemical delivery system of the present invention.

The problems discussed above and others are addressed through the use of a chemical delivery system which utilizes multiple techniques to achieve a suitable chemical purge of the chemical delivery system. A purge sequence serves to purge the manifold and canister connection lines of the chemical delivery system prior to removal of an empty chemical supply canister or after a new canister is installed.

The types of chemicals which may be utilized with the present invention may vary widely depending on the type of process tool and desired outcome. The techniques of the present invention are particularly advantageous for use with liquid chemical delivery systems in which liquids are supplied for use with CVD systems, such as for example, as used in semiconductor manufacturing. Non-limiting examples of representative chemicals include TDEAT, tetraethylorthosilicate ("TEOS"), triethylphosphate, trimethyl phosphite, trimethyl borate, titanium tetrachloride, tantalum compounds such as TaEth, and the like; solvents such as chlorinated hydrocarbons, ketones such as acetone and methylethylketone, esters such as ethyl acetate, hydrocarbons, glycols, ethers, hexamethyldisilazane ("HMDS"), and the like; solid compounds dispersed in a liquid such as barium/strontium/titanate cocktails (mixtures). These examples of chemicals are not intended to be limiting in any way. The chemicals may be of a variety of purities, and mixtures of chemicals can be used. In one embodiment, a single type of chemical is employed. A given chemical may advantageously have a purity of 99.999% or more with respect to trace metals. In one embodiment of this invention, the canister 104 is at least partially filled with a chemical which is at least 99.99999999% pure based on the amount of trace metals in the chemical. The chemicals and delivery systems disclosed herein may be used in conjunction with any of a wide variety of process tools such as LPCVD, PECVD, APCVD, MOCVD, etc. tools.

More particularly, according to the present invention a purge technique which utilizes a variety of combinations of some or all of the following purge techniques: a first vacuum source, a flowing purge (i.e. a flow of an inert gas to flush process chemical out of the manifold lines), a second vacuum source, and/or a liquid flush system. The first and second vacuum sources may generally be different vacuum sources that may have different vacuum levels. In one example, the first vacuum sources may be a vacuum typically in the range of less than 100 T, and more typically 50 to 100 T, and such vacuum sources may be called "medium level vacuums". Further in such example, the second vacuum source may be a vacuum typically less than 100 mT and more typically in the range of 100 mT to I mT, and such vacuum sources may be called a hard vacuum. However, it will be recognized that the levels disclosed herein are illustrative and other higher or lower vacuum levels may be utilized for the first and second vacuum sources. In one embodiment the first (or medium level) vacuum source may be a Venturi vacuum source. By utilizing a plurality of purge techniques, chemicals such as TaEth, TDEAT, BST, etc. which pose purging difficulties may be efficiently purged from the chemical delivery system.

FIG. 1A represents a chemical delivery system 100 configured to utilize multiple purge techniques. The chemical delivery system 100 shown in FIG. 1A is a single tank chemical delivery system for illustrative purposes to demonstrate the principles of the present invention. The system may be any of a number of differently configured systems such as a dual tank non-refillable system (two chemical canisters without the ability to refill one canister with the other), a dual tank refillable system (two chemical canisters with the ability to refill one canister with the other), a bulk delivery system utilizing a large bulk canister to refill one of more process canisters (within or remote from the chemical delivery system), a system having three canisters or more, etc. For illustrative purposes, FIG. 1B represents a chemical delivery system 100 utilizing two chemical canisters.

Figure 1B:
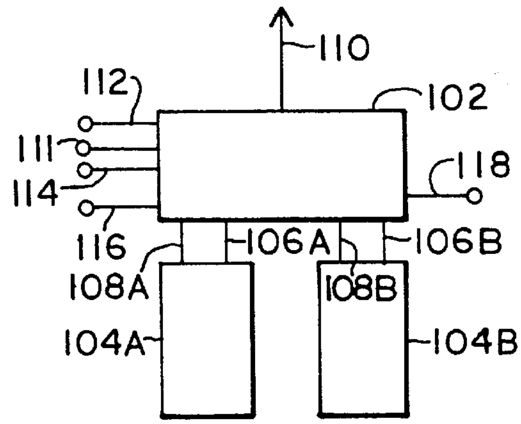
Figure 2A:
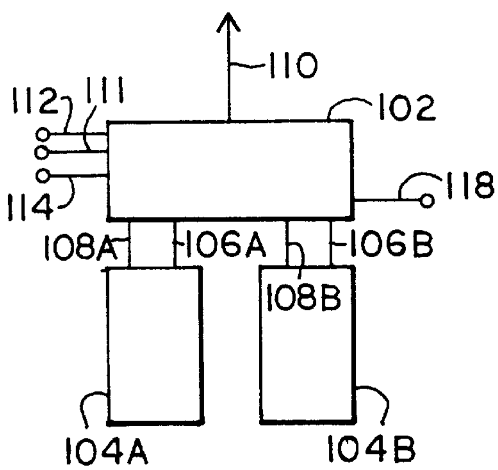
FIGS. 2A, 2B, and 2C illustrates alternative purge configurations according to the present invention.
Figure 2B:
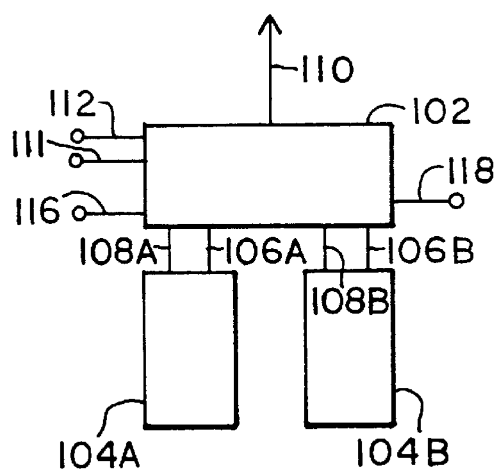
Figure 2C:
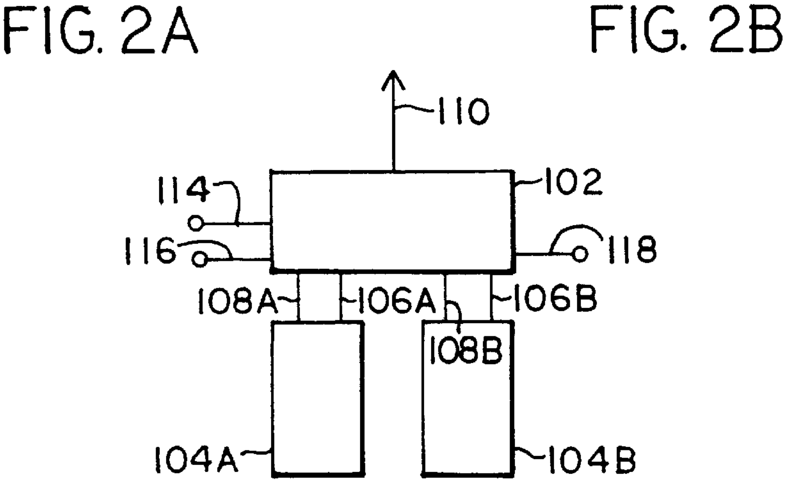

As shown in FIGS. 1A and 1B, the chemical delivery system 100 includes a manifold system 102. The manifold system includes the valves and lines of the chemical delivery system. Though shown as a single block, the manifold system may be comprised a plurality of manifold systems (or sub-manifolds). Thus, it will be recognized that the term manifold may refer to all the valves and lines of the delivery system and also may be used to refer to some portion of the valves and lines. The manifold(s) may be formed in a single chemical delivery system cabinet or may be distributed amongst a plurality of cabinets or even located outside of a cabinet. The system 100 may also include a canister 104 (or canisters 104A and 104B as shown in FIG. 1B), and a chemical outlet line 110 (also referred to as a process line) to provide chemical to a process tool such as a chemical vapor deposition tool. Though shown as one outlet line 110, line 110 may be comprised of two or more branch lines and associated branch isolation and purge lines. The system 100 also includes canister inlets and outlets 108 and 106 respectively (or inlets 108A and 108B and outlets 106A and 106B as shown in FIG. 1B). Coupled to the manifold system 102 are four input lines utilized for purging activities, a medium level vacuum line 112, a purge gas input 111, a hard vacuum line 114, and a liquid flush line 116. A waste output line 118 is also provided. The waste output may be coupled to a waste output container (within or remote to the delivery system) or a dedicated waste line in a user's facility. The medium level vacuum line 112 may be coupled to a medium level vacuum source such as a Venturi vacuum generator. The purge gas input 111 may be connected to an inert gas line such as a helium, nitrogen or argon line in order to create a flowing purge through the manifold. The hard vacuum line 114 may be connected to a hard vacuum source such as a stand alone vacuum pump. However, in a preferred embodiment the hard vacuum source may be the process tool vacuum as described in more detail below. The liquid flush line 116 may be a source for a flush liquid such as solvents tetrahydrofuran (THF) or triglyme. The particular solvent used will vary depending on availability, cost and the type of materials being purged from the lines. In general, the solvent will be matched to allow for adequate dispersion of solid chemicals, solubization of thick materials, dilution of high vapor pressure chemicals (without solidification of the chemicals due to presence of the solvent), and the like. For example, if a solid active chemical dispersed in triglyme is being purged, triglyme may be used to initially clean out the lines optionally followed by treatment with THF to remove trace amounts of triglyme. Alternatively, THF may alone be used, circumstances permitting. In another example, TaEth is flushed with ethanol or hexene. Other examples may include using n-butyl acetate to flush BST contained in a butyl acetate solution. The liquid flush line 116 may be coupled to a dedicated flush liquid canister or alternatively may be coupled to the liquid supply lines in a user's facility. The medium level vacuum line 112, purge gas line 111, hard vacuum line 114 and liquid flush line 116 may each be used to help purge from the manifold system 102 hard to purge chemicals such as TaEth, TDEAT, BST, etc. The present invention may also be utilized while using less than all four of the input lines. Thus as shown as exemplary embodiments in FIGS. 2A, 2B, and 2C, a combination of less than four of the input lines may be used.

By utilizing a plurality of purging techniques in combination (medium level vacuum, flowing purge, hard vacuum, or liquid flush) the particular benefit of each technique may be advantageously utilized while any disadvantages of a particular technique are minimized. A hard vacuum is advantageous in that lower pressures may be obtained. However, a stand alone hard vacuum source generally is more expensive, requires more maintenance, is larger, requires more facilities, and creates more waste as compared to Venturi vacuum sources. By utilizing a Venturi medium level vacuum system, though, a stand alone hard vacuum source is not necessary. Rather, the hard vacuum source typically present in a process tool may be tapped into. The process tool hard vacuum source may be utilized by itself or subsequent to use of the Venturi vacuum to lower pressures within the manifold system 102. Then the hard vacuum from the process tool may be switched on to lower the pressure levels within the manifold even further. By first utilizing the medium level vacuum to lower pressures, the hard vacuum is placed under less load. By lowering the load on the hard vacuum, the hard vacuum source internal to the process tool may be utilized without jeopardizing the quality of any process being performed within the process tool. Thus, the use of the Venturi vacuum allows the use of a readily available hard vacuum source without the additional costs associated with stand alone hard vacuum sources or dedicated hard vacuum sources.

Similarly, flushing a manifold with a liquid in combination with one or more vacuum sources is an advantageous purge technique. If the chemical being delivered is solid suspended in an organic liquid, the manifold may be designed so as to allow for liquid flush of all the lines to prevent solids accumulating in the lines upon evaporation of the organic liquid. If dispersions are employed, it is preferable to flush the lines out with liquid solvents such as triglyme or tetrahydrofuran (THF) so that compounds are not precipitated in the lines when the lines are depressurized. For example, a liquid flush may be utilized prior to a vacuum purge in order to remove any solid residues which may result when vacuum pumping a manifold which contains certain solid containing chemicals such as BST. In addition, a liquid flush may provide advantages to help remove very low vapor pressure chemicals from piping that has long lengths and/or is narrow (situations in which even a hard vacuum may not adequately purge a manifold).

Figure 3A:
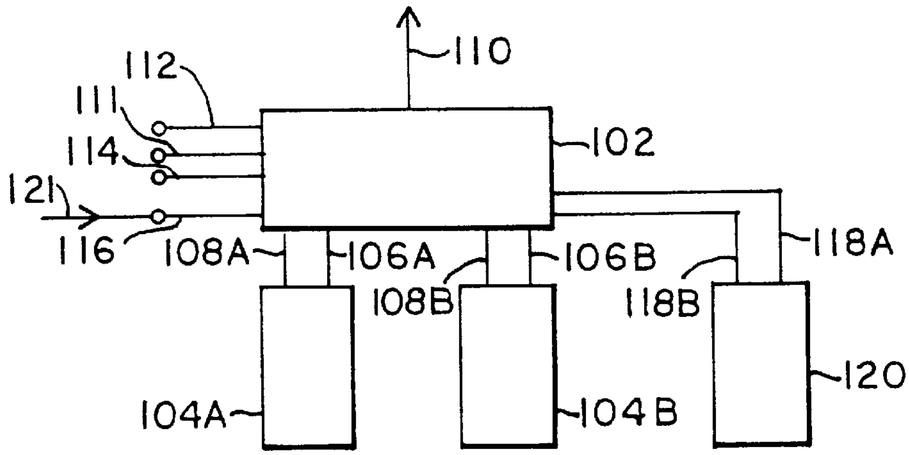
FIGS. 3A, 3B, and 3C illustrate alternative purge configurations according to the present invention.
Figure 3B:
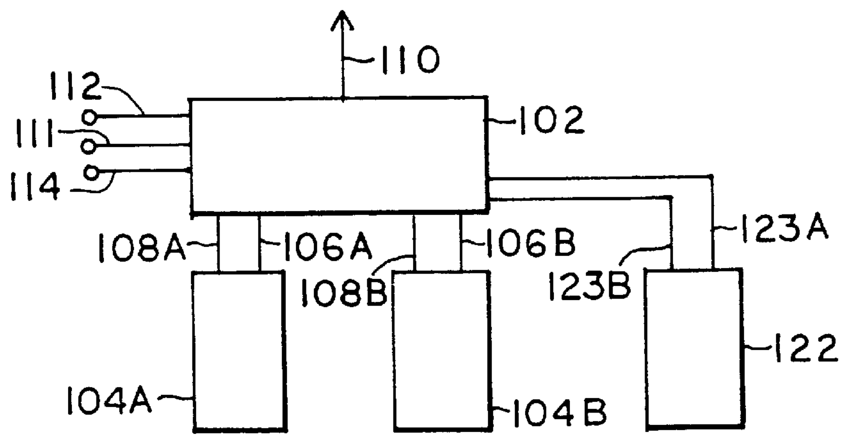
Figure 3C:
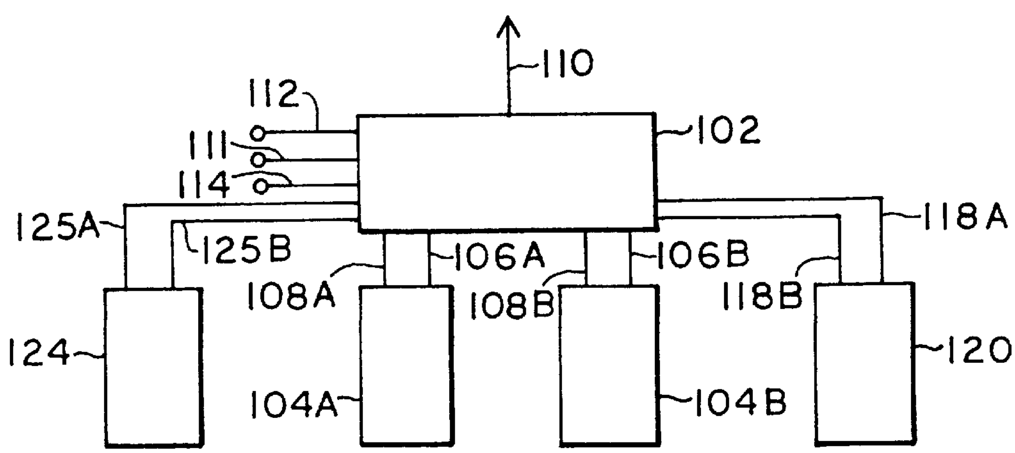

When a liquid flush is utilized, a variety of methods for injecting and removing the liquid from the manifold may be utilized. FIGS. 3A, 3B, and 3C illustrate three examples for injecting and removing the liquid from the manifold; however, other techniques may also be used. Further, though for illustrative purposes, FIGS. 3A, 3B, and 3C show purge techniques in combination with a dual tank system having both a medium level vacuum input 112, a purge gas input 111 and a hard vacuum input 114. The purge techniques shown may be utilized with the other system/canister configurations discussed herein. As shown in FIG. 3A, a flush liquid input 116 may be provided. In one configuration the flush liquid may be supplied from a dedicated chemical supply line 121 of a user's standard facilities lines. The liquid waste generated by the liquid flush activities may be provided to a waste container 120. An alternate configuration of the system of FIG. 3A may be a system without the flush liquid input 116 and the waste container 120. Such a system would thus utilize three purging techniques, a medium level vacuum purge, a hard vacuum purge, and a flowing gas purge. As shown in FIG. 3B, a combination flush liquid source and waste container 122 may be utilized. In this configuration, liquid to flush the manifold 102 is supplied from the container 122 and also returned to the container 122 as waste through lines 123A and 123B. FIG. 3C illustrates yet another configuration in which a dedicated liquid source container 124 supplies flush liquid through the use of lines 125A and 125B and a dedicated liquid waste container collects the liquid waste through lines 118A and 118B. As will be described in more detail below, the waste containers need not only collect flush liquids but may also collect process liquids which are drained from at least some of the manifold lines as part of the purging process. It will be recognized that canisters 124, 122 and 120 (or other portions of chemical delivery system) may be located integrally within one chemical delivery system housing or may be located external to the chemical delivery system and that functionally, the systems disclosed herein would operate the same independent of the placement of the canisters.

For some embodiments of the inventions disclosed herein, the precise configuration of the manifold 102 is not critical in the practice of this invention so long as the function of providing a stream of chemical to the process tool and allowing an adequate purge is achieved. The configuration of the valves in the manifold 102 may be varied to allow for independent purging and maintenance of individual lines.

It will be recognized that many manifold and canister configurations may also be utilized according to the present invention, including but not limited to the illustrative examples discussed in more detail below. Additional manifold configurations such as described in U.S. Pat. Nos. 5,465,766; 5,562,132; 5,590,695; 5,607,002; and 5,711,354, all of which are incorporated herein by reference, may also be utilized with appropriate modifications to accommodate a flowing purge, a liquid flush and/or a hard vacuum.

A manifold for use with the present invention may be advantageously designed such that there are no un-purged dead legs in the manifold, lines, and fittings. In this regard, the design may advantageously minimize bends in tubing interconnection lines and flex lines by utilizing short straight lines when possible. Further, the design may advantageously utilize SVCR fittings (straight VCR fittings). In general, pressure in the system is adjusted so that pressure on the upstream side is higher than on the downstream side. It should be appreciated that a wide variety of valves may be used in the manifold, including but not limited to manually activated valves, pneumatically activated valves, or any other type of valve. The manifold valves may be controlled using process control instrumentation. The controller may administrate a purge sequence and a normal run mode.

During a run mode, the system will provide chemical to the process tool, which may be initiated after installation of a bulk chemical supply.

Typically, the entire manifold system may be cleared or purged of process chemical prior to a canister change-out or shut down by alternating flowing gas purges, vacuum cycles and/or liquid purges. A brief overview of typical cycling is first provided herein with more detailed examples following. Generally to begin a purge cycle the chemical canister is first pressurized. Then a vacuum line dry down may be accomplished through the use of a cycle purge. As used herein a cycle purge is vacuum step flowed by a flowing gas purge. The cycle purge may be repeated any number of times to obtain the desired dry down or removal of chemical. The vacuum line dry down step removes moisture from the vacuum lines from reacting with chemicals in the lines between the canister outlet and the process line output 110. The vacuum could be a medium level vacuum generated from a Venturi generator and/or a hard vacuum from a vacuum pump. After the line dry down, the manifold lines which are exposed to and contain the process chemical are drained back into the canister (into the canister output).

After the line drain, the general purge sequences may vary depending upon whether a liquid flush or a hard vacuum is utilized. For example, if a liquid flush is utilized (without a hard vacuum), the manifold lines which were exposed to the process chemical are flushed with the liquid solvent. Then, these lines are subject to cycle purge of a medium level vacuum followed by a flowing purge of an inert gas in order to remove any residual solvent vapors. The canister may then be removed or exchanged. During the canister change, the flowing purge may continue in order to prevent ambient atmosphere from entering and contaminating the manifold. After a new canister is attached to the manifold a final cycle purge of vacuum step followed by a flowing gas purge may be performed to remove any traces of atmosphere from the fittings of the new canister.

If a hard vacuum is utilized with a liquid flush, the general purge sequence after a line drain may be as follows. After the line drain, the manifold lines which were exposed to the process chemical are subjected to a medium level vacuum. Next these lines are subjected to the hard vacuum. The medium level vacuum is utilized first so as to minimize the load upon the hard vacuum as discussed above. Then a flowing purge may be initiated prior to and during the canister change. After the canister change, a cycle purge may be initiated followed by a hard vacuum final pumpdown.

A non-limiting example of a representative manifold design is illustrated in FIGS. 4A–4I. FIGS. 4A–4I illustrate one embodiment of a manifold system having multiple purging techniques. For illustrative purposes, FIGS. 4A–4I illustrate the use of a medium level vacuum, flowing purge and liquid flush as the plurality of purging techniques. Moreover, a single canister system is also shown for demonstrative purposes and the inventions disclosed herein are not limited to these specific examples. For each of the valves in the figures, the open triangles represent lines which are always open, with the darkened triangles being closed until opened.

Figure 4A:
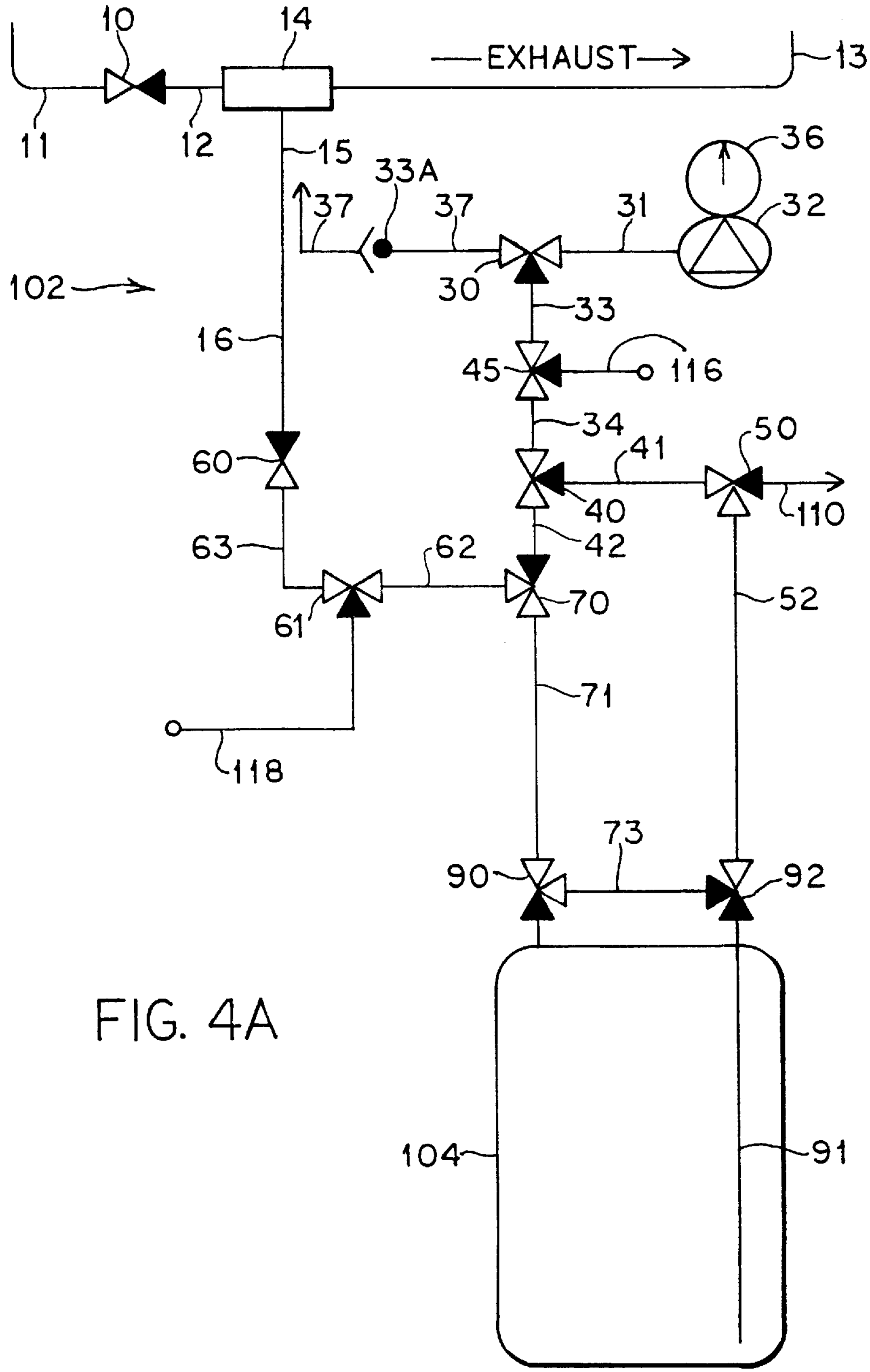
FIGS. 4A–4R illustrate manifold systems utilizing a medium level vacuum, a flowing purge and a liquid flush.

In FIG. 4A, a vacuum source 14 such as a Venturi vacuum generator may be connected to vacuum supply valve ("VGS") 10 via line 12. VGS 10 functions to control the flow of gas (such as nitrogen, helium, or argon) via inert gas line 11 to the vacuum source 14 if the vacuum source is a Venturi vacuum generator. Vacuum source 14 may also be attached to exhaust line 13 which exits to exhaust. Vacuum source 14 may be connected to low pressure vent valve ("LPV") 60. In FIG. 4A, vacuum source 14 is connected to LPV 60 via line 15 and line 16. Check valve 33A in line 37 is closed unless and until the manifold eclipses the desired release pressure. Line 37 is vented to the cabinet exhaust. Generally, the check valve 33A may be set to activate if the manifold pressure surpasses a preset level, such as about 75 pounds per square inch. The check valve is coupled to the carrier gas isolation valve ("CGI") 30. CGI 30 may also be referred to as a carrier gas inlet valve. The check valve serves to vent gas if pressure in the system reaches a selected level. Line 31 may connect CGI 30 to regulator 32 which may supply a flow of pressurized inert gas. A delivery pressure gauge 36 may be tied into regulator 32 to monitor regulator pressure and pressure during all operations.

In FIG. 4A, flush line inlet valve ("FLI") 45 may be coupled to CGI 30 through line 33. FLI 45 is coupled to the flush liquid input 116. Line 34 may connect FLI 45 to canister bypass valve ("CBV") 40. Lines 41 and 42 may attach CBV 40 to process line isolation valve ("PLI") 50 and to control valve ("CP2") 70 respectively. PLI 50 is coupled to the process line output 110. The function of PLI 50 is to control the flow of chemical out of the manifold. CGI 30 functions to control the pressurized gas supply to the manifold. The function of CBV 40 is to control the supply of pressure or vacuum to PLI 50 and to line 71. Line 110 may carry chemicals to either a process tool outside the delivery system, or in a dual tank refill system, to another canister to be refilled. A canister outlet line 52 may serve to link PLI 50 to canister outlet valve ("CO") 92. Line 62 may connect CP2 70 to Liquid Waste Output valve ("LWO") 61. LWO 61 is connected to the waste output line 118. LWO 61 is also coupled to LPV 60 through line 63. From control valve 70, the canister inlet line 71 may lead to canister inlet valve ("CI") 90. CI 90 functions to control pressurization and evacuation of a canister. Line 73 may link CO 92 and CI 90. CO 92 functions to control the flow of chemical from a canister 110 during chemical delivery and the purging of the canister outlet weldment during canister changes. CI 90 and CO 92 serve to couple the manifold to the corresponding structures on a chemical canister 104, typically in conjunction with fittings such as male and female threaded joints. Fittings (couplers) to join the manifold to canister 104 are typically present in lines 71 and 52. CO 92 is a dual activator valve such that line 73 connects the dual activator valve directly to CI 90. Alternatively if CO 92 is not a dual activator valve, an additional valve may be placed above CO 92 and an additional line placed from the additional valve to couple the additional valve to line 71.

The aforementioned lines, which may also be referred to as conduits, tubing, pipes, passages, and the like, may be constructed of many types of materials, for example, such as 316L stainless steel tubing, teflon tubing, steel alloys such as Hastalloy, etc. Each of the valves may be conventional pneumatically actuated valves, such as a NUPRO 6L-M2D-111-P-III gas control valve. Likewise, the regulator can be a standard type, such as an AP Tech 1806S 3PW F4—F4 V3 regulator. The system may be assembled using conventional methods, such as by using pressure fitting valves, by welding, and the like. The valves may be controlled using conventional process control such as an Omron programmable controller box wired to a touch screen control panel. Alternatively, the valves may be controlled using an ADCS APC™ Controller which incorporates an imbedded microprocessor for command sequence execution, with software residing on an EPROM. The control unit, for example, may control flow of pressurized gas to open or close pneumatic valves.

Figure 4B:
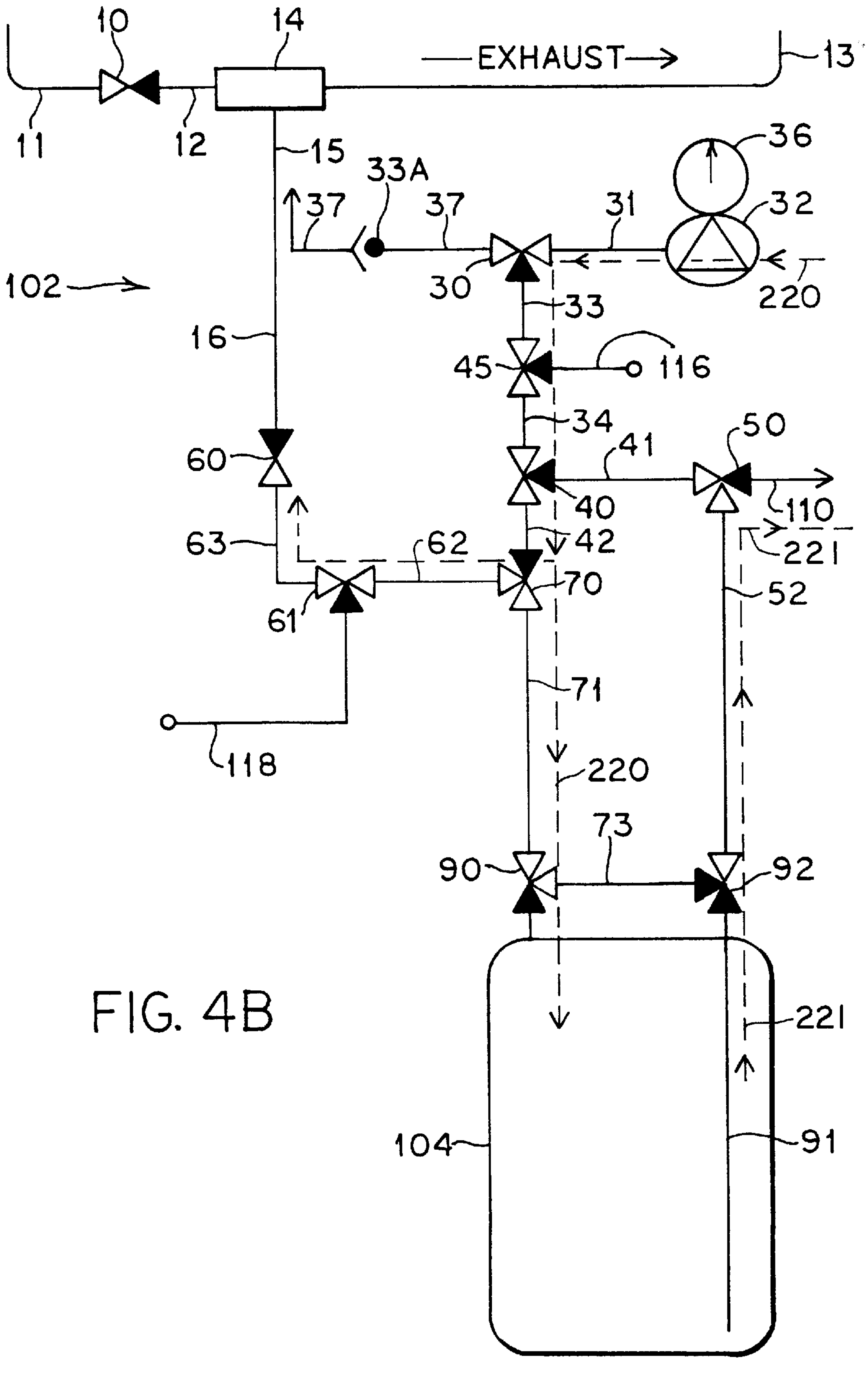
Figure 4C:
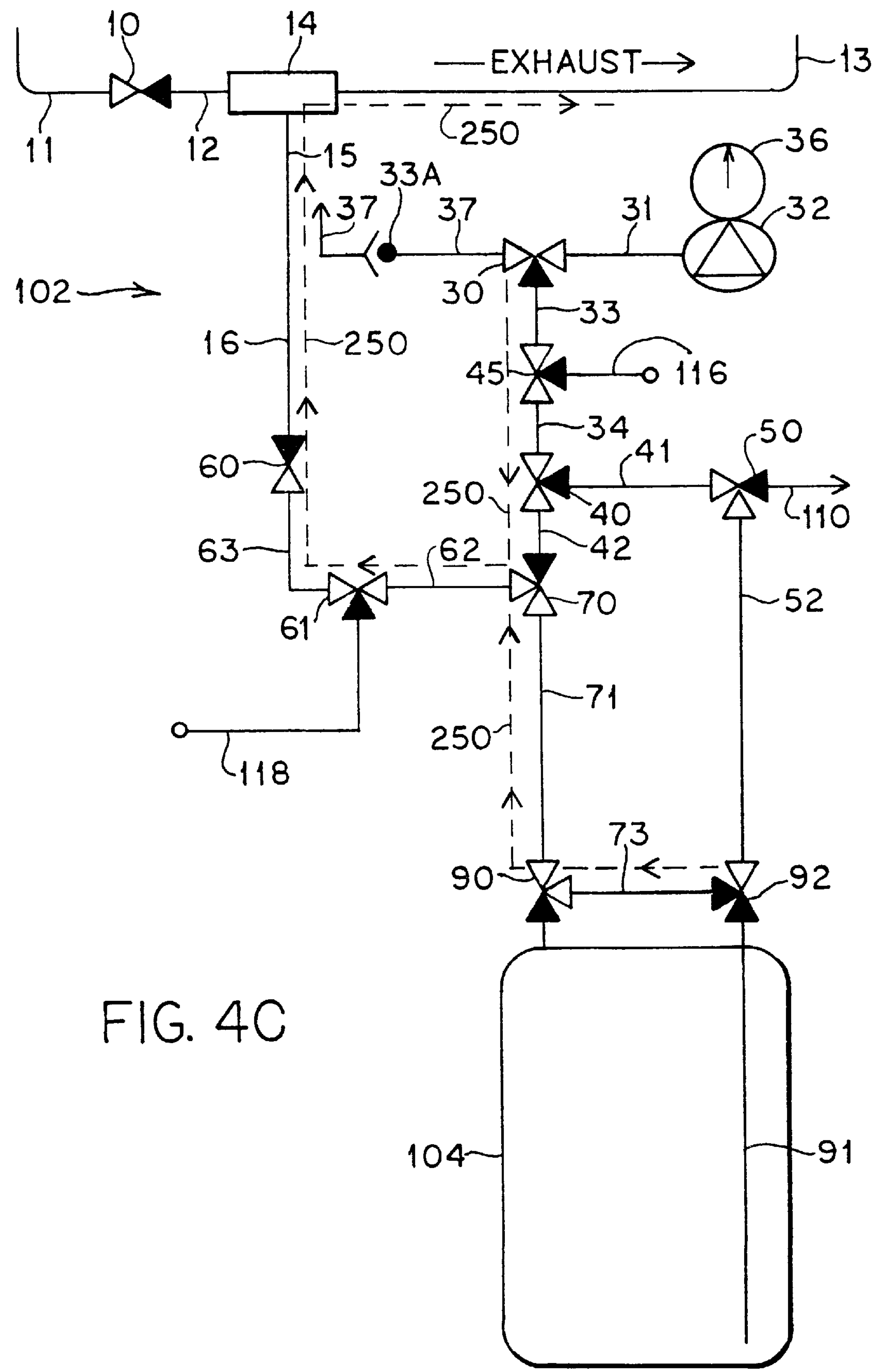

During use, the manifold of this invention may be operated as follows. To push chemical out of the canister 104 to the delivery point, the valves in the manifold are appropriately opened and closed to allow pressurized gas into the system and into the canister. In FIG. 4B, dashed line 220 illustrates the path of pressurized gas entering canister 104, with dashed line 221 showing the path of liquid chemical exiting canister 104 through a dip tube 91. Thus, pressurized gas from a source (not shown) is released by regulator 32 into line 31. The gas thereafter passes through open CGI 30, then through line 33, FLI 45, CBV 40, line 42, opened CP2 70, line 71, CI 90, and into canister 104. Pressure from entering gas forces liquid chemical up the dip tube, and through CO 92, line 52, PLI 50, and out line 110 to the receiving point (for example, a CVD process tool).

When a supply canister (even a full canister) is being changed out, the lines may be purged to rid the manifold of residual chemicals. The first step to rid the manifold of residual chemicals is a cycle purge step which includes a vacuum step and a flowing purge step respectively. The cycle purge may include repeatedly performing the vacuum and flowing purge in an alternating manner. A single vacuum step is discussed below with reference to FIG. 4C and a single flowing purge step is discussed below with reference to FIG. 4D. The vacuum step may be accomplished in a variety of ways, including via the configuration depicted by dashed line 250 FIG. 4C. Thus, in one embodiment, LPV 60 and CP2 70 are opened such that when VGS 10 is opened to allow gas into vacuum source 14 via lines 11 and 12, a vacuum is drawn out to exhaust via line 13, with a vacuum thus being pulled on lines 15, 16, 63, 62, 42, 34, 33, 71, and 73.

Figure 4D:
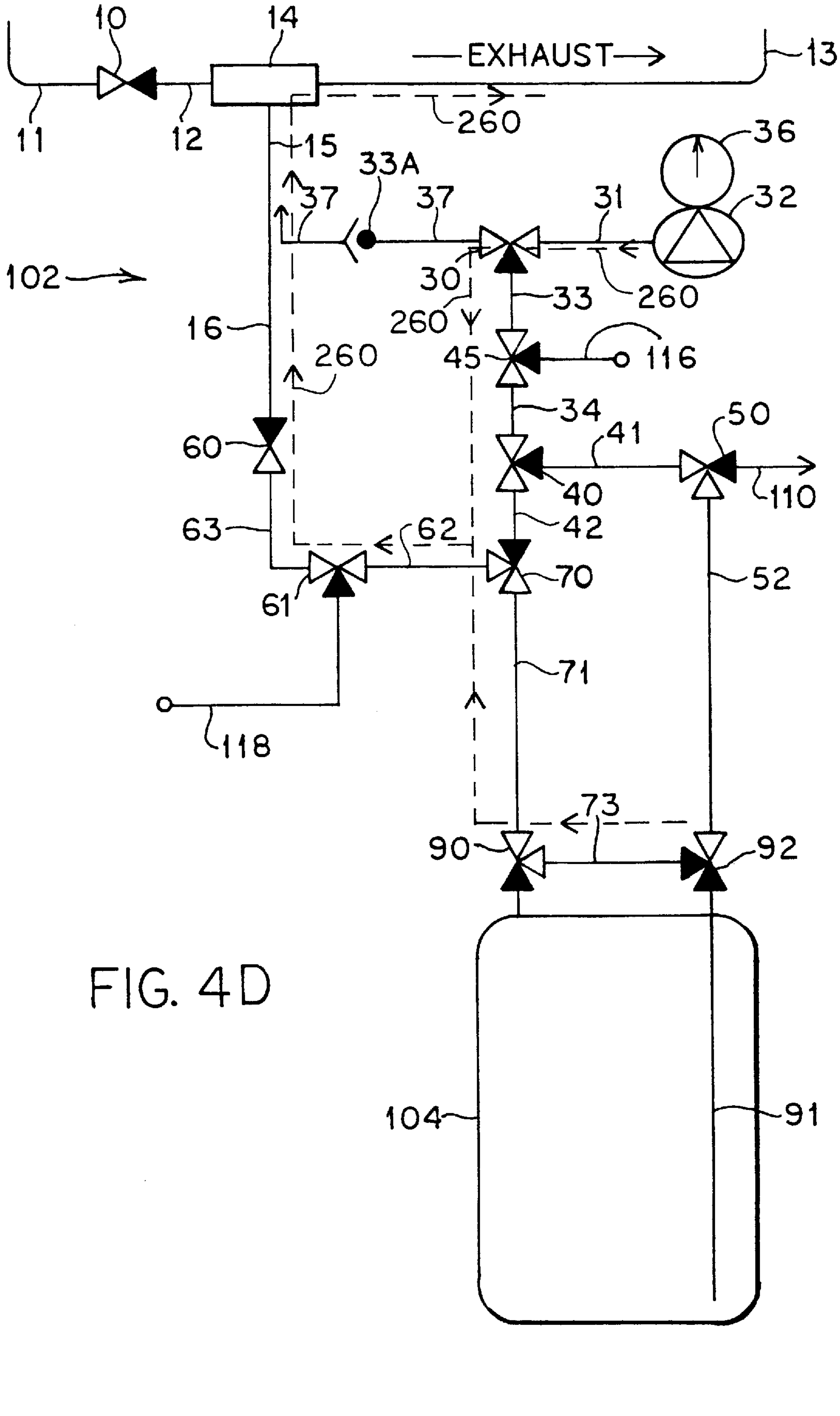

In FIG. 4D, a flowing purge of the vacuum line dry down cycle purge is illustrated. In FIG. 4D, regulator 32 allows pressurized gas to enter line 31. With CGI 30, CP2 70, and LPV 60 open, the gas flows through lines 31, 33, 34, 42, 71, 73, 62, 63, 16, 15, and 13 to thereby purge the manifold, as depicted in FIG. 4D by dashed line 260. One advantage of this step is to remove moisture and oxygen from lines such as lines 13, 15 and 16.

Figure 4E:
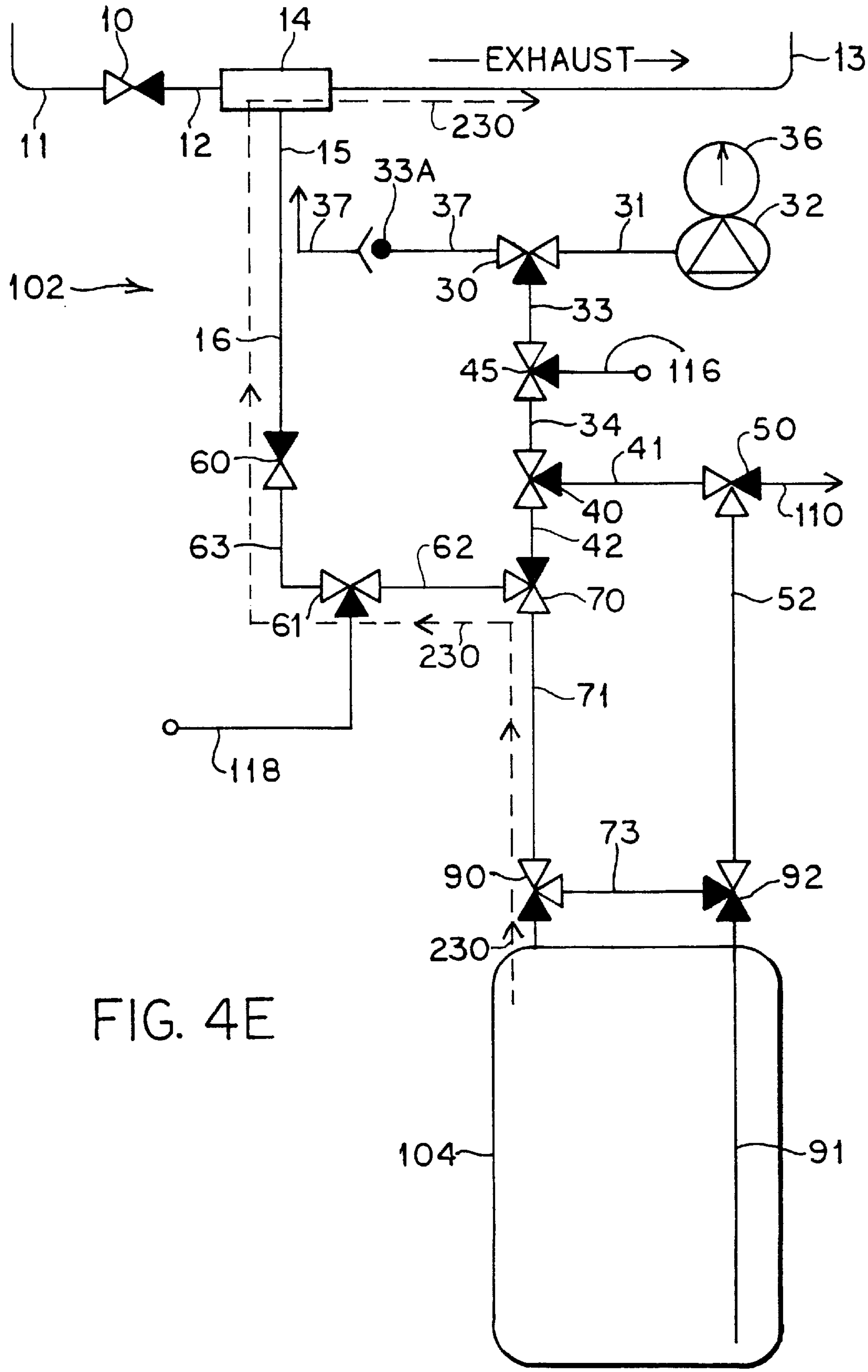
Figure 4F:
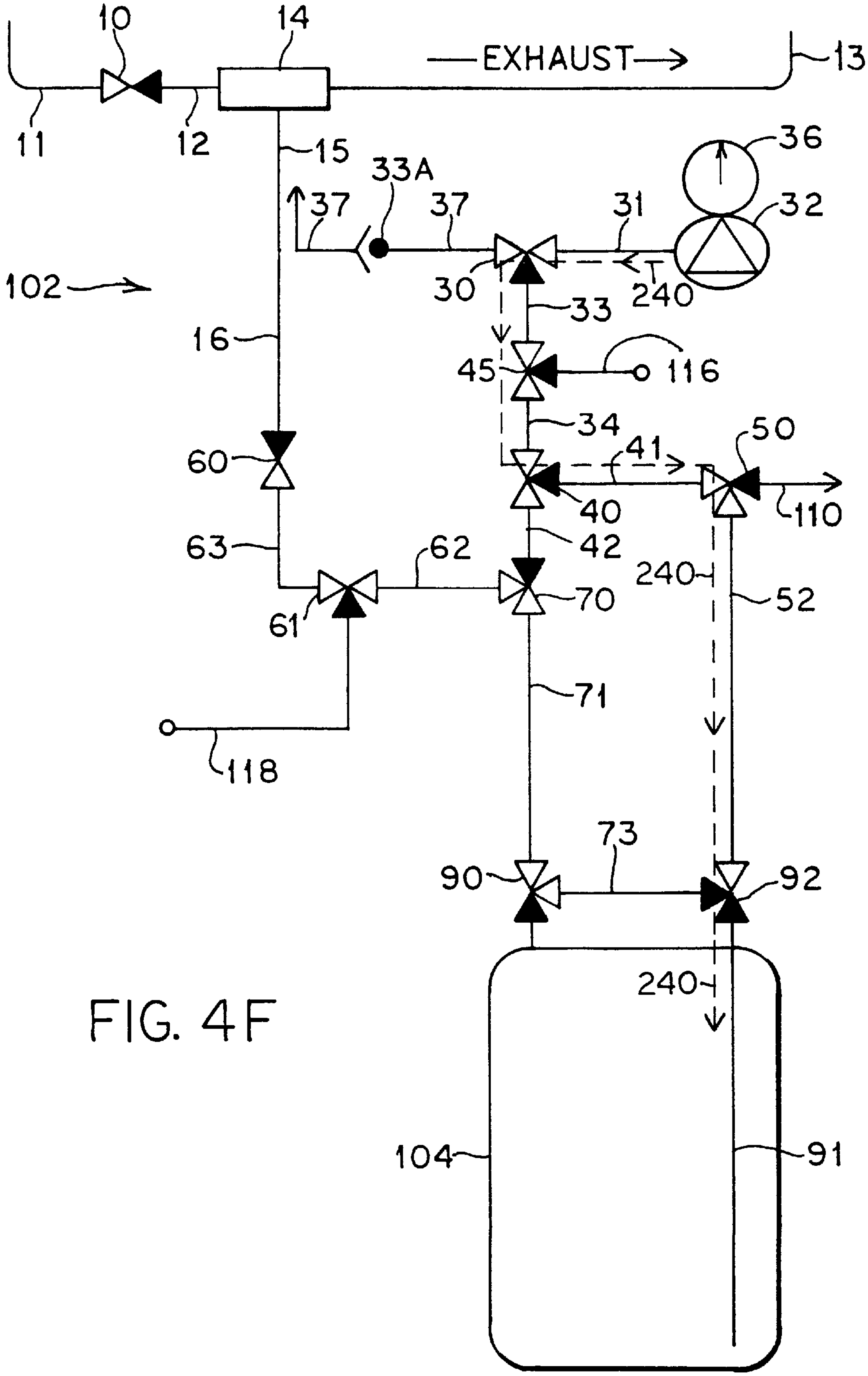

Next a depressurization step is performed to remove the head pressure in canister 104. For example, a procedure by which depressurization may occur is depicted in FIG. 4E. In one depressurization method, depicted by dashed line 230, VGS 10 is opened to allow gas to flow from line 11 through line 12 and into vacuum source 14 such that a vacuum is generated with the flow exiting via line 13 to exhaust. The vacuum which is generated in source 14 pulls a vacuum on line 15, line 16, through open LPV 60, line 63, through LWO 61, line 62, CP2 70, line 71, and open CI 90, thereby pulling a vacuum on the head space of canister 104.

After depressurization, a liquid drain is instituted to clear the lines (weldments) of liquid. Thus, in FIG. 4F gas is introduced via regulator 32 into line 31. CGI 30, CBV 40, and CO 92 are open such that gas flows through lines 31, 33, 34, 41, and 52 such that liquid chemical is forced back into canister 104. The flow of gas during the line drain is illustrated by dashed line 240. The depressurization followed by a liquid drain sequence shown in FIGS. 4E and 4F may be repeatedly performed to remove all liquid from the valves, tubes, and fittings.

Figure 4G:
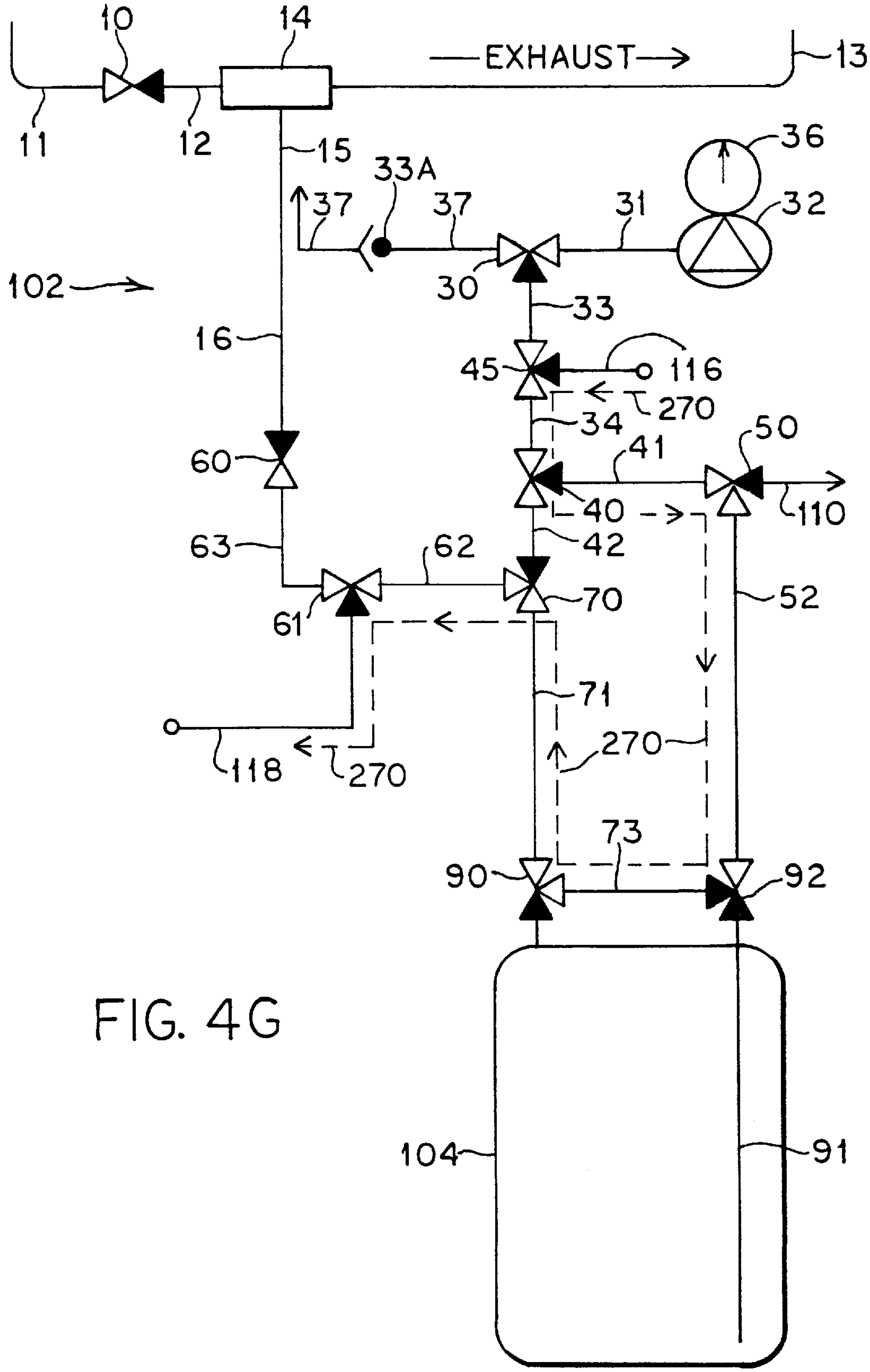

After the liquid drain, a flush liquid purge is instituted. As shown in FIG. 4G, a flush liquid may be introduced though flush liquid input 116. By opening FLI 45, CBV 40, and part of CO 92, flush liquid purges all wetted surface areas on the outlet of the manifold. Thus, flush liquid flows through lines 34, 41, 52, 73, 71, and 62 as shown by dashed line 270. Further, LWO 61 is opened so that the flush liquid may exit the manifold 102 through the waste outlet 118. Multiple cycles of a line drain of the flush lines may then be executed by using the same configuration as shown in FIG. 4G except closing FLI 45 and opening CGI 30 to flow purge gas through the lines 34, 41, 52, 73, 71, and 62 and repeating the cycle.

After the liquid purge and line drain of the flush lines, a canister removal cycle purge is instituted which includes a vacuum step and a flowing purge step respectively. This cycle purge removes any residual solvent vapors remaining after the flush liquid purge step. The vacuum step is depicted by dashed line 280 in FIG. 4H. Thus, in one embodiment, LPV 60, part of CO 92, and CBV 40 are opened such that when VGS 10 is opened to allow gas into vacuum source 14 via lines 11 and 12, a vacuum is drawn out to exhaust via line 13, with a vacuum thus being pulled on lines 15, 16, 63, 62, 71, 73, 52, 41, 34, and 33.

Figure 4H:
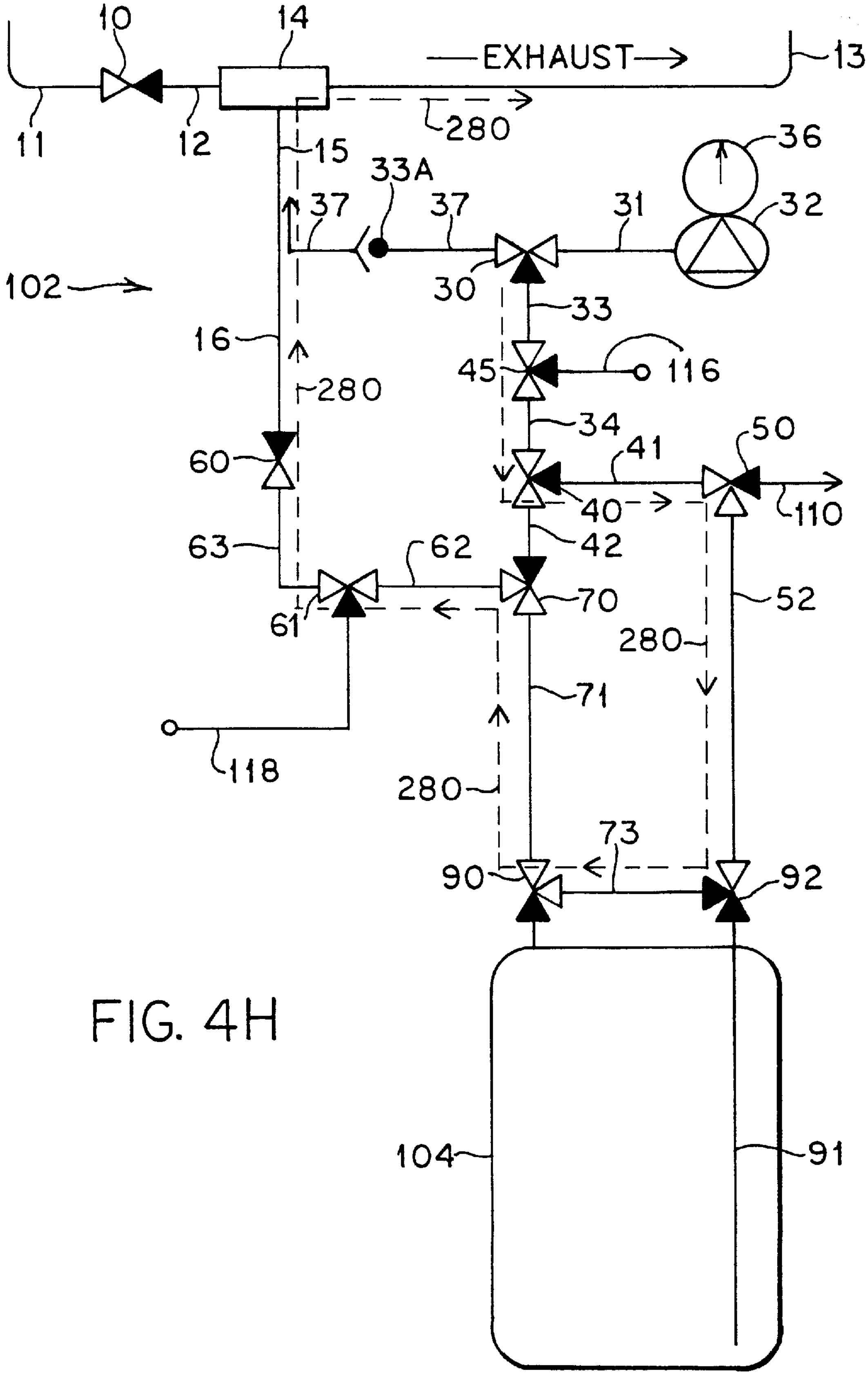
Figure 4I:
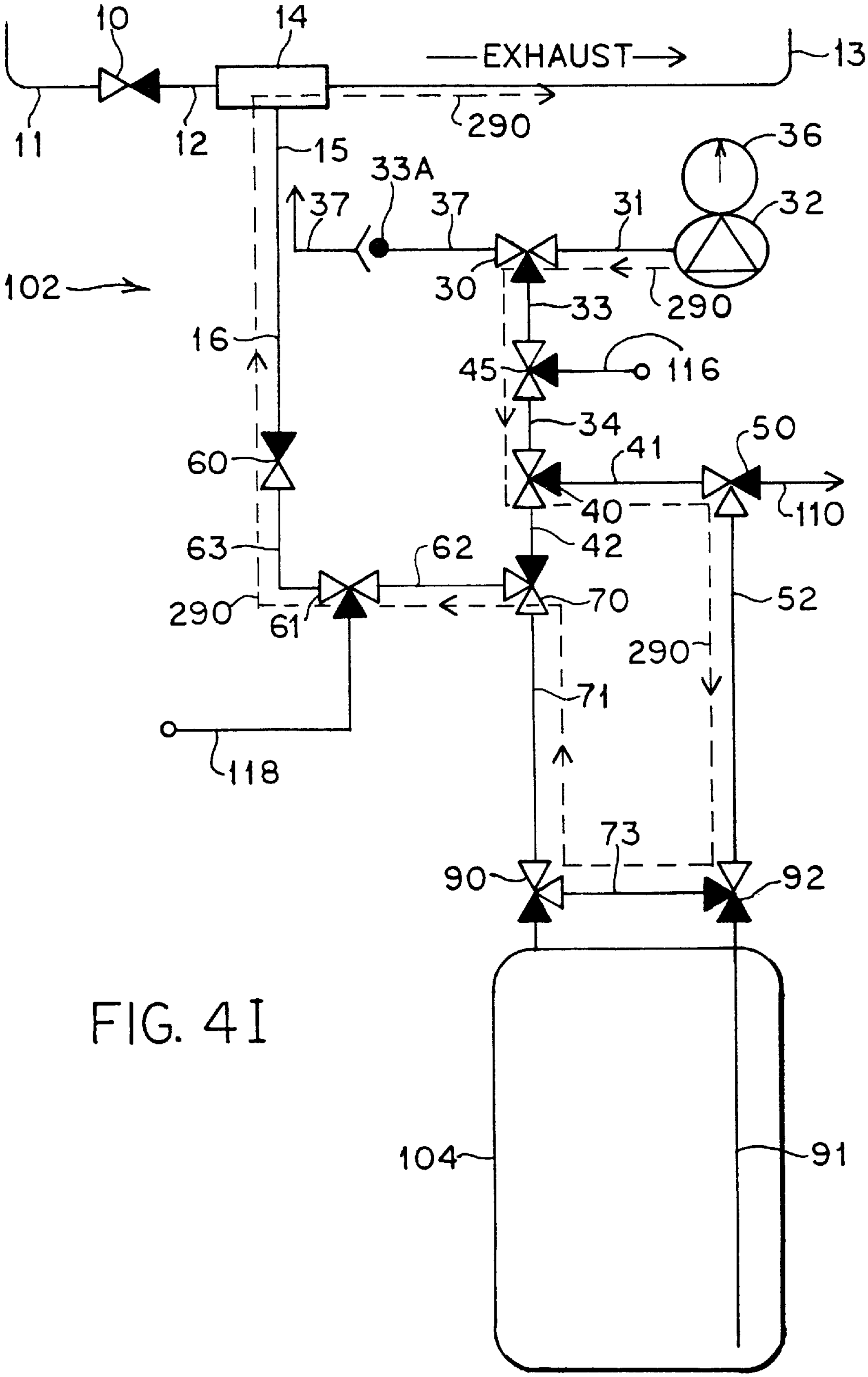

In FIG. 4I, a flowing purge is instituted as part of the canister removal cycle purge. In FIG. 4I, regulator 32 allows pressurized gas to enter line 31. With CGI 30, CBV 40, part of CO 92, and LPV 60 open, the gas flows through lines 31, 33, 34, 41, 52, 73, 71, 62, 63, 16, 15, and 13 to thereby purge the manifold, as depicted in FIG. 41 by dashed line 290.

After purge, the fittings are typically broken while a positive pressure on the manifold is maintained so that moisture does not enter the manifold. For instance, CGI 30, CBV 40, CO 92, CI 90 and CP2 70 may be opened so that gas flows out lines 52 and 71 after the fittings are broken. After a new canister is seated, the canister removal cycle purge as shown in FIGS. 4H and 41 is typically repeated to remove any water, traces of atmosphere or other contaminant that might have entered the manifold, as well as any water, atmosphere, or contaminants in the fittings and weldments of the new canister.

The embodiment of the invention discussed with reference to FIGS. 4A–4I has many advantages compared to standard manifolds including a reduced number of valves which results in lower cost of the manifold, a reduction in the number of points where a leak may occur as well as a reduction in the chances for valve failure for a given manifold. This embodiment also reduces the number of dead legs in the system, resulting in a more effective flowing purge. Owing to the improved ability to remove chemicals from the lines during canister changes, the manifold of this embodiment provides a system which may be used with hazardous chemicals, such as arsenic compounds. Likewise, this manifold embodiment permits improved use of dispersions, such as metals or solid compounds dispersed in an organic carrier liquid such as diglyme and triglyme. If dispersions are employed, it is preferable to flush the lines out with liquid solvents such as triglyme or tetrahydrofuran (THF) so that compounds are not precipitated in the lines when the lines are depressurized. Additionally, for any of the embodiments of this invention, it is contemplated that the manifold can be heated to accelerate evaporation of chemicals in the lines. In this regard, the manifold can be maintained in a heated environment, wrapped with heating tape connected to a variac or the like. Alternatively, a heating element may be configured with the cabinet door as shown below with reference to FIGS. 9A and 9B. To facilitate evaporation during a flowing purge, heated gas could alternatively be employed, such as heated argon, nitrogen, or other inert gas. Combinations of these techniques can also be employed. For some types of chemicals, it may be possible to purge with reactive chemicals, which react with one or more of the compounds in the line to produce more readily evacuated compounds.

The manifolds of this invention may include a sensor attached, for example, in line 15 to determine whether the lines of the manifold contain any chemical. Similarly, a sample port could be included in line 15 where a sample of gas from the line can be withdrawn and tested using an analytical device to test for the presence of chemical.

Figure 4J:
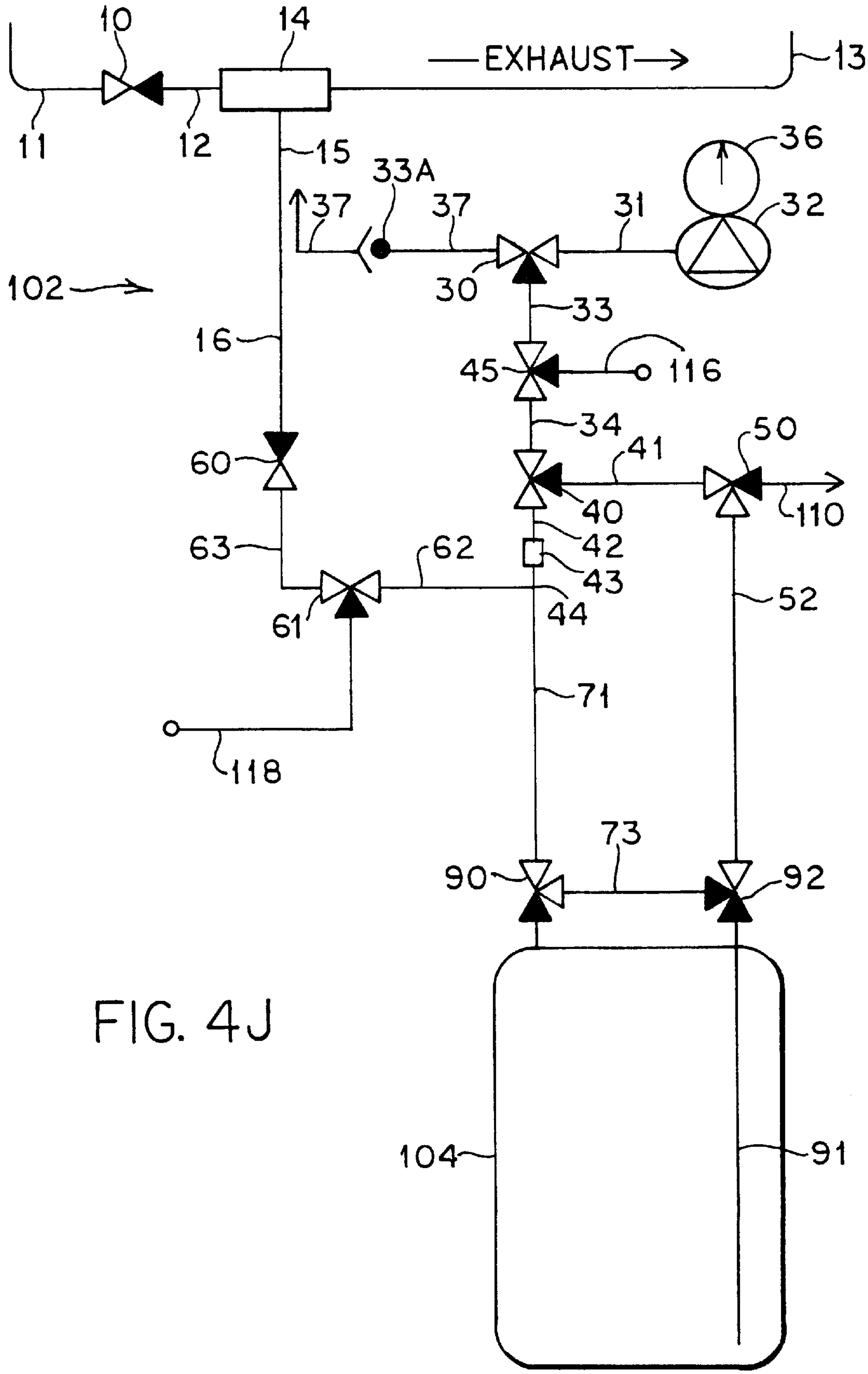

An alternative embodiment of the present invention, similar to the embodiment of FIGS. 4A–4I, is shown in FIG. 4J. The embodiment of FIG. 4J is the same as the embodiment of FIG. 4A except that CP2 70 of FIG. 4A has been removed. More particularly, as shown in FIG. 4J, CP2 is not utilized to join lines 62, 71 and 42 but rather a T fitting 44 and a critical orifice 43 are utilized to join lines 62, 71, and 42. The critical orifice 43 operates as a flow restriction device to limit (though not prevent) gas flow from line 42 to T fitting 44. The critical orifice 43 may be constructed in a wide range of manners. For example, the orifice 43 may be formed to have a region of narrowing inner diameter as compared to the inner diameter of the other piping, such as line 42 and/or T fitting 44. The narrowing region will thus tend to divert gas flow. For example, if CBV 40 is opened then gas flowing from line 34 to CBV 40 will preferentially flow at higher volumes out CBV 40 through line 41 as compared to the flow through line 42 and the orifice 43 due to the restriction effect of the orifice 43. As will be shown below, the use of the orifice 43 allows for the generation of gas flow patterns similar to those shown in FIGS. 4B–4I while utilizing one less valve.

In one embodiment, the orifice 43 may be formed by use of a VCR fitting which joins line 42 and T fitting 44. The VCR fitting may have a gasket within the fitting which has a narrower opening as compared to the inner diameter of the line 42 and the T fitting 44. For example, the orifice may have an opening diameter of 1/32 inch or 1/16 inch while the line 42 may be constructed of ¼ inch piping having an inner diameter of 0.18 inch. The ratio of such diameters will result in a flow restriction through the orifice as compared to other segments of the manifold system. As will be shown below, the gas flow through the orifice will be utilized during steps where a canister is being pressurized, such as for example when chemical is being pushed out of the canister to the chemical delivery point. Thus, the suitable size of the orifice may be dependent upon the size of the canister utilized with the manifold system and/or the desired chemical flow rates. During use, the manifold of this invention may be operated as follows. To push chemical out of the canister 104 to the delivery point, the valves in the manifold are appropriately opened and closed to allow pressurized gas into the system and into the canister. In FIG. 4B, dashed line 220 illustrates the path of pressurized gas entering canister 104, with dashed line 221 showing the path of liquid chemical exiting canister 104 through a dip tube 91. Thus, pressurized gas from a source (not shown) is released by regulator 32 into line 31. The gas thereafter passes through open CGI 30, then through line 33, FLI 45, CBV 40, line 42, opened CP2 70, line 71, CI 90, and into canister 104. Pressure from entering gas forces liquid chemical up the dip tube, and through CO 92, line 52, PLI 50, and out line 110 to the receiving point (for example, a CVD process tool).

Figure 4K:
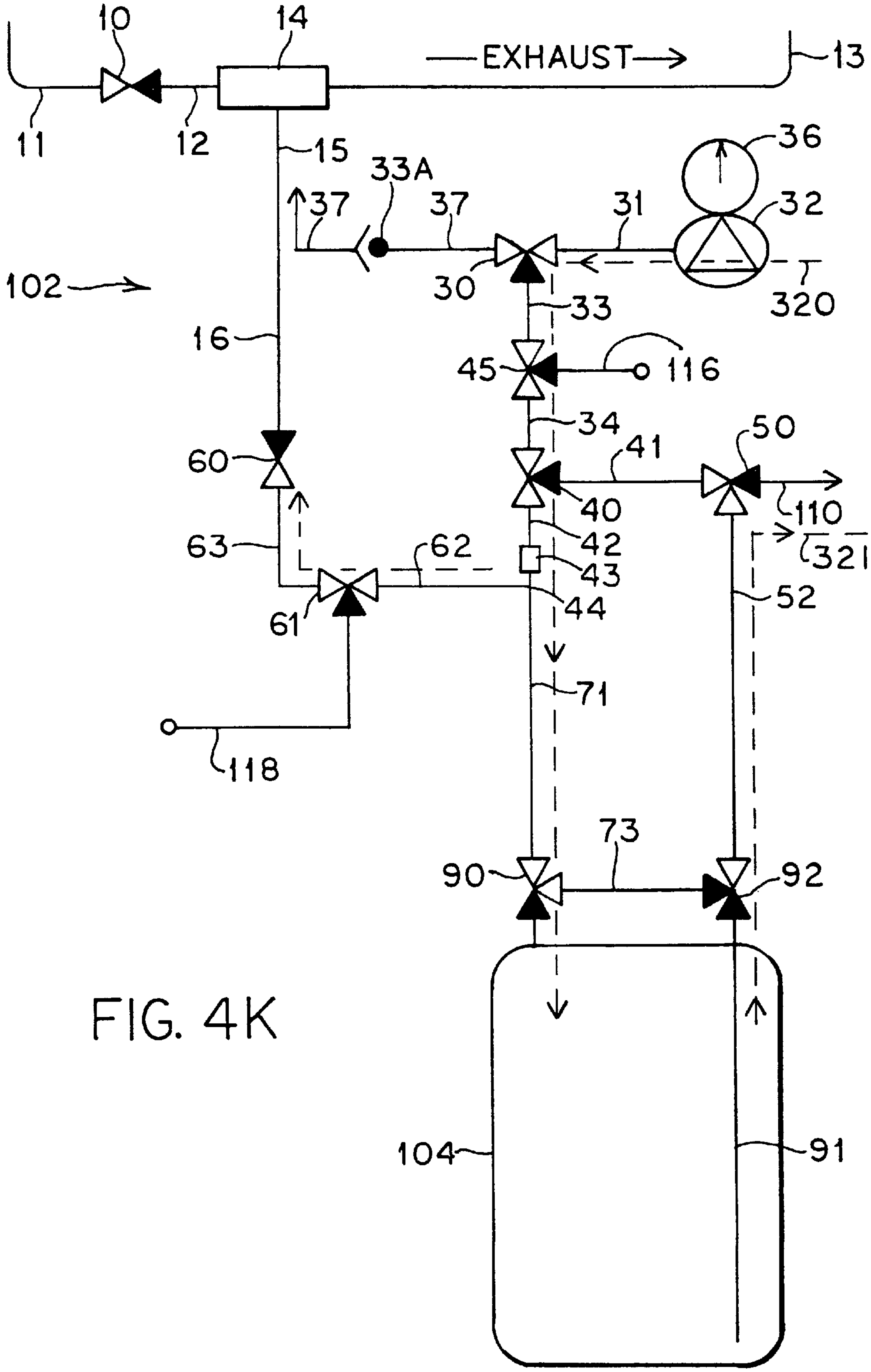
Figure 4L:
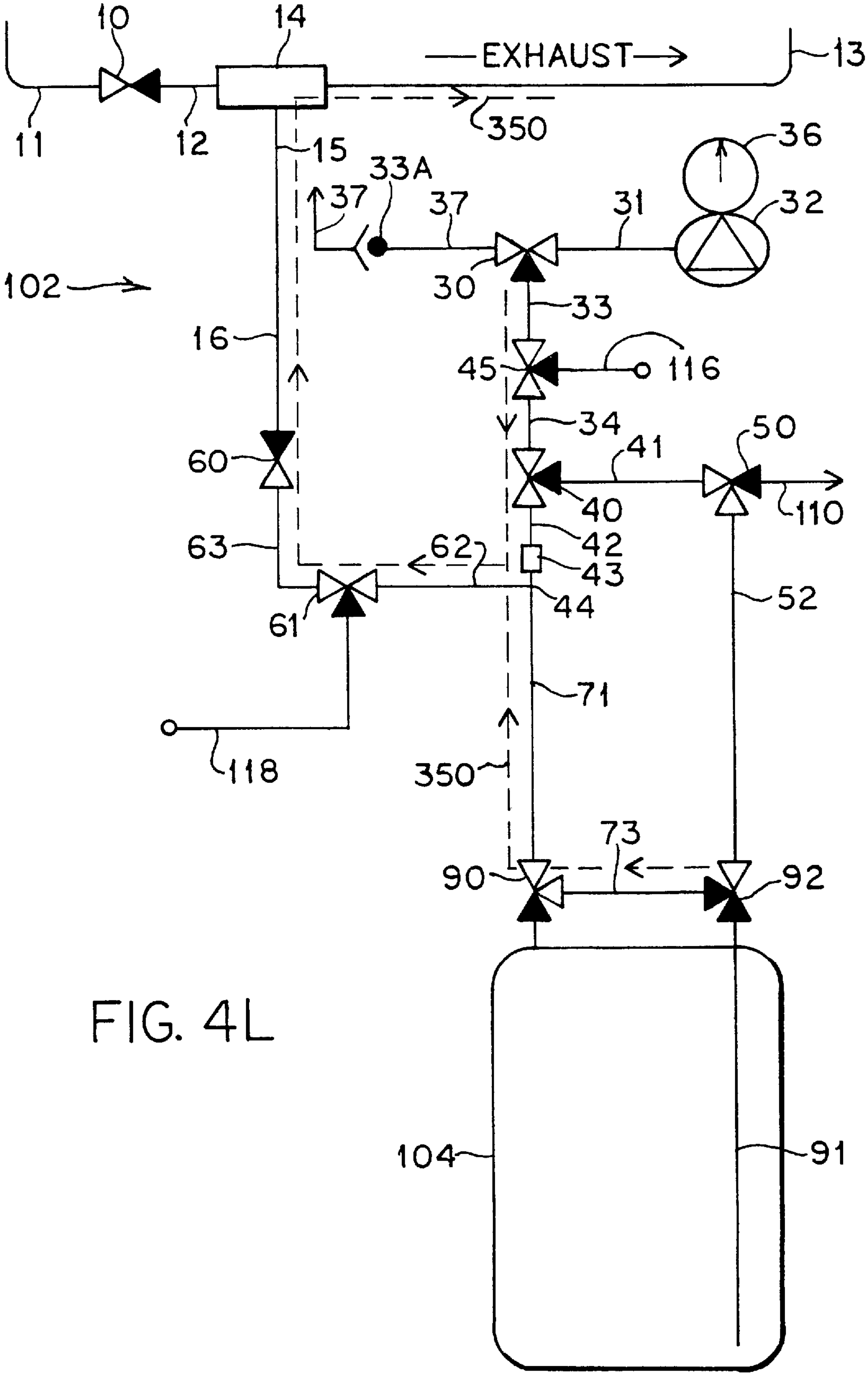

During use, the manifold of FIGS. 4J–4R may be operated as follows. To push chemical out of the canister 104 to the delivery point, the valves in the manifold are appropriately opened and closed to allow pressurized gas into the system and into the canister. In FIG. 4K, dashed line 320 illustrates the path of pressurized gas entering canister 104, with dashed line 321 showing the path of liquid chemical exiting canister 104 through a dip tube 91. Thus, pressurized gas from a source (not shown) is released by regulator 32 into line 31. The gas thereafter passes through open CGI 30, then through line 33, FLI 45, CBV 40, line 42, orifice 43, T fitting 44, line 71, CI 90, and into canister 104. Pressure from entering gas forces liquid chemical up the dip tube, and through CO 92, line 52, PLI 50, and out line 110 to the receiving point (for example, a CVD process tool).

When a supply canister (even a full canister) is being changed out, the lines may be purged to rid the manifold of residual chemicals. The first step to rid the manifold of residual chemicals is a cycle purge step which includes a vacuum step and a flowing purge step respectively. The cycle purge may include repeatedly performing the vacuum and flowing purge in an alternating manner. A single vacuum step is discussed below with reference to FIG. 4L and a single flowing purge step is discussed below with reference to FIG. 4M. The vacuum step may be accomplished in a variety of ways, including via the configuration depicted by dashed line 350 FIG. 4L. Thus, in one embodiment, LPV 60 is opened such that when VGS 10 is opened to allow gas into vacuum source 14 via lines 11 and 12, a vacuum is drawn out to exhaust via line 13, with a vacuum thus being pulled on lines 15, 16, 63, 62, 42, 34, 33, 71, and 73.

Figure 4M:
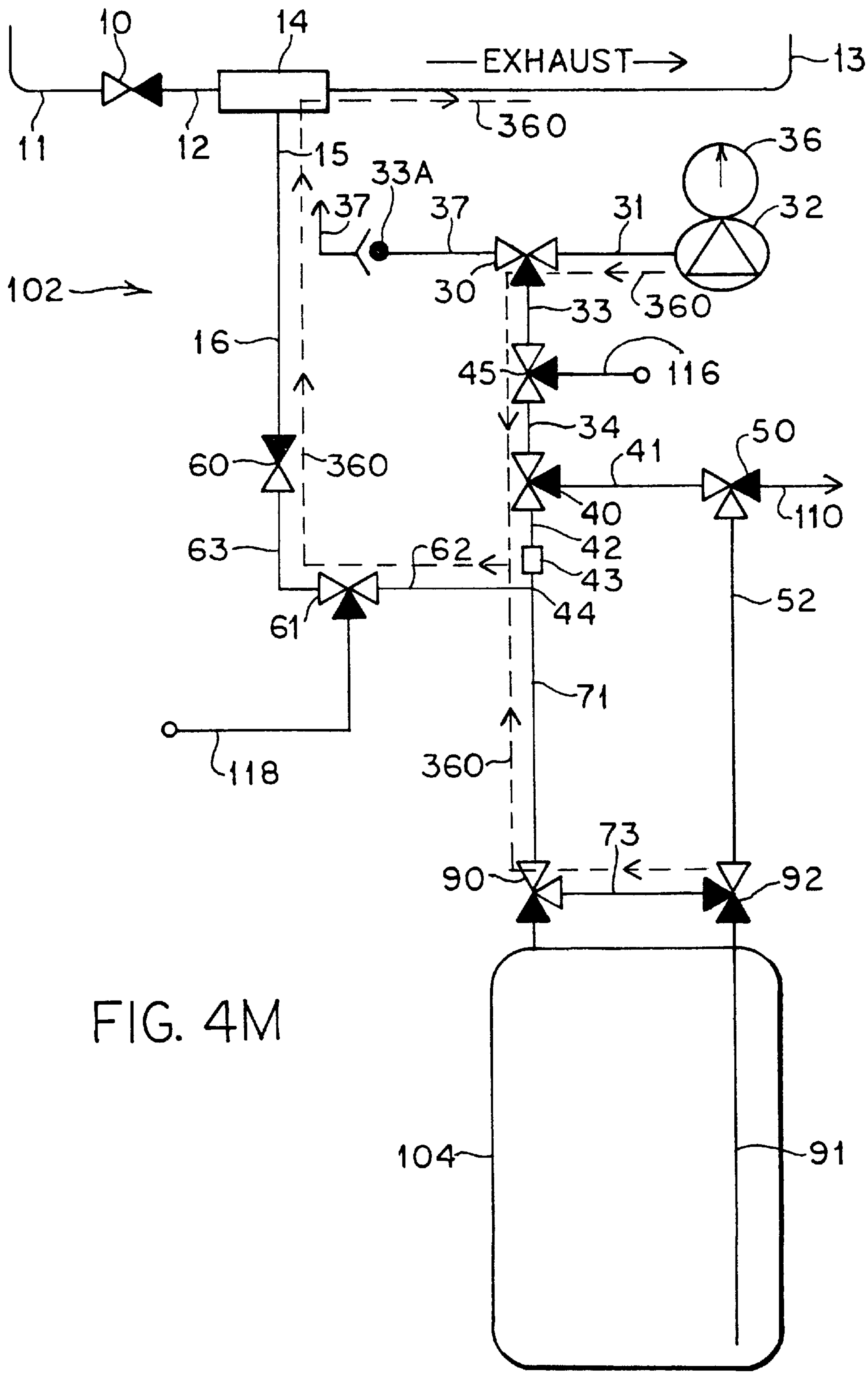

In FIG. 4M, a flowing purge of the vacuum line dry down cycle purge is illustrated. In FIG. 4M, regulator 32 allows pressurized gas to enter line 31. With CGI 30 and LPV 60 open, the gas flows through lines 31, 33, 34, 42, 71, 73, 62, 63, 16, 15, and 13 to thereby purge the manifold, as depicted in FIG. 4M by dashed line 360.

Figure 4N:
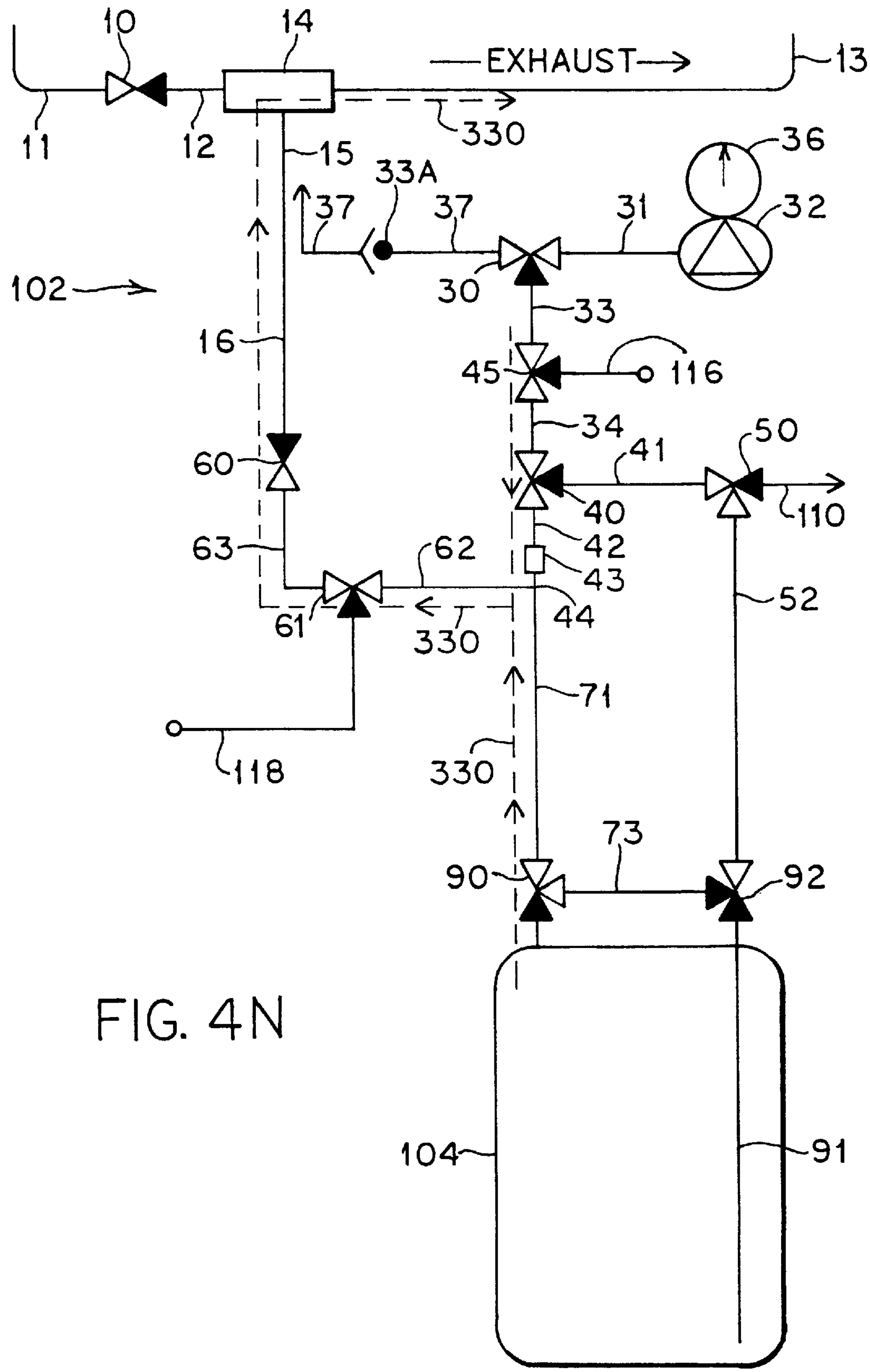
Figure 40:
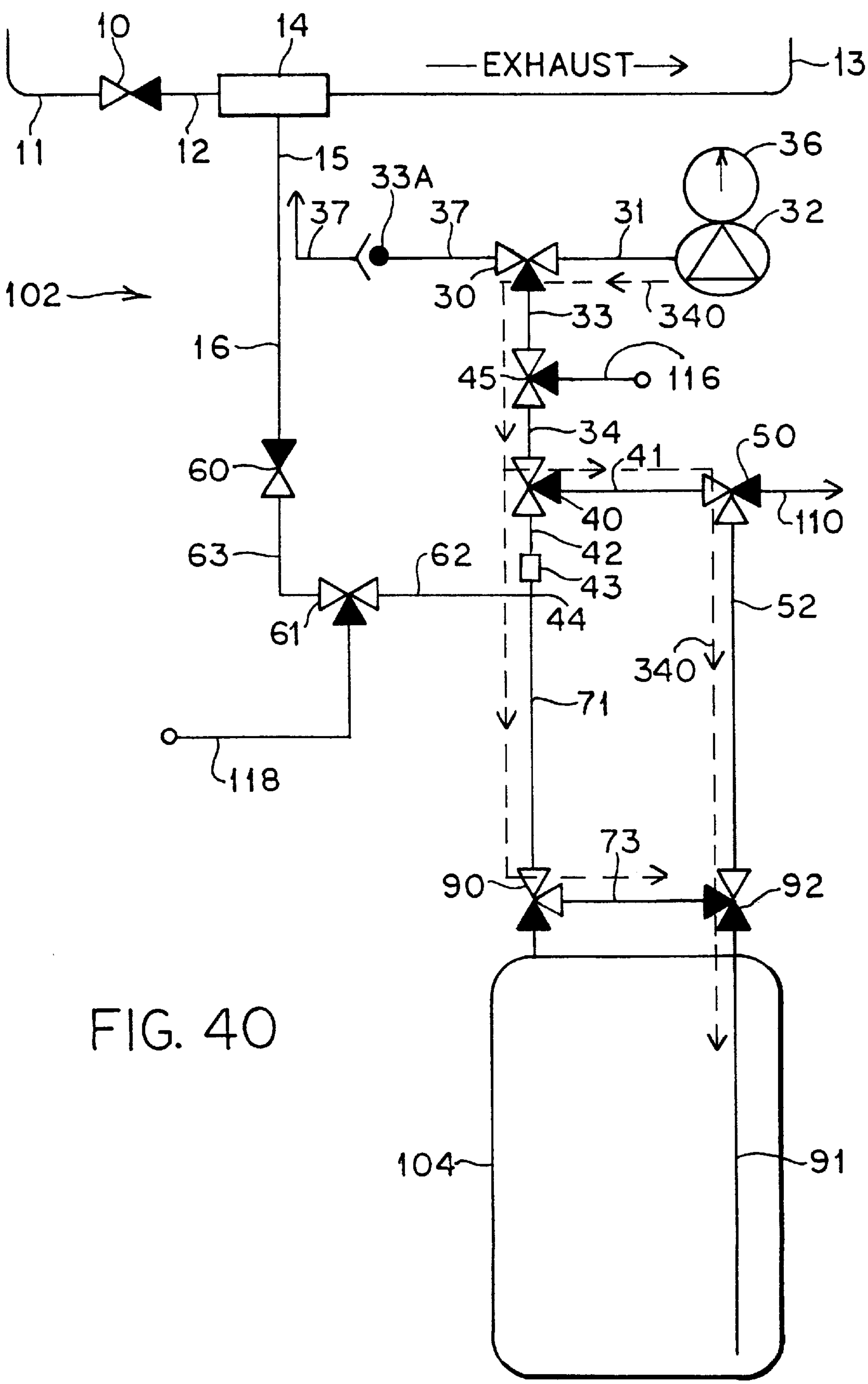

Next a depressurization step is performed to remove the head pressure in canister 104. For example, a procedure by which depressurization may occur is depicted in FIG. 4N. In one depressurization method, depicted by dashed line 330, VGS 10 is opened to allow gas to flow from line 11 through line 12 and into vacuum source 14 such that a vacuum is generated with the flow exiting via line 13 to exhaust. The vacuum which is generated in source 14 pulls a vacuum on line 15, line 16, through open LPV 60, line 63, through LWO 61, line 62, T fitting 44, orifice 43, line 42, line 34, line 33, line 71, and open CI 90, thereby pulling a vacuum on the head space of canister 104.

After depressurization, a liquid drain is instituted to clear the lines (weldments) of liquid. Thus, in FIG. 4O gas is introduced via regulator 32 into line 31. CGI 30, CBV 40, and CO 92 are open such that gas flows through lines 31, 33, 34, 41, 52, line 42, orifice 43, T fitting 44, line 71 and line 73 such that liquid chemical is forced back into canister 104. The flow of gas during the line drain is illustrated by dashed line 340.

Figure 4P:
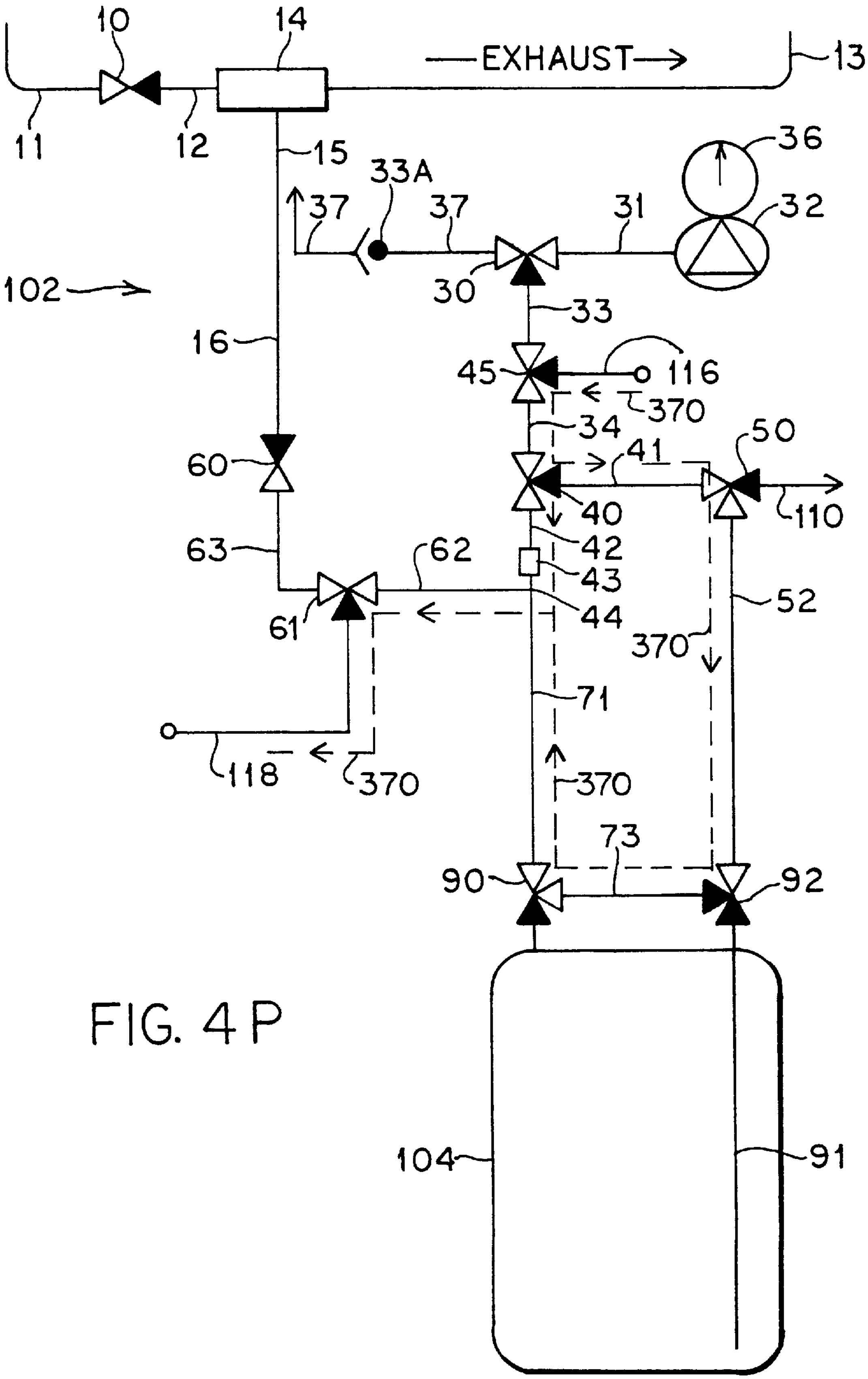
Figure 4Q:
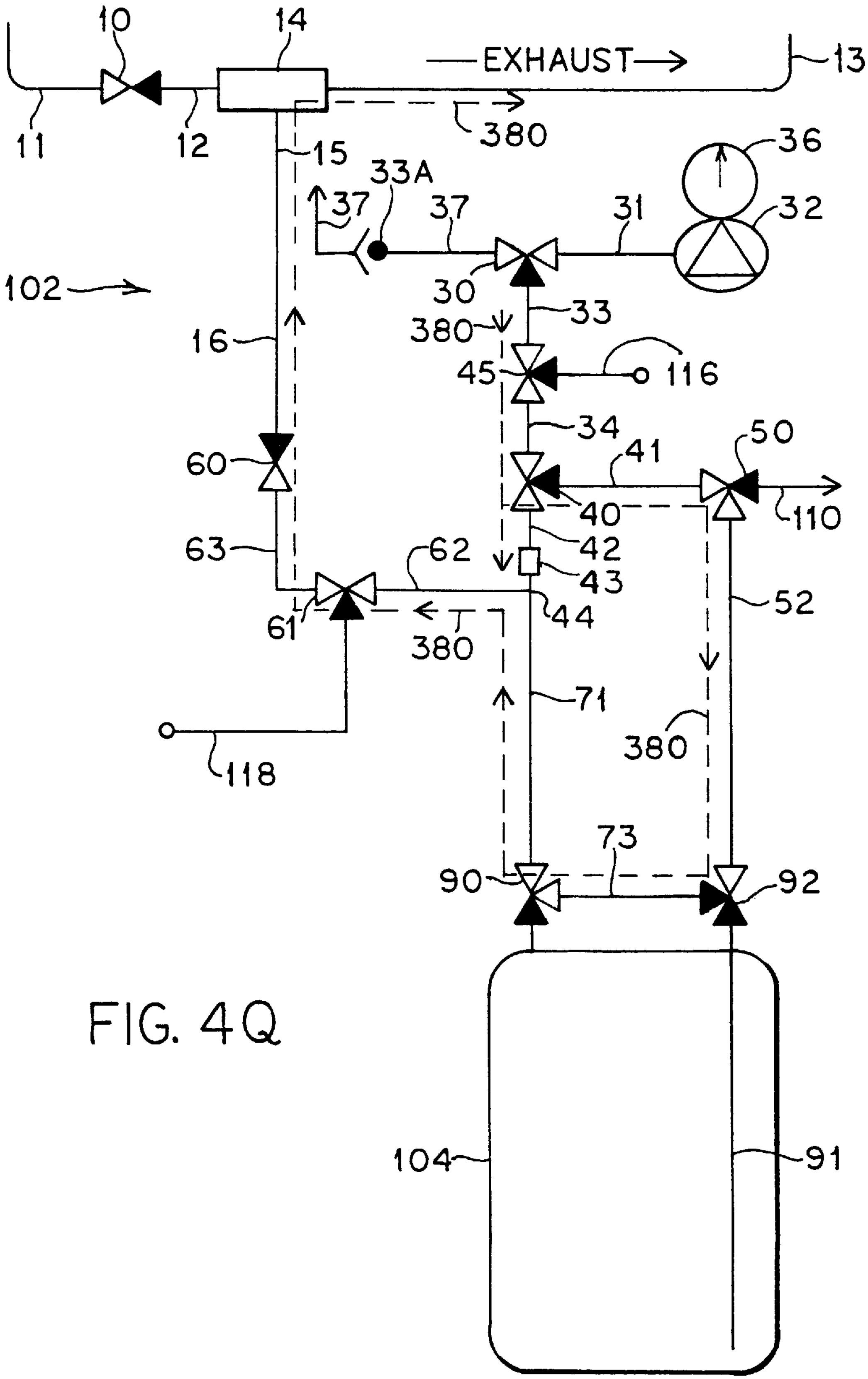

After the liquid drain, a flush liquid purge is instituted. As shown in FIG. 4P, a flush liquid may be introduced though flush liquid input 116. By opening FLI 45, CBV 40, and part of CO 92, flush liquid purges all wetted surface areas on the outlet of the manifold. Thus, flush liquid flows through lines 34, 41, 52, 73, 71, 42, and 62 as shown by dashed line 370. Further, LWO 61 is opened so that the flush liquid may exit the manifold 102 through the waste outlet 118.

After the liquid purge, a canister removal cycle purge is instituted which includes a vacuum step and a flowing purge step respectively. This cycle purge removes any residual solvent vapors remaining after the flush liquid purge step. The vacuum step is depicted by dashed line 380 FIG. 4Q. Thus, in one embodiment, LPV 60, part of CO 92, and CBV 40 are opened such that when VGS 10 is opened to allow gas into vacuum source 14 via lines 11 and 12, a vacuum is drawn out to exhaust via line 13, with a vacuum thus being pulled on lines 15, 16, 63, 62, 71, 73, 52, 41, 42, 34, and 33.

Figure 4R:
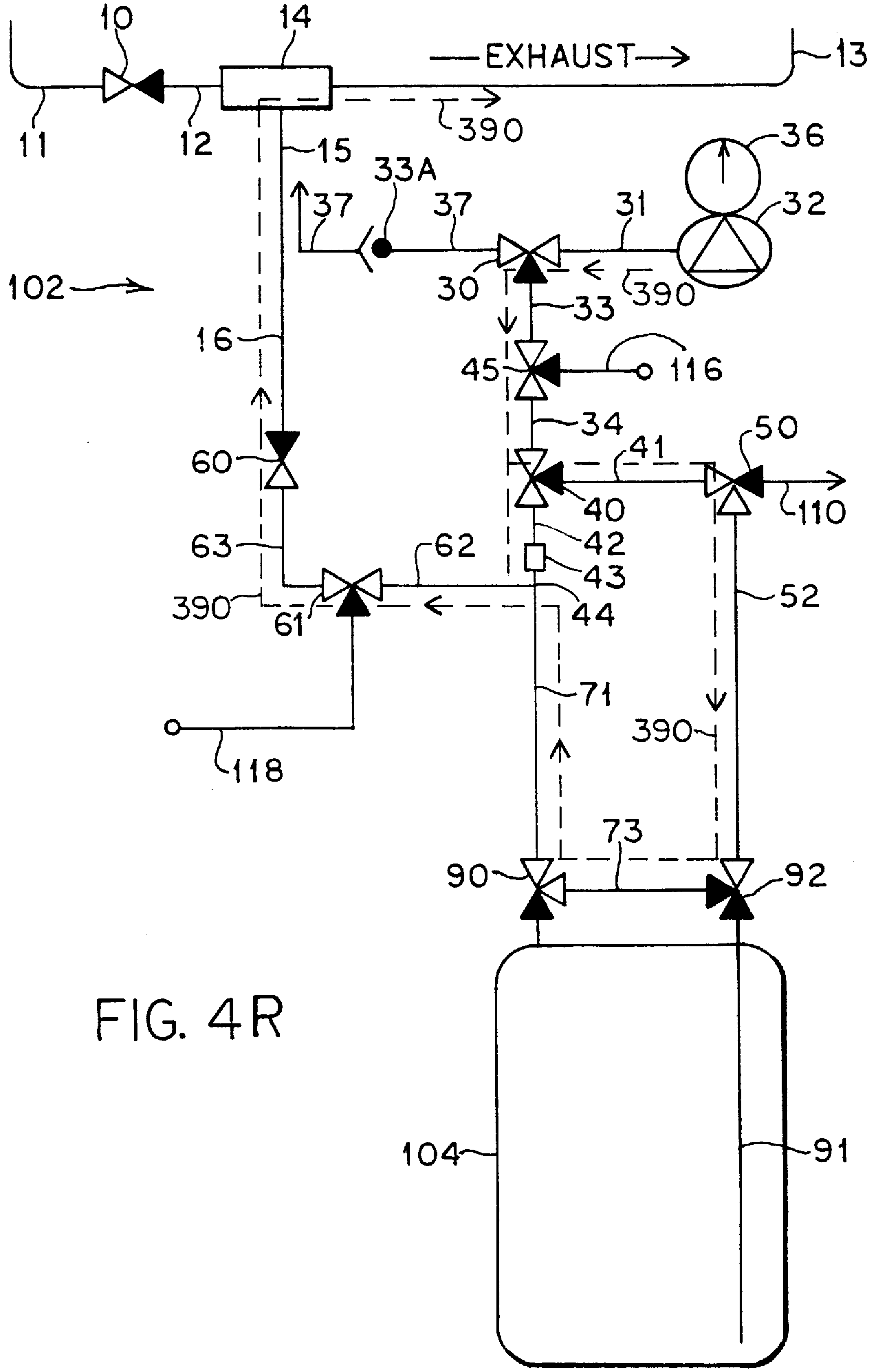

In FIG. 4R, a flowing purge is instituted as part of the canister removal cycle purge. In FIG. 4R, regulator 32 allows pressurized gas to enter line 31. With CGI 30, CBV 40, part of CO 92, and LPV 60 open, the gas flows through lines 31, 33, 34, 41, 42, 52, 73, 71, 62, 63, 16, 15, and 13 to thereby purge the manifold, as depicted in FIG. 4R by dashed line 390.

FIGS. 5–7 illustrate a variety of additional configurations for forming a chemical delivery system utilizing multiple purging techniques. The techniques of FIGS. 5–7 may be used with manifold valve configurations such as FIG. 4A or FIG. 4J. FIGS. 5A–5M illustrate a dual tank non-refillable delivery system utilizing a medium level vacuum, flowing purge, and liquid flush purge. Such a configuration may be utilized for a wide variety of the chemicals discussed herein. For example, in one embodiment the configuration of FIGS. 5A–5M may be utilized for a liquid BST delivery system.

Figure 5A:
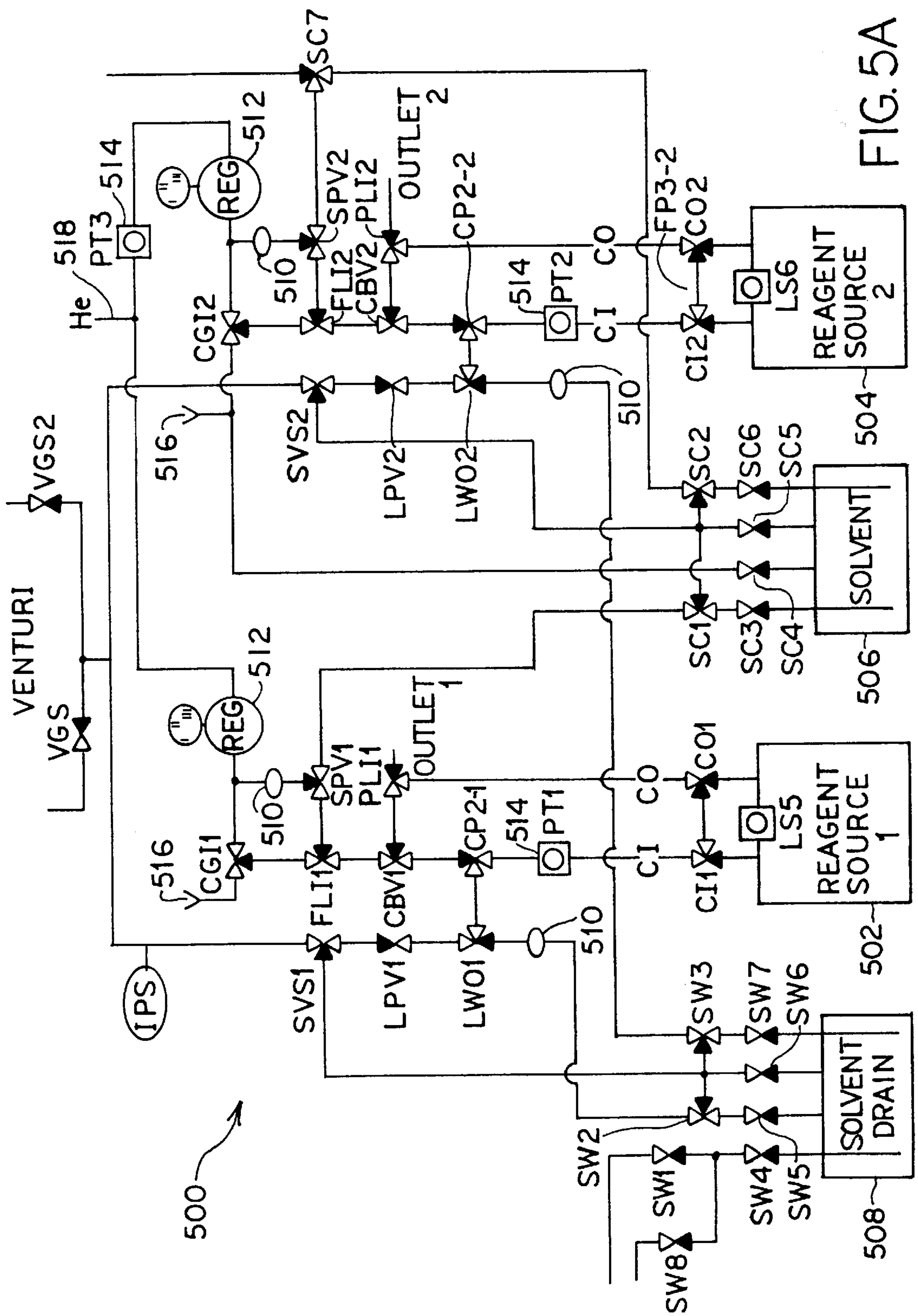

An exemplary purging sequence for the system of FIG. 5A is shown in FIGS. 5B–5M. As with FIGS. 4B–4I, dashed lines are used in FIGS. 5–7 to indicate the vacuum, gas, or liquid flows. Similarly, common valves between the FIGS. 5–7 such as the FLI, VGS, LPV, CGI, CBV, PLI, CP2, CO, CI and LWO valves (where applicable) are labeled with the same nomenclature as in FIGS. 4A–4I. Further, where additional canisters are used in a dual canister system numerals 1 and 2 are added to the end of the valve reference nomenclature to indicate the portion of the manifold coupled to the first canister and the second canister respectively. Thus, for example, two CO valves, CO1 and CO2 are provided as shown in FIG. 5A coupled to the first and second chemical canisters respectively and so forth for the other valves. As shown in FIG. 5A, the chemical delivery system 500 may include a first chemical source canister 502 and a second chemical source canister 504. A liquid flush source 506 (for example a canister containing a solvent) and a liquid flush waste container 508 (for example a canister) are also provided. Associated with the first source canister 502 are valves FLI1, CGI1, CBV1, CP2-1, C11, CO1, LWO1, LPV1, and PLI1 which are coupled similarly to that as described with reference to FIG. 4A. Additional valves SPV1 and SVS1 are also associated with the source canister 502 as shown in FIG. 5A. A similar set of valves FLI2, CGI2, CBV2, CP2-2, C12, C02, LWO2, LPV2, PLI2, SPV2 and SVS2 are associated with the second source canister 504. The valves associated with each canister 502 and 504 may be contained in a single manifold or may be contained in two or more separate manifolds of the chemical delivery system 500.

As also shown within FIG. 5A, the liquid flush source 506 may be coupled to valves SC1–SC6 and the liquid flush waste canister 508 may be coupled to valves SW1–SW8. The chemical delivery system may further include regulators 512, flow restrictors 510, pressure transducers 514, and over-pressure check valves 516 as shown.

Figure 5B:
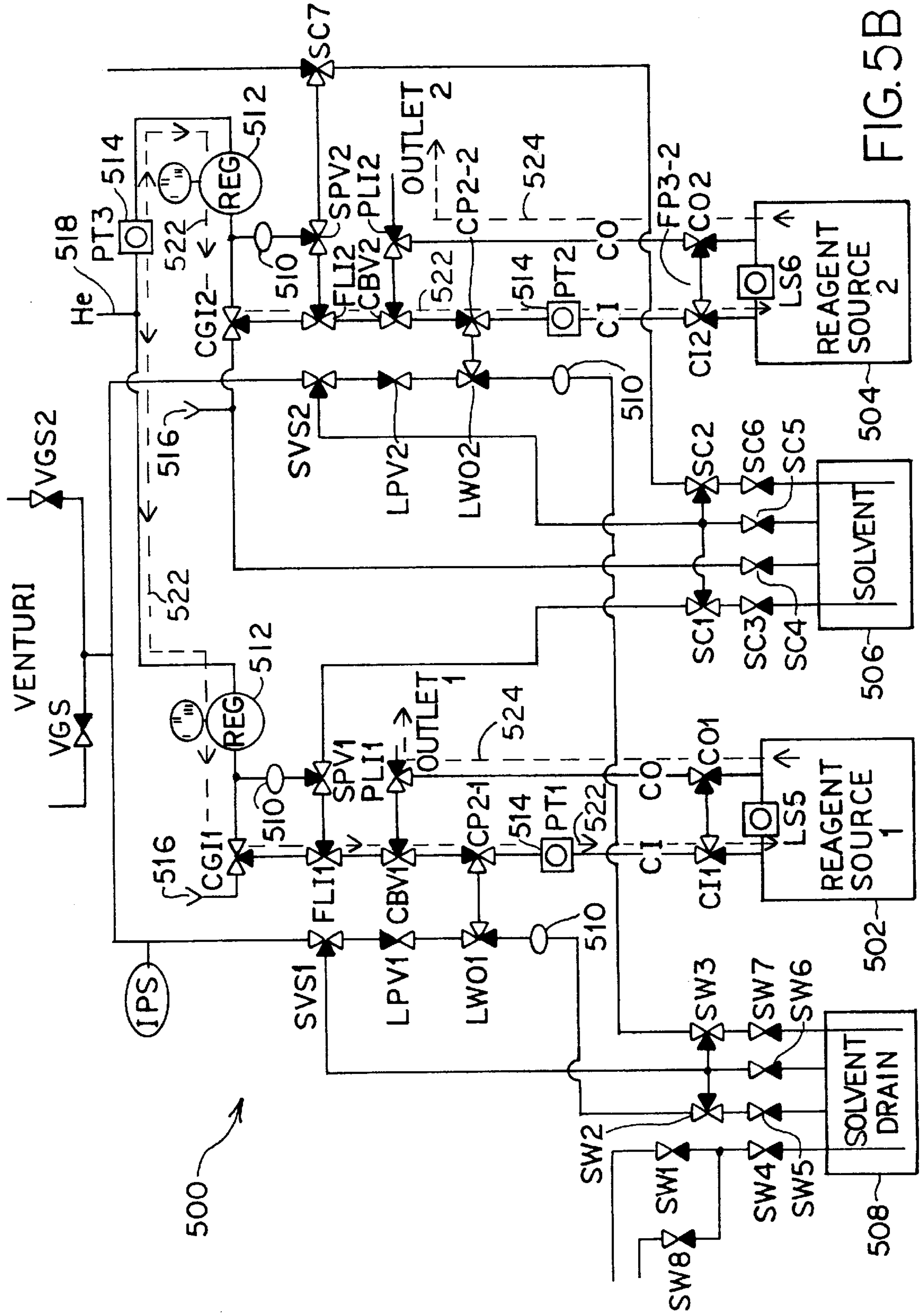
Figure 5C:
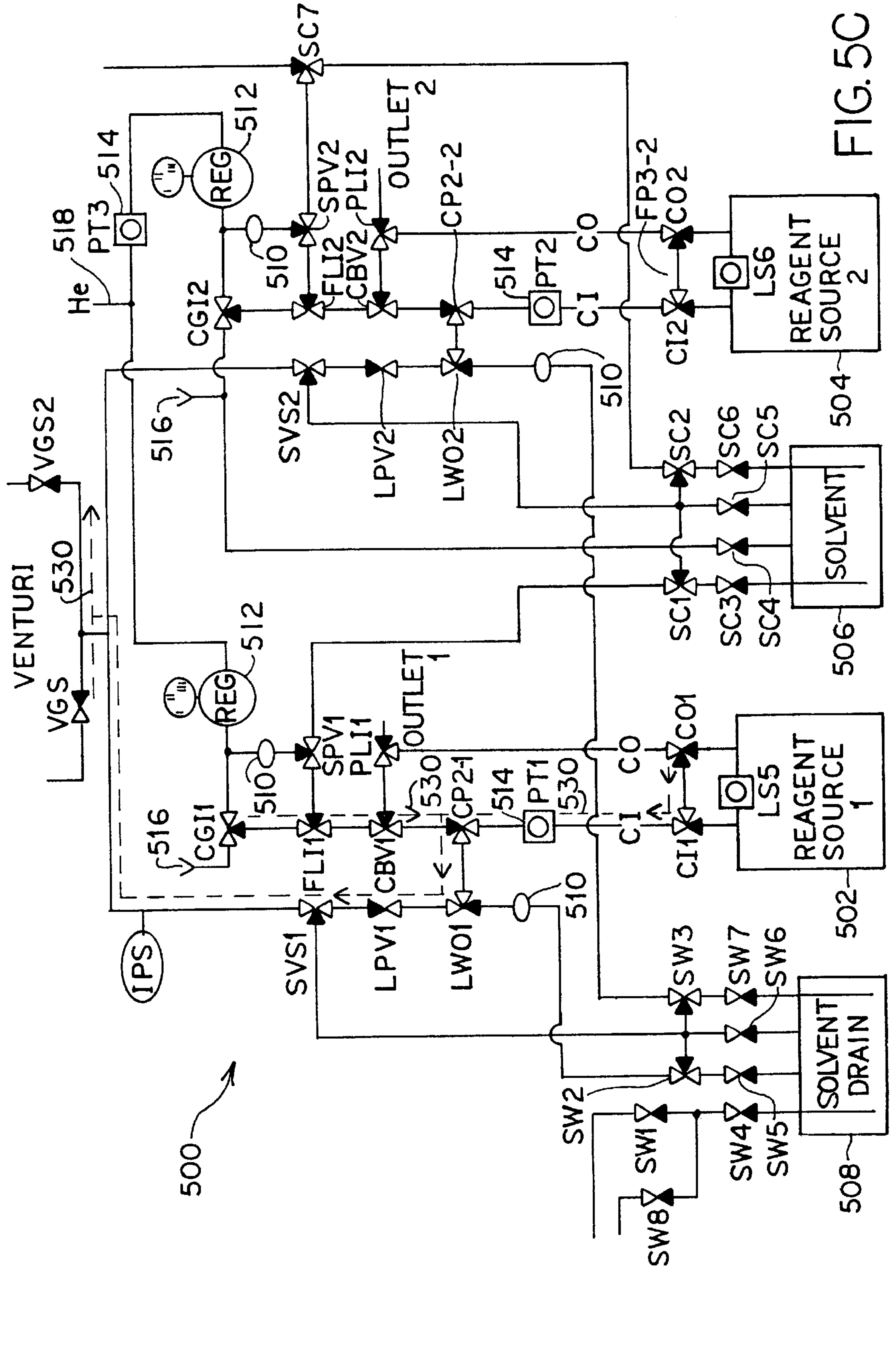
Figure 5D:
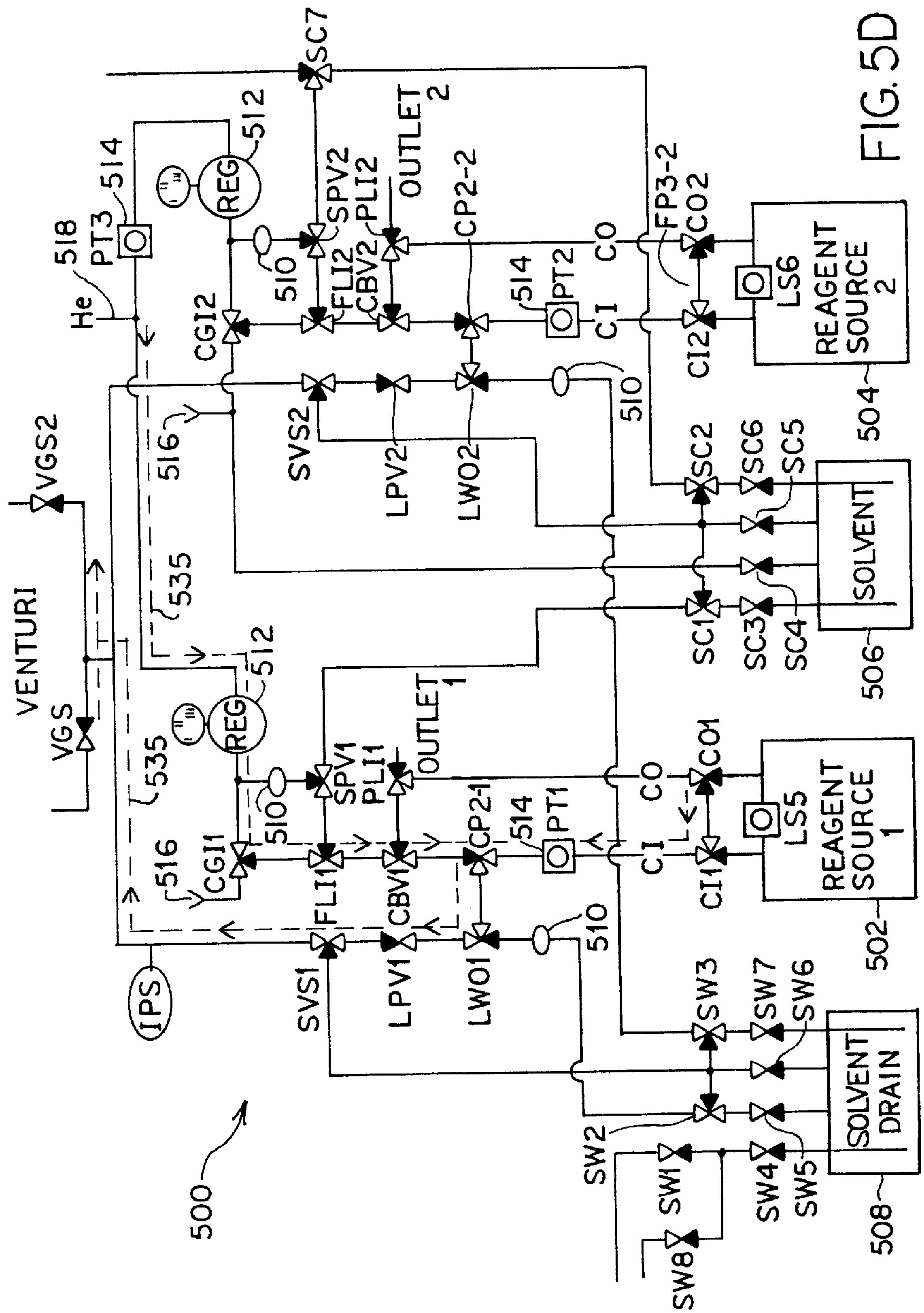
Figure 5E:
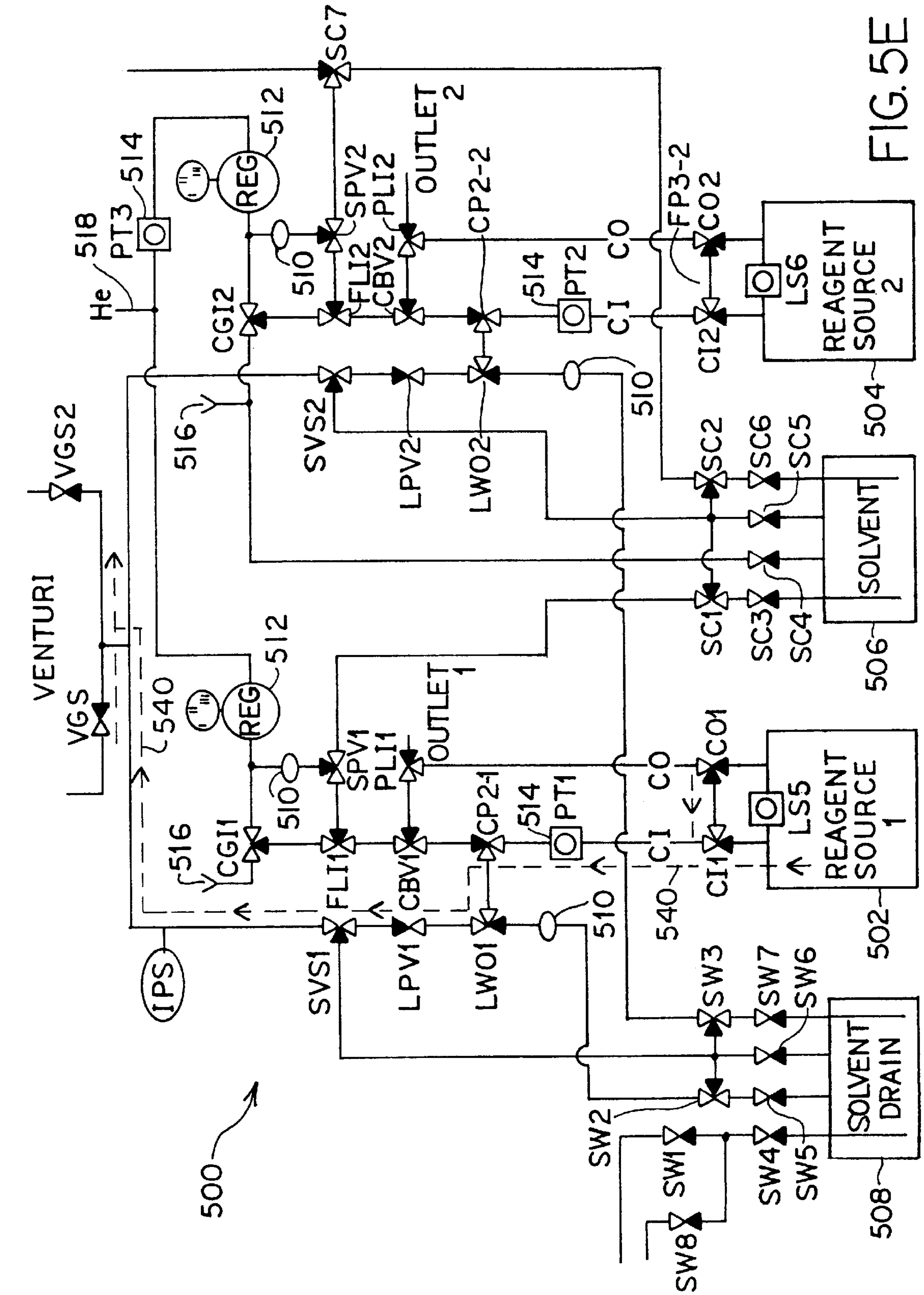
Figure 5F:
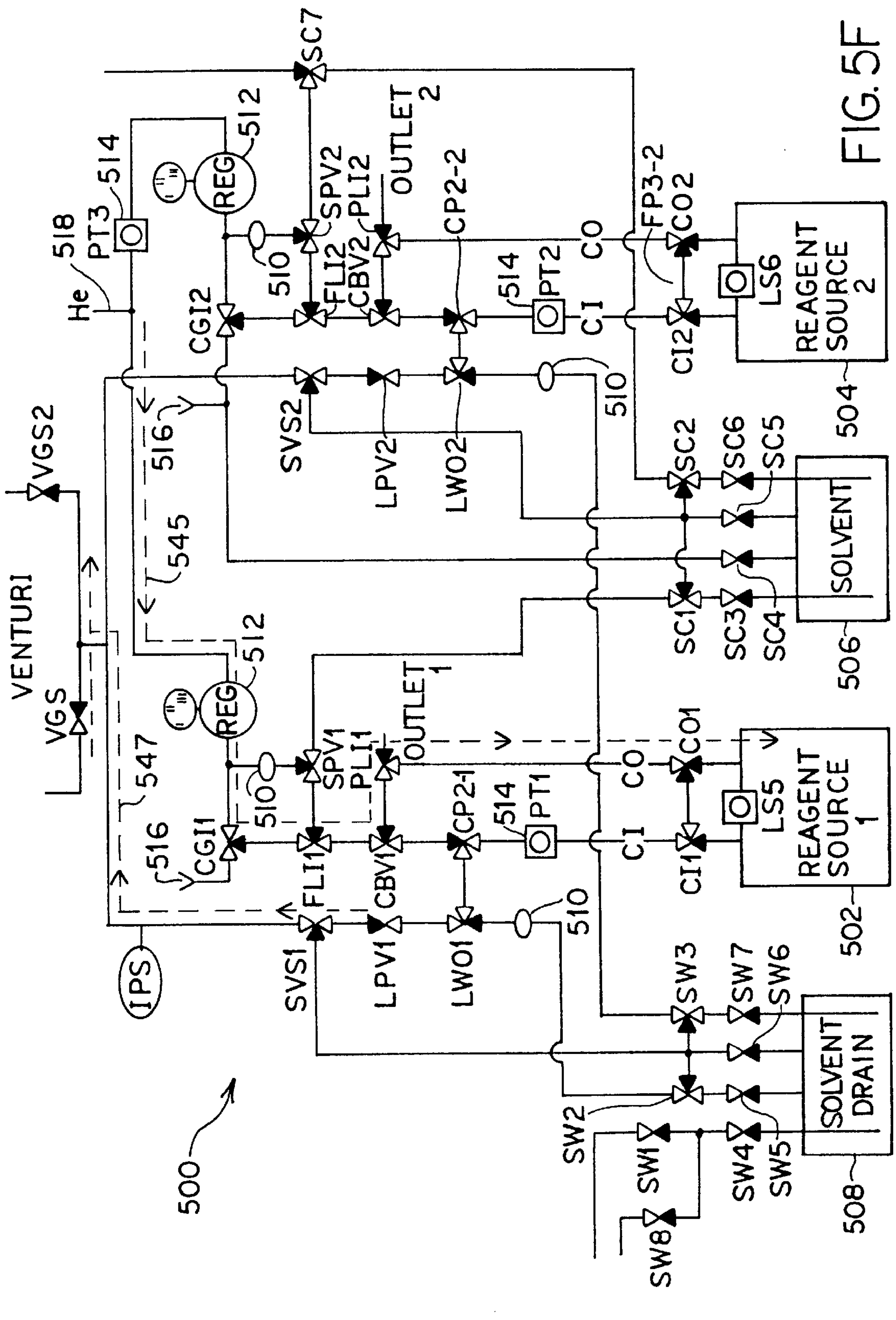
Figure 5G:
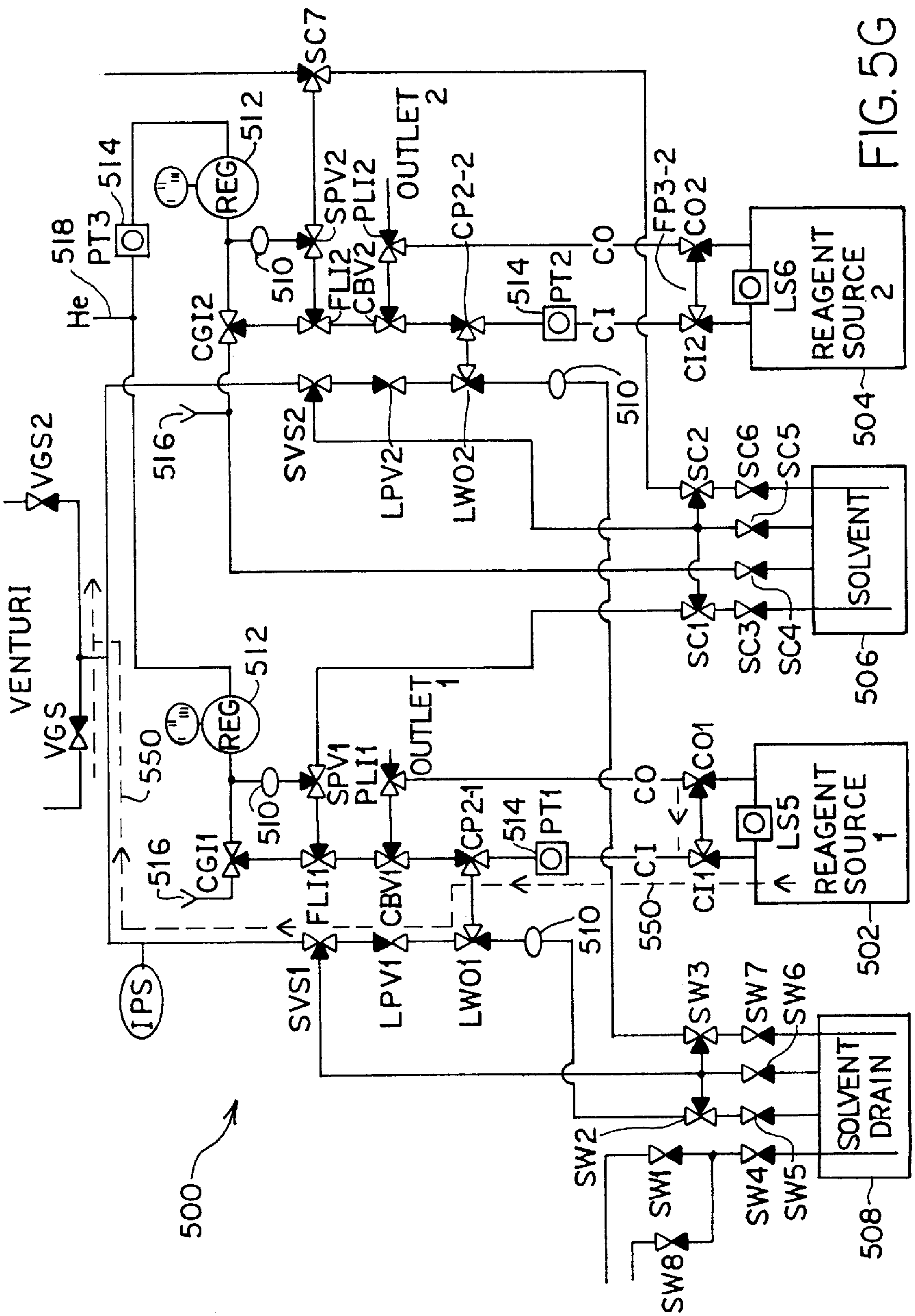

The operation of the chemical delivery system may be seen with reference to FIGS. 5B–5M. FIG. 5B illustrates the chemical delivery run mode of the chemical delivery system 500. As shown in FIG. 5B, dashed lines 522 indicate the flow of gas (for example He gas) from a gas source 518 to each canister 502 and 504. The gas is used to force chemical from the canisters 502 and 504 to OULET 1 and OUTLET 2 respectively as indicated by dashed lines 524.

The purging of the sequences of FIGS. 5C–5M may be performed after the run mode of FIG. 5B is halted. As shown in the figures, the purging sequence will be illustrated with reference to the lines and valves associated with the first chemical source canister 502, however, it will be recognized that a similar sequence may be utilized with respect to the second chemical source canister. After the run mode, a cycle purge step comprised of a Venturi vacuum dry down step and a flowing purge step may be performed. The Venturi vacuum dry down step is shown by dashed line 530 of FIG. 5C and the flowing purge step is shown by dashed line 535 of FIG. 5D. The cycle purge may be repeatedly performed. Then a canister depressurization may be performed as shown by dashed line 540 in FIG. 5E by use of the Venturi vacuum. A line drain of the outlet line may then be performed as shown by dashed line 545 of FIG. 5F. During the line drain, portions of the system may be maintained under vacuum as shown by dashed line 547. Next, another canister depressurization step may be performed as shown by dashed line 550 of FIG. 5G.

Figure 5H:
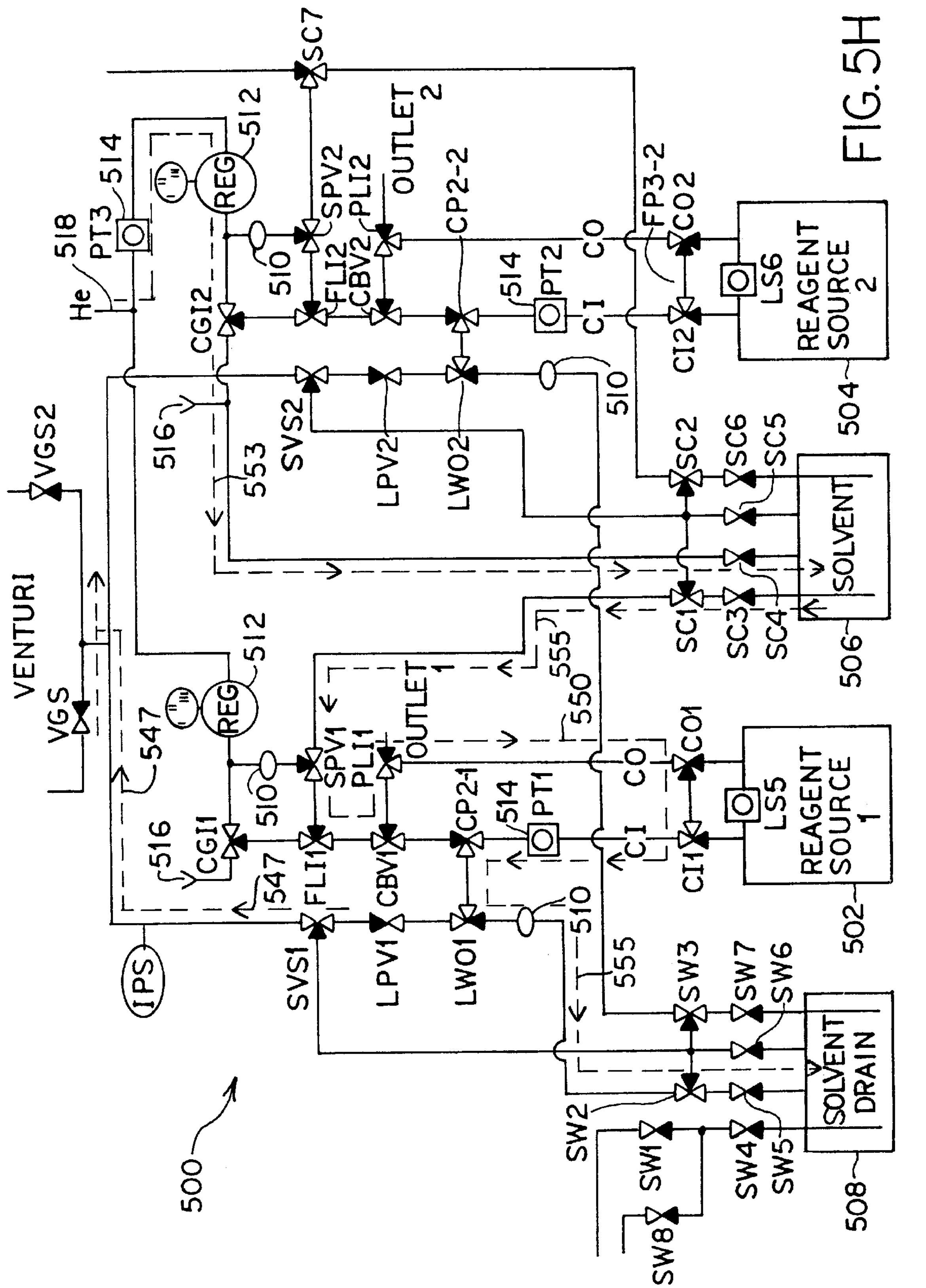
Figure 51:
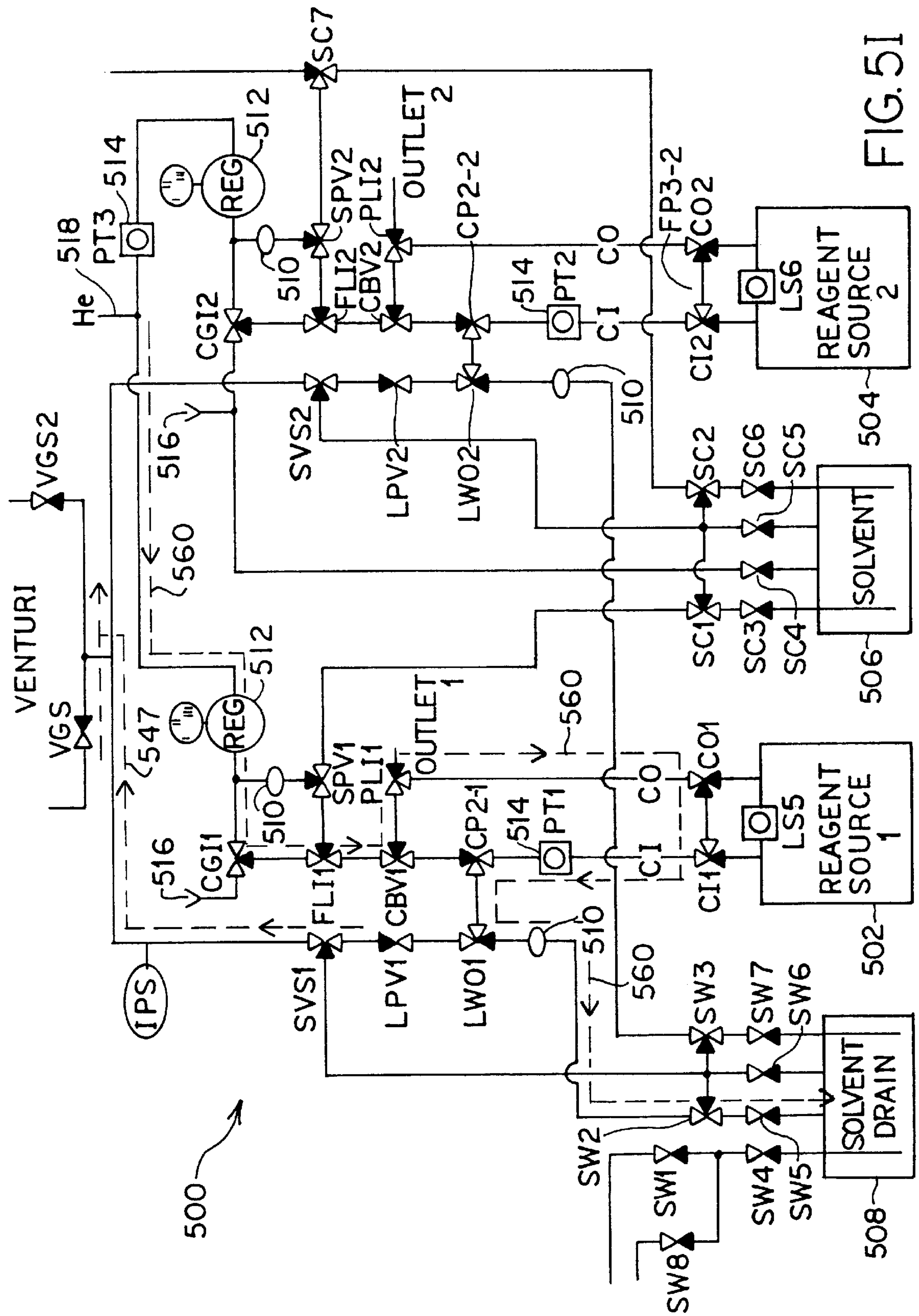
Figure 5J:
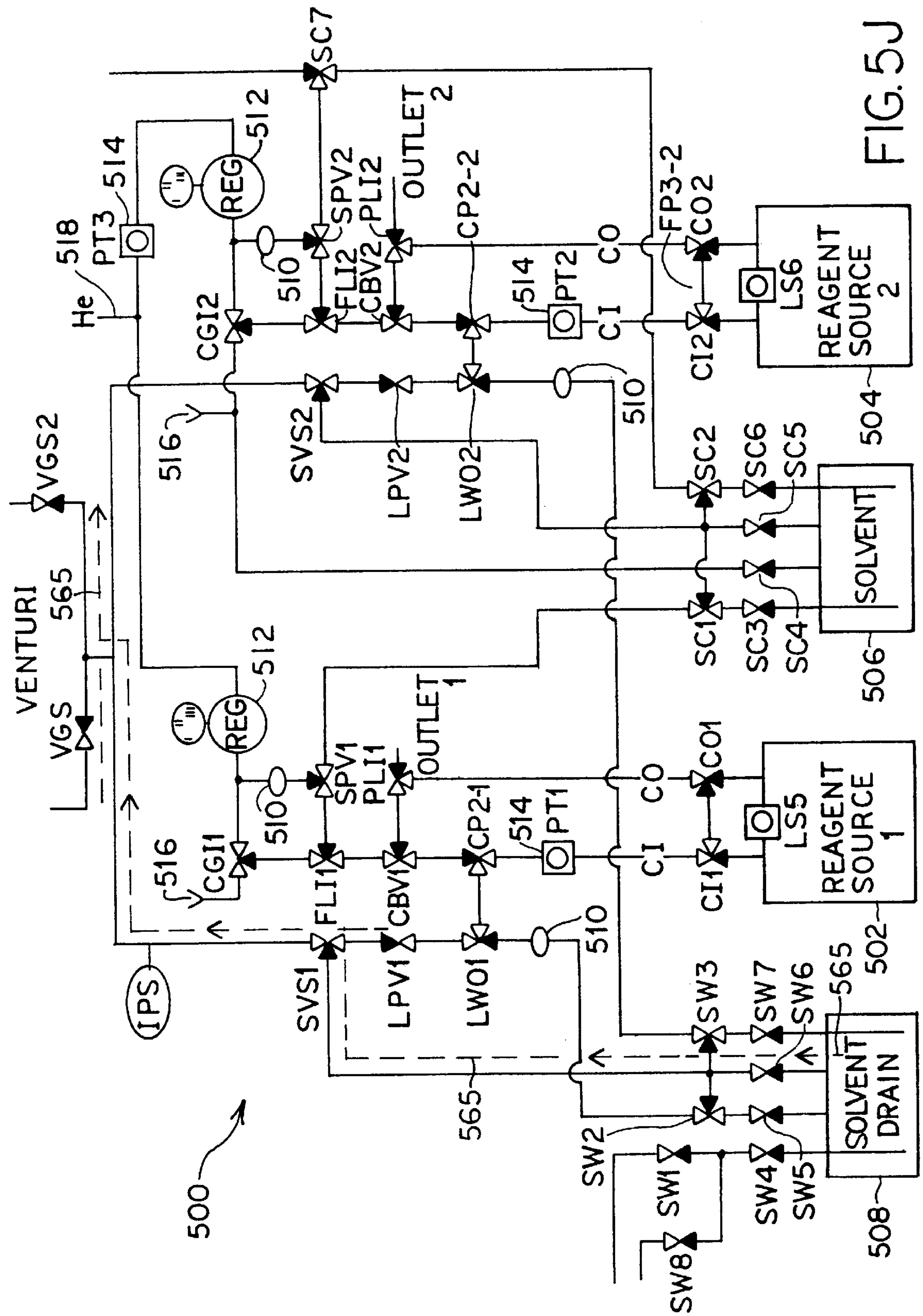
Figure 5K:
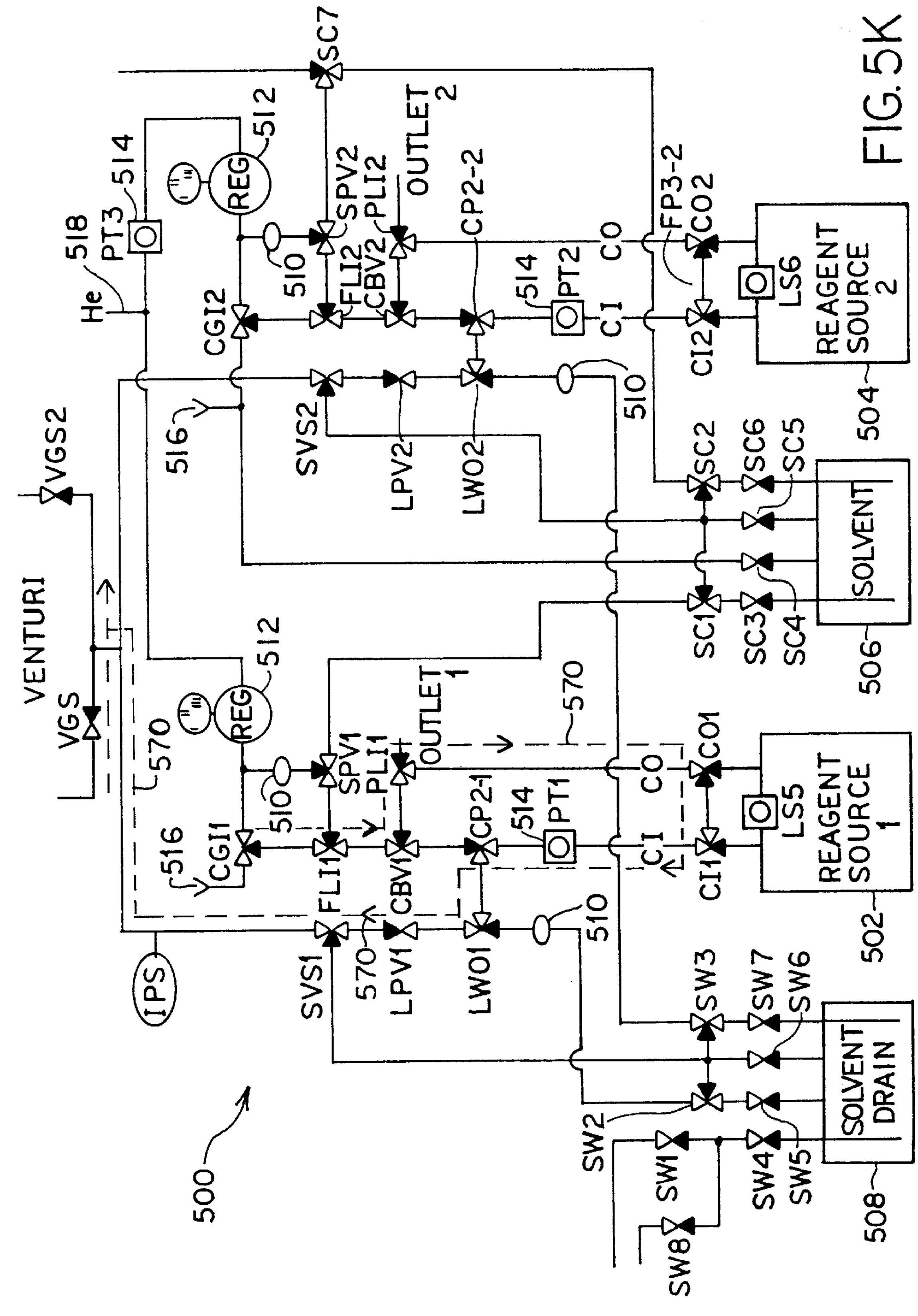
Figure 5L:
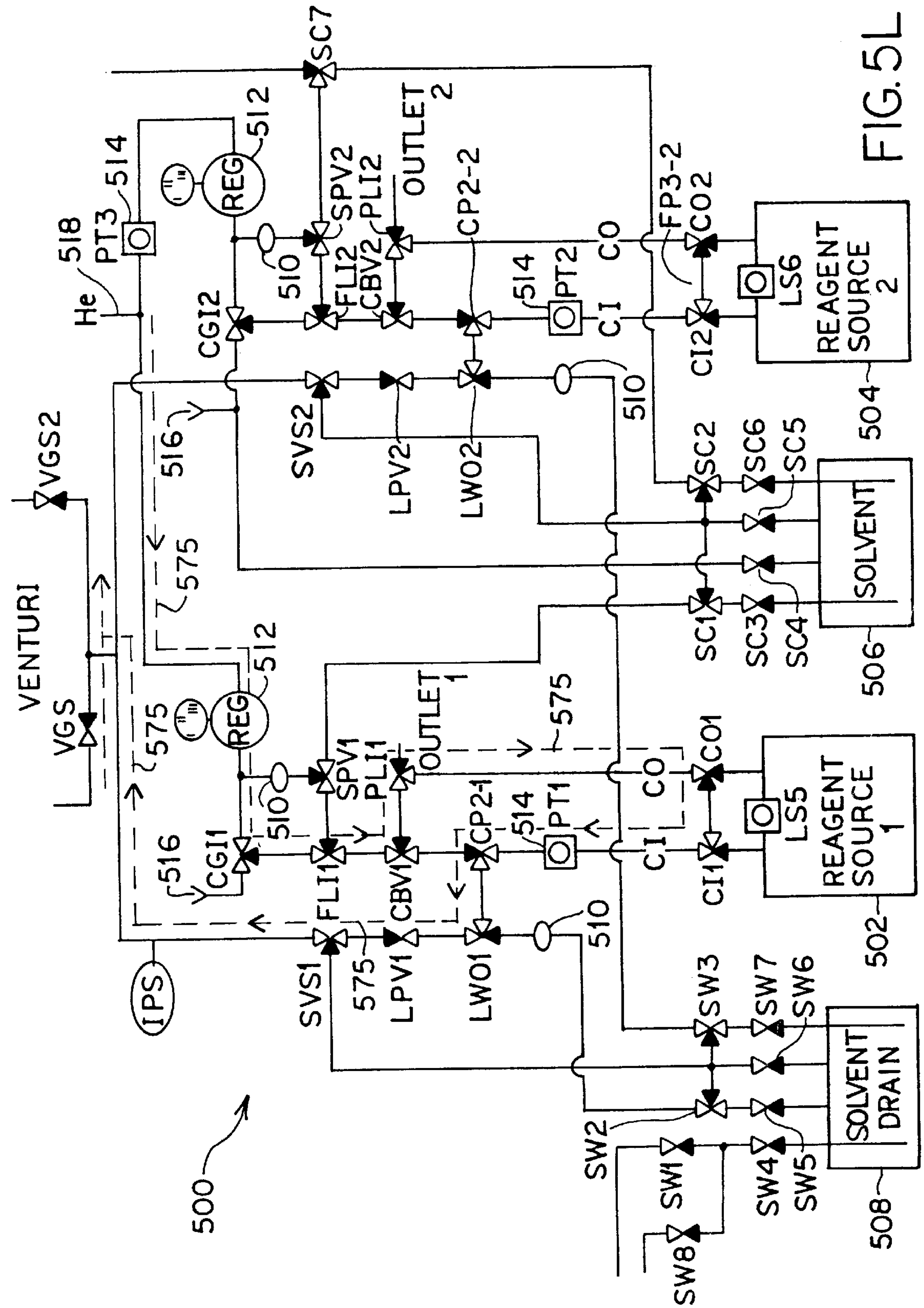
Figure 5M:
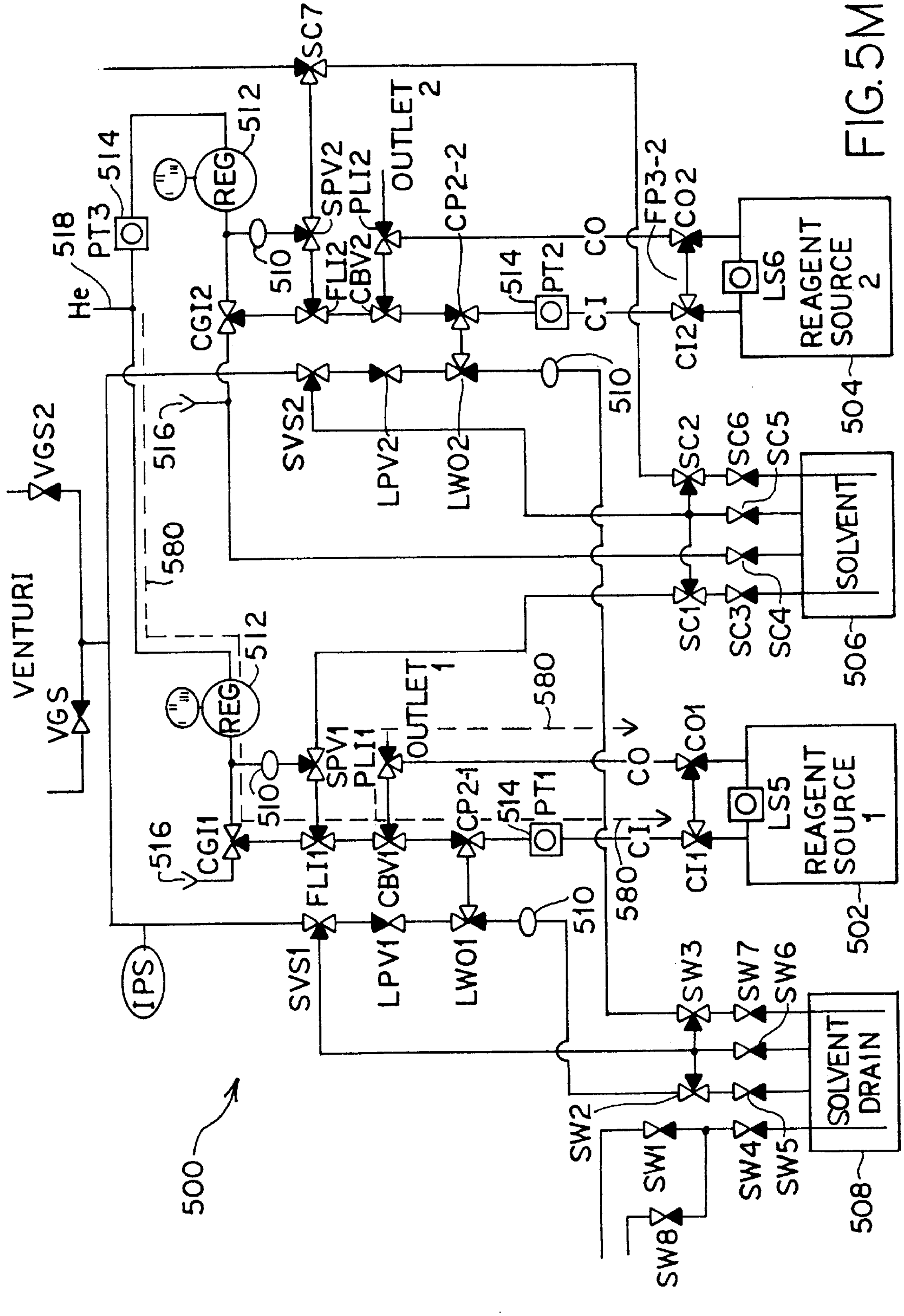

A solvent flush may be accomplished by allowing gas from the gas inlet 518 (as indicated by dashed line 553 to force solvent from the liquid flush canister 506 to the liquid waste container 508 as shown by dashed line 555 in FIG. 5H. In this manner, residual source chemical within the valves and lines of the chemical delivery system may be flushed by a solvent liquid. During this step, portions of the system may be maintained under vacuum as shown by dashed line 547. After the solvent flush, a liquid drain step may be performed to drain to the liquid waste container any of the solvent liquid remaining in the lines as indicated by dashed line 560 of FIG. 5I. Again, during this step portions of the system may be maintained under vacuum as shown by dashed line 547. The liquid waste container 508 may then be depressurized as shown by dashed line 565 in FIG. J. The liquid flush steps of FIGS. H, I and J may then be repeatedly performed in order to obtain a satisfactory purge of the source chemical from the systems valves and lines.

After the liquid flush steps, the system may be prepared for a canister change (the first source canister 502 in the example discussed herein) by cycle purge comprised of a vacuum step and a flowing purge step as shown in FIGS. K and L. As shown in FIG. K, the dashed line 570 indicates the vacuum step and as shown in FIG. L the dashed line 575 indicates the flowing purge step. The two step cycle purge process may be performed repeatedly. While a canister is disconnected during the canister exchange, a positive pressure and gas flow may be kept on the lines which connect to the canister inlet and outlet as shown in FIG. M by dashed line 580. After reconnection of another canister, additional cycle purges comprised of the vacuum step of FIG. K followed by the flowing step of FIG. L may then be performed repeatedly.

The embodiment discussed above with reference to FIGS. 5A–5M is illustrated as a non-refillable system (i.e. no refill between the first chemical source canister 502 and the second chemical source canister 504. However, a refillable system may be designed similar to the chemical delivery system 500 by the addition of a refill line between the OUTLET 1 and an inlet to the second canister 504. In this manner the techniques disclosed herein may be utilized with a refillable dual canister system.

Figure 6A:
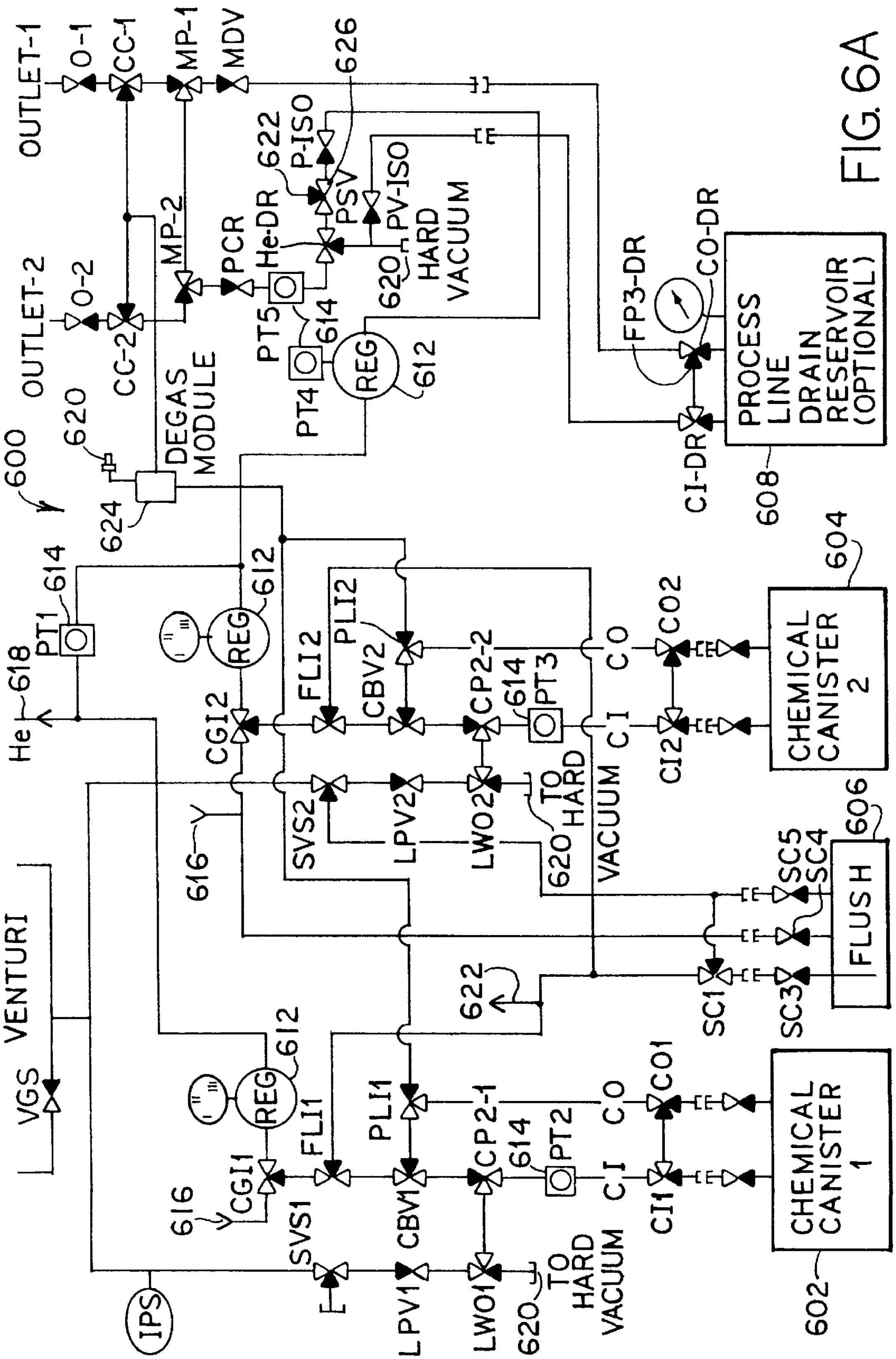
FIGS. 6A–6N illustrate a dual tank refillable chemical delivery system having a medium level vacuum, flowing purge, and hard vacuum.
Figure 6B:
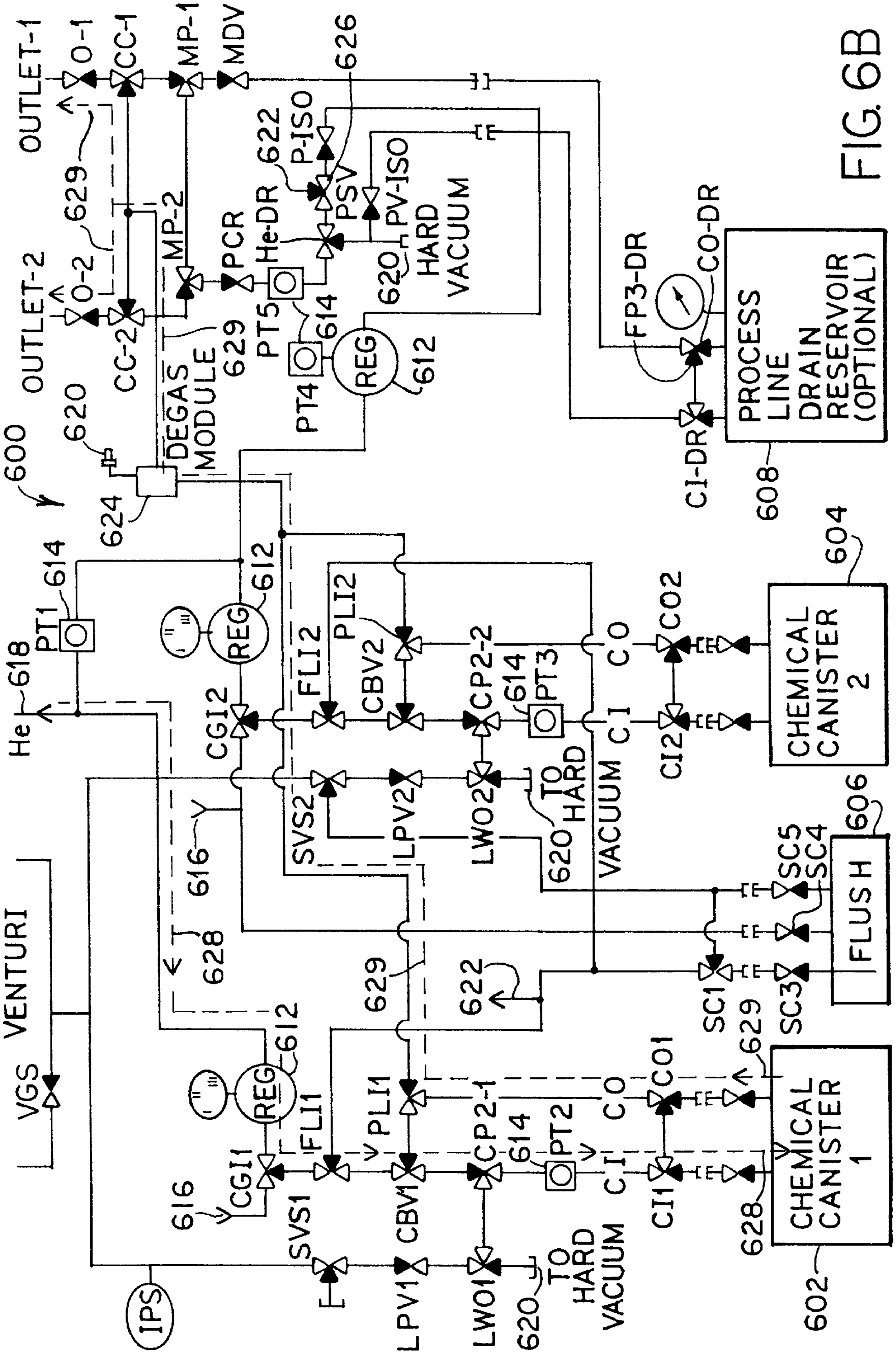
Figure 6C:
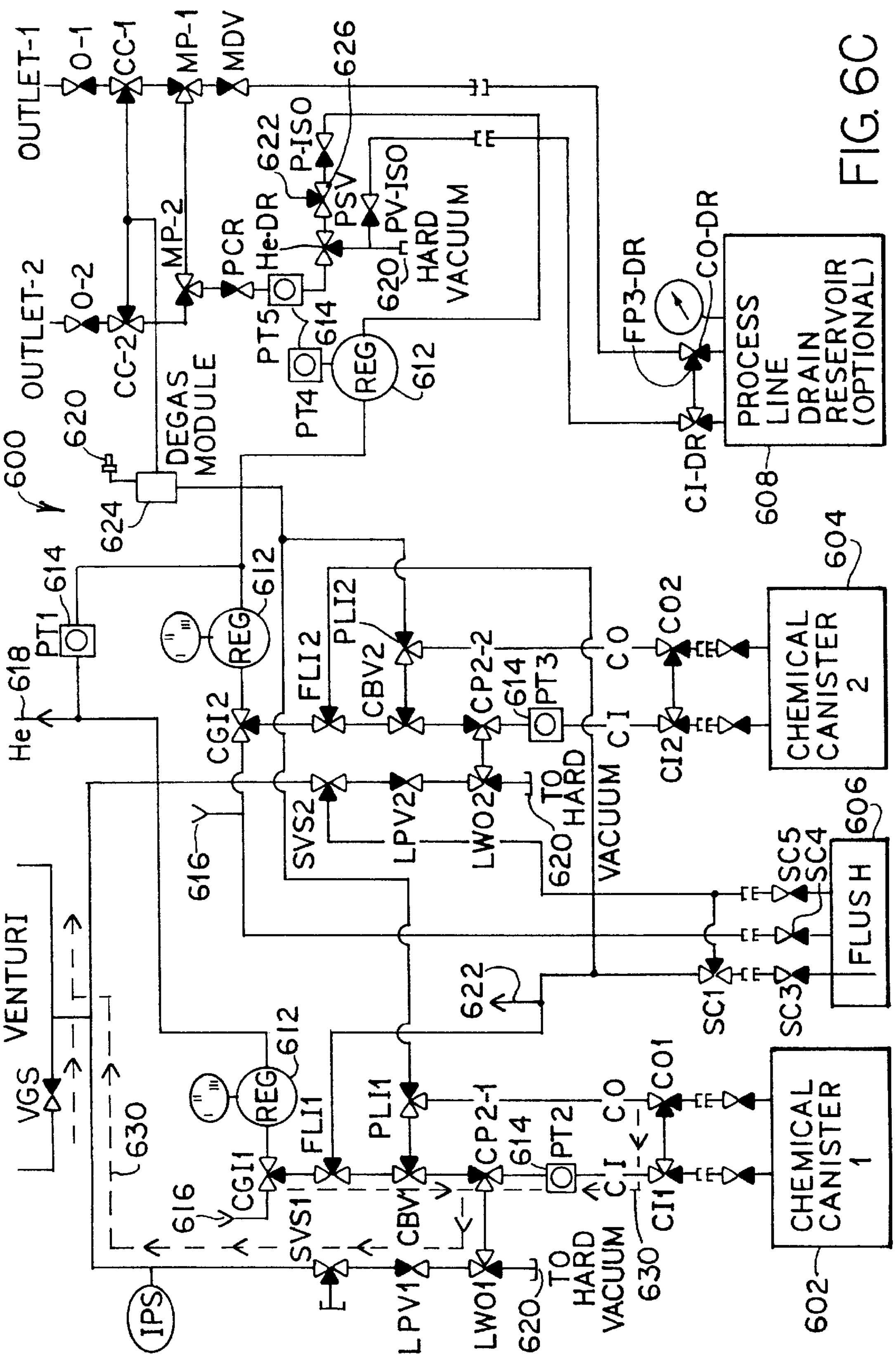
Figure 6D:
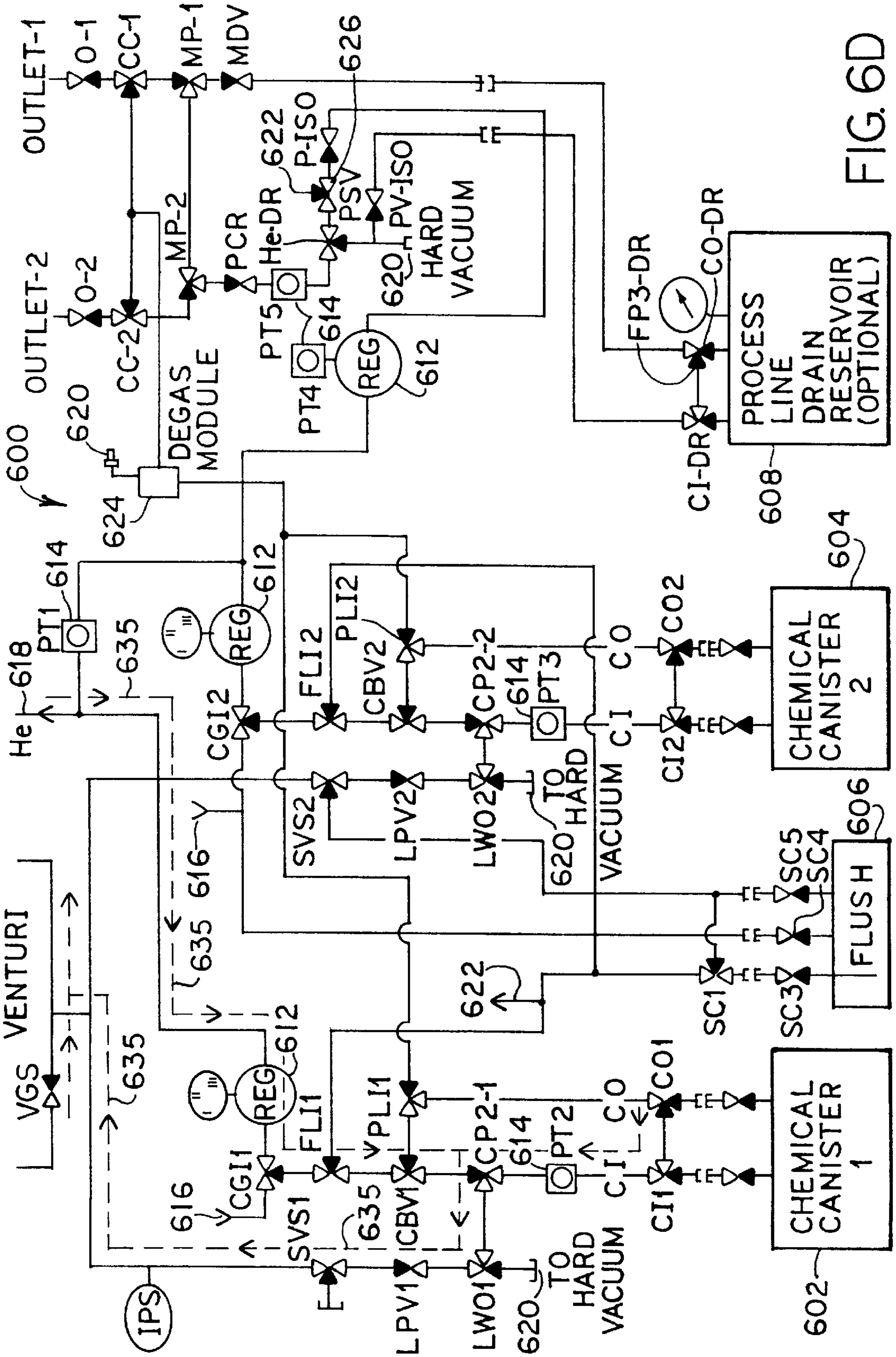
Figure 6E:
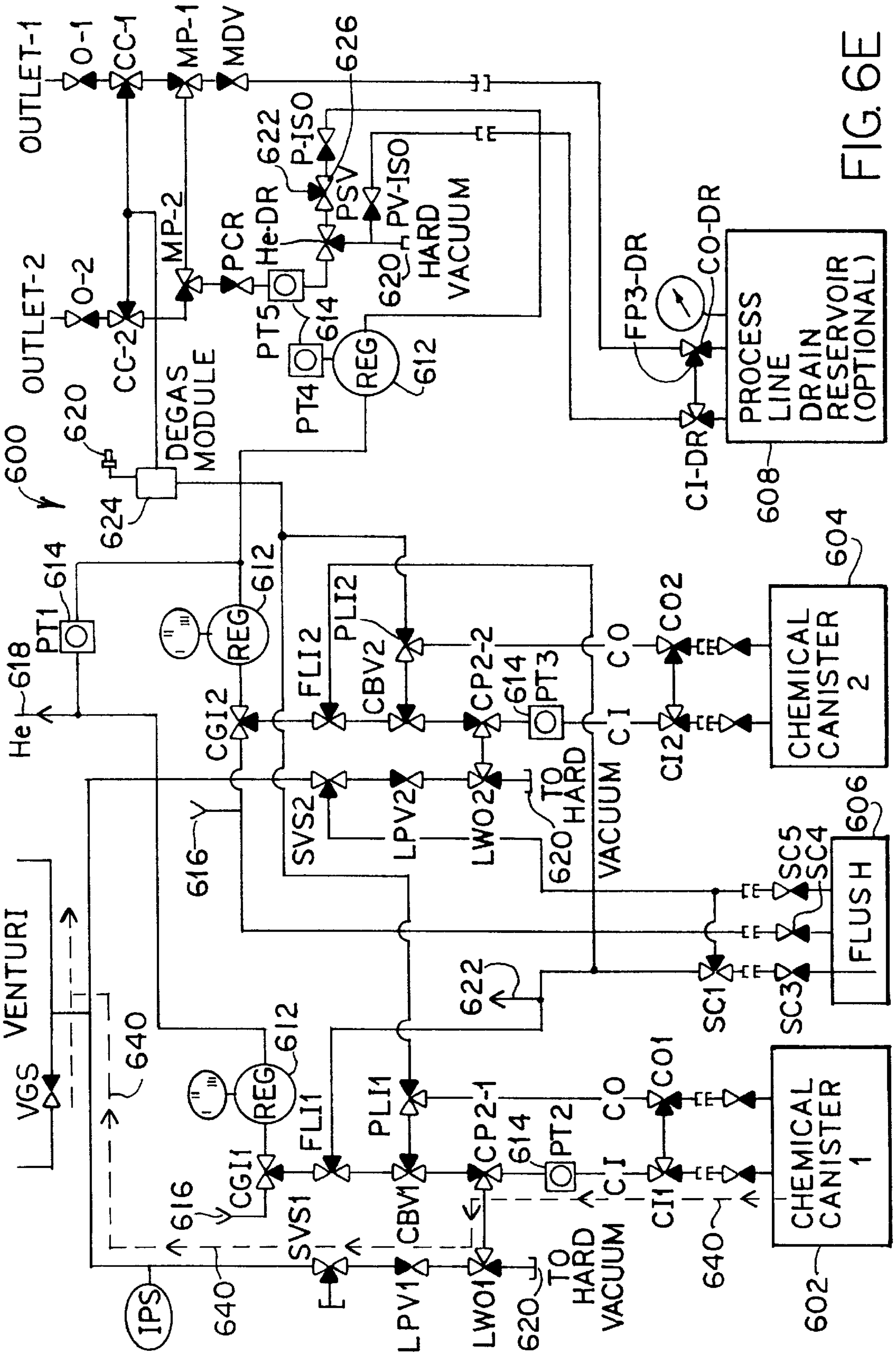
Figure 6F:
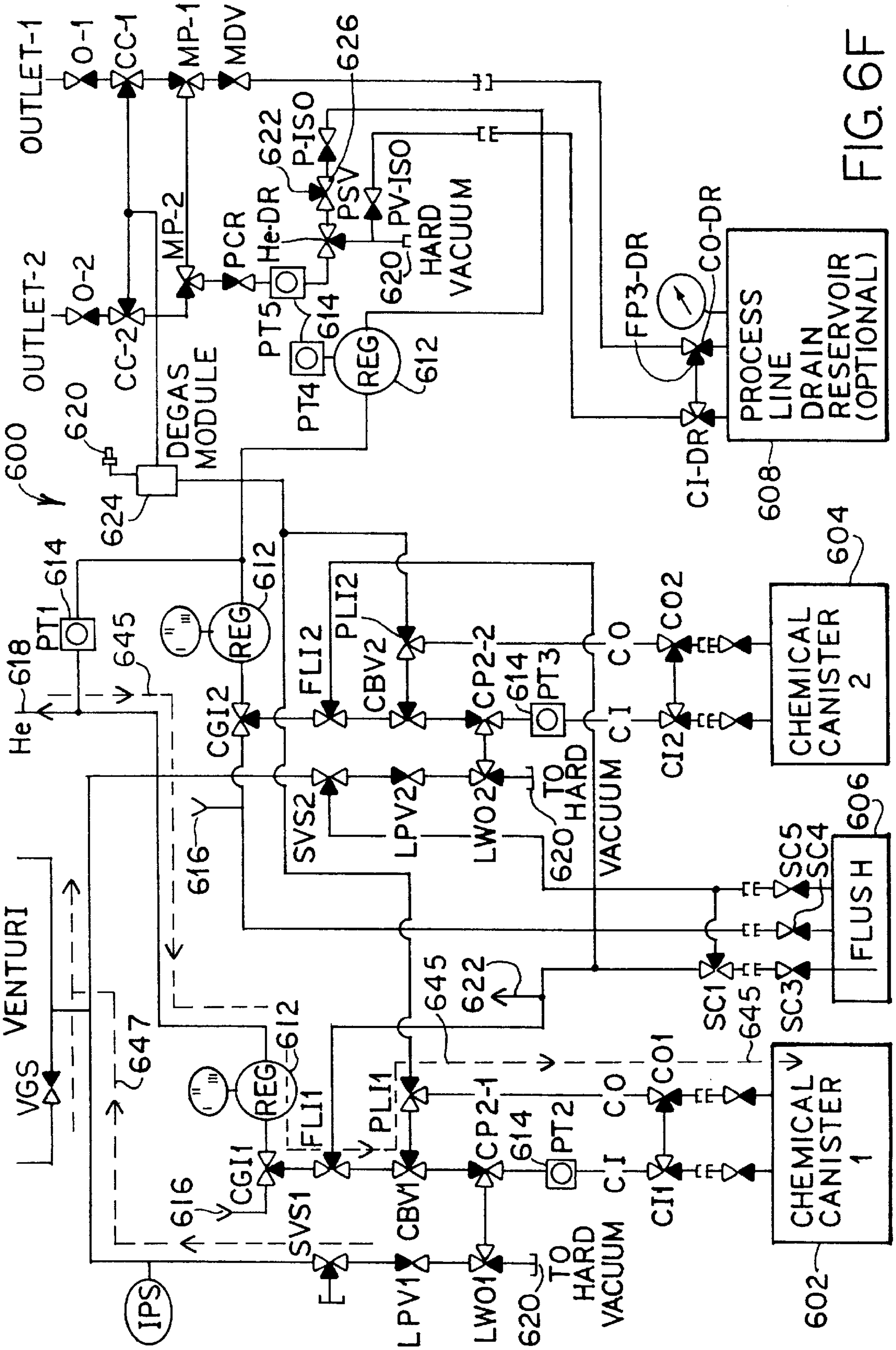
Figure 6G:
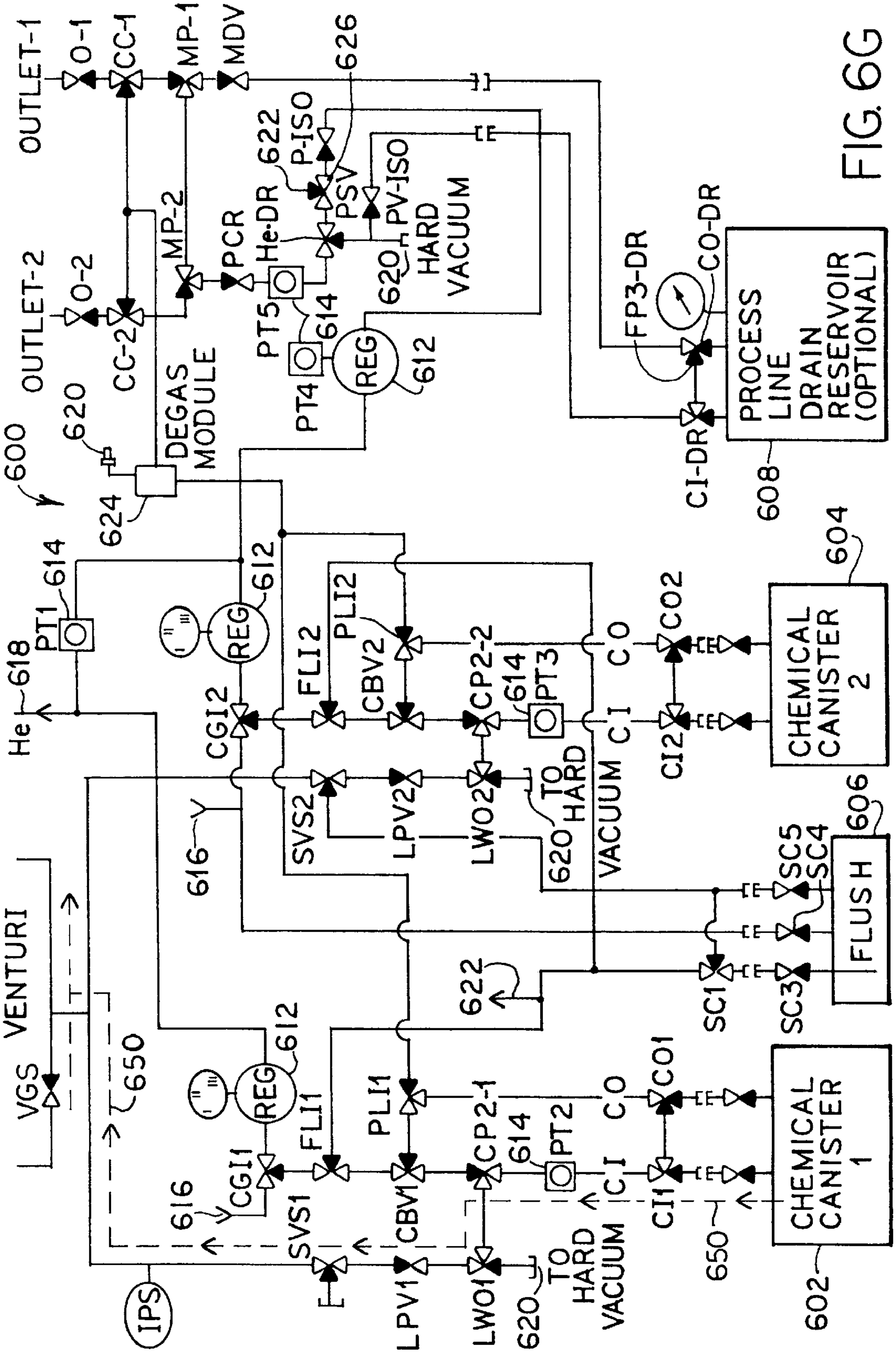
Figure 6H:
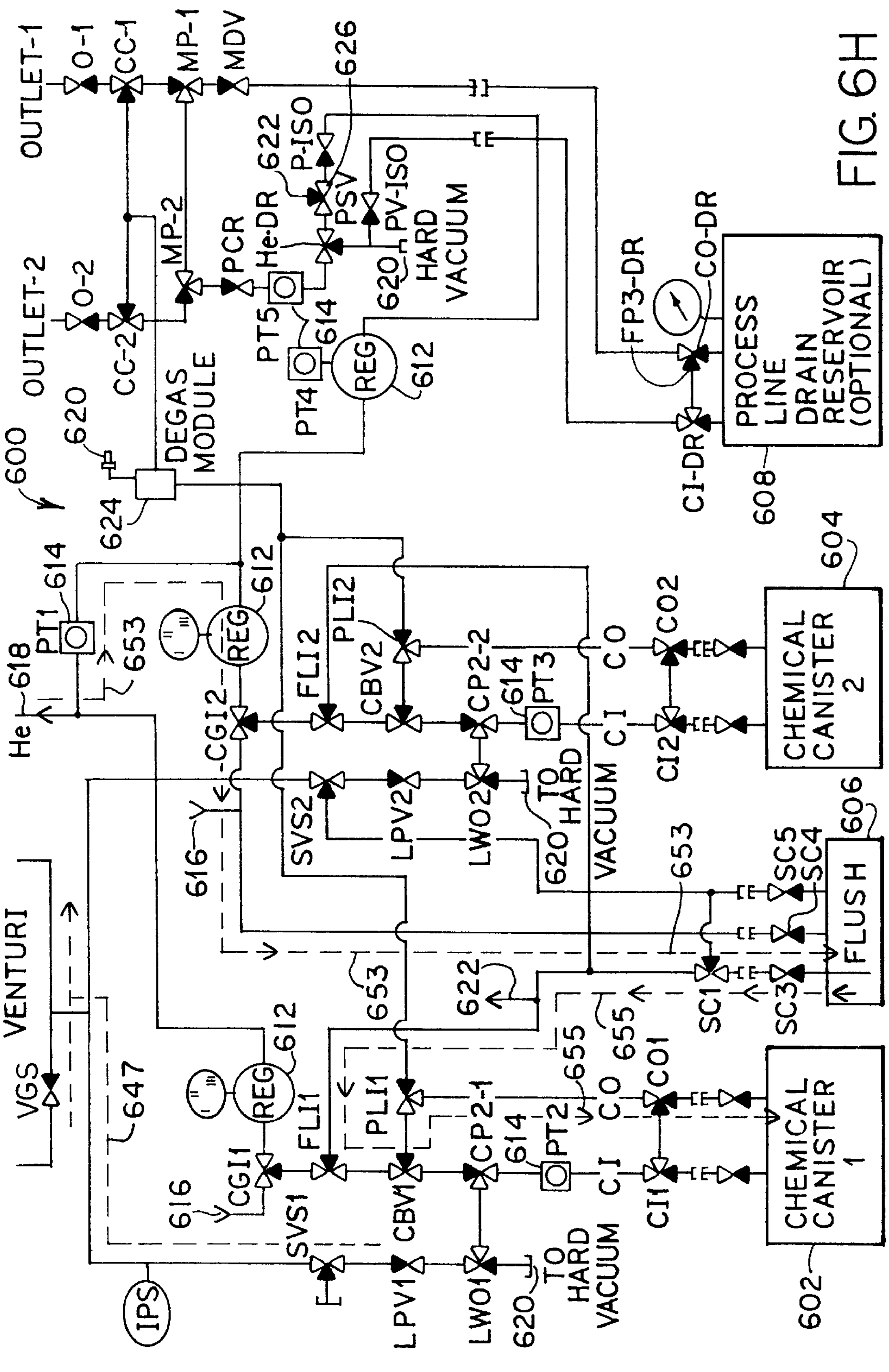
Figure 6J:
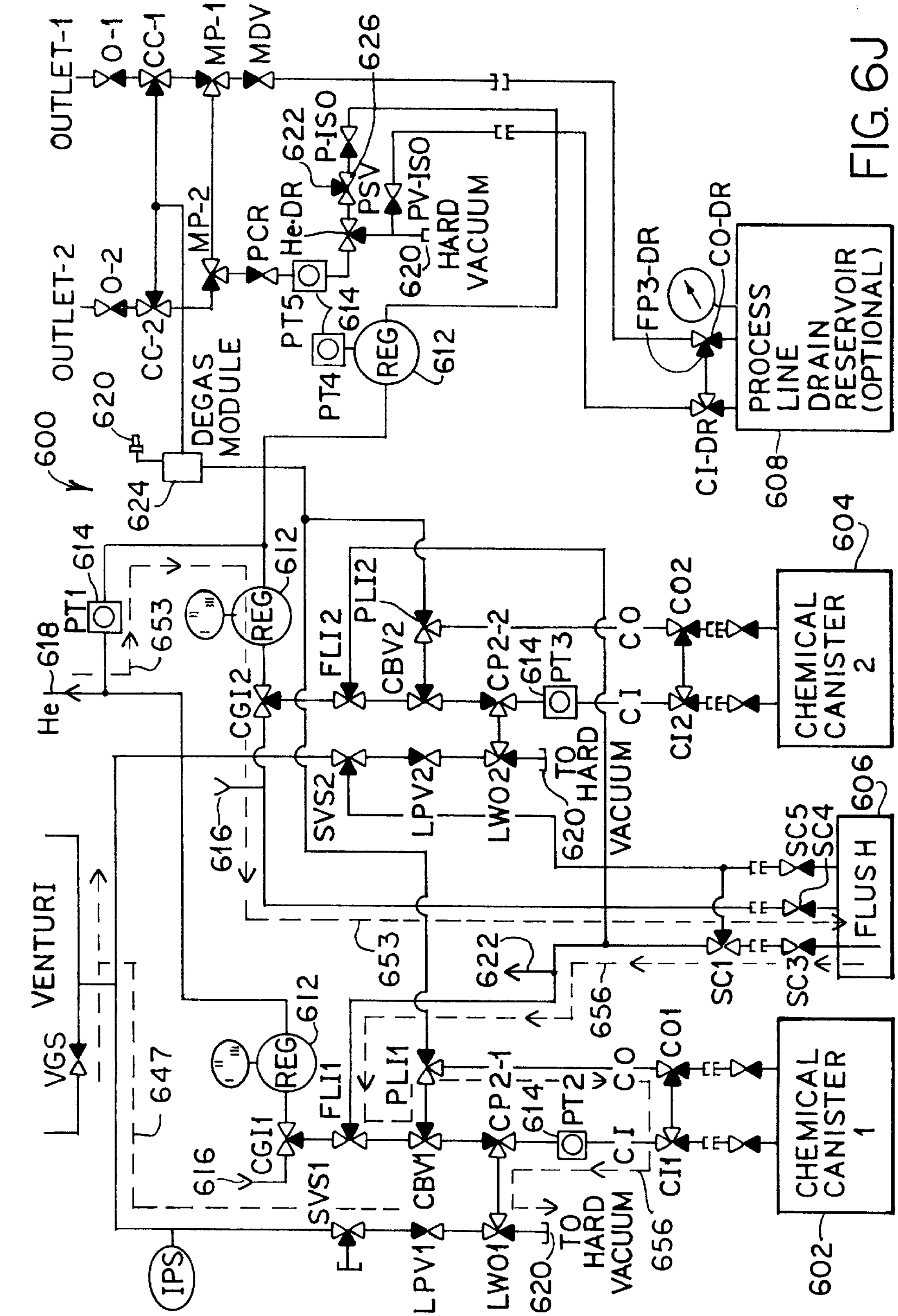
Figure 6K:
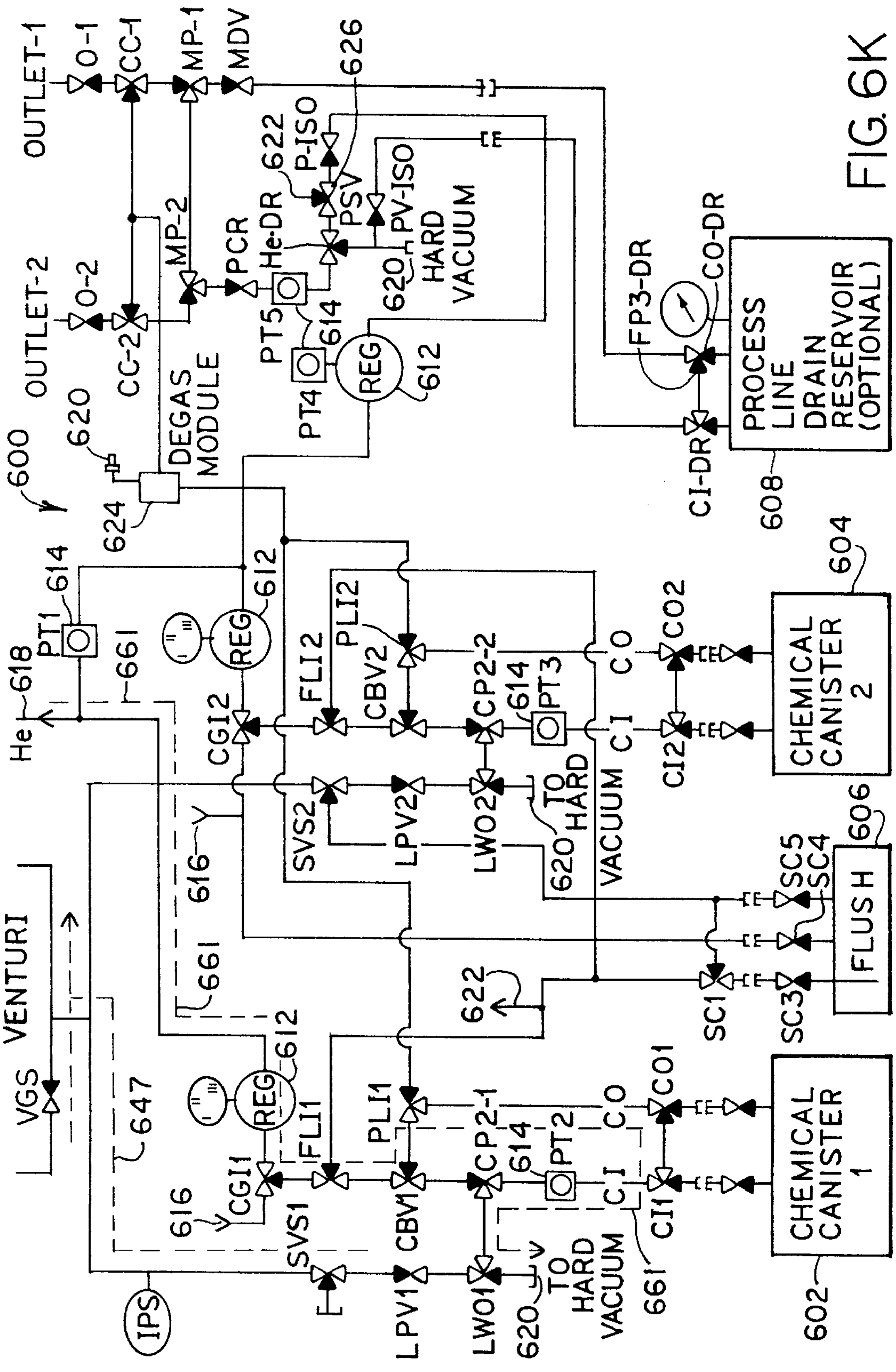
Figure 6L:
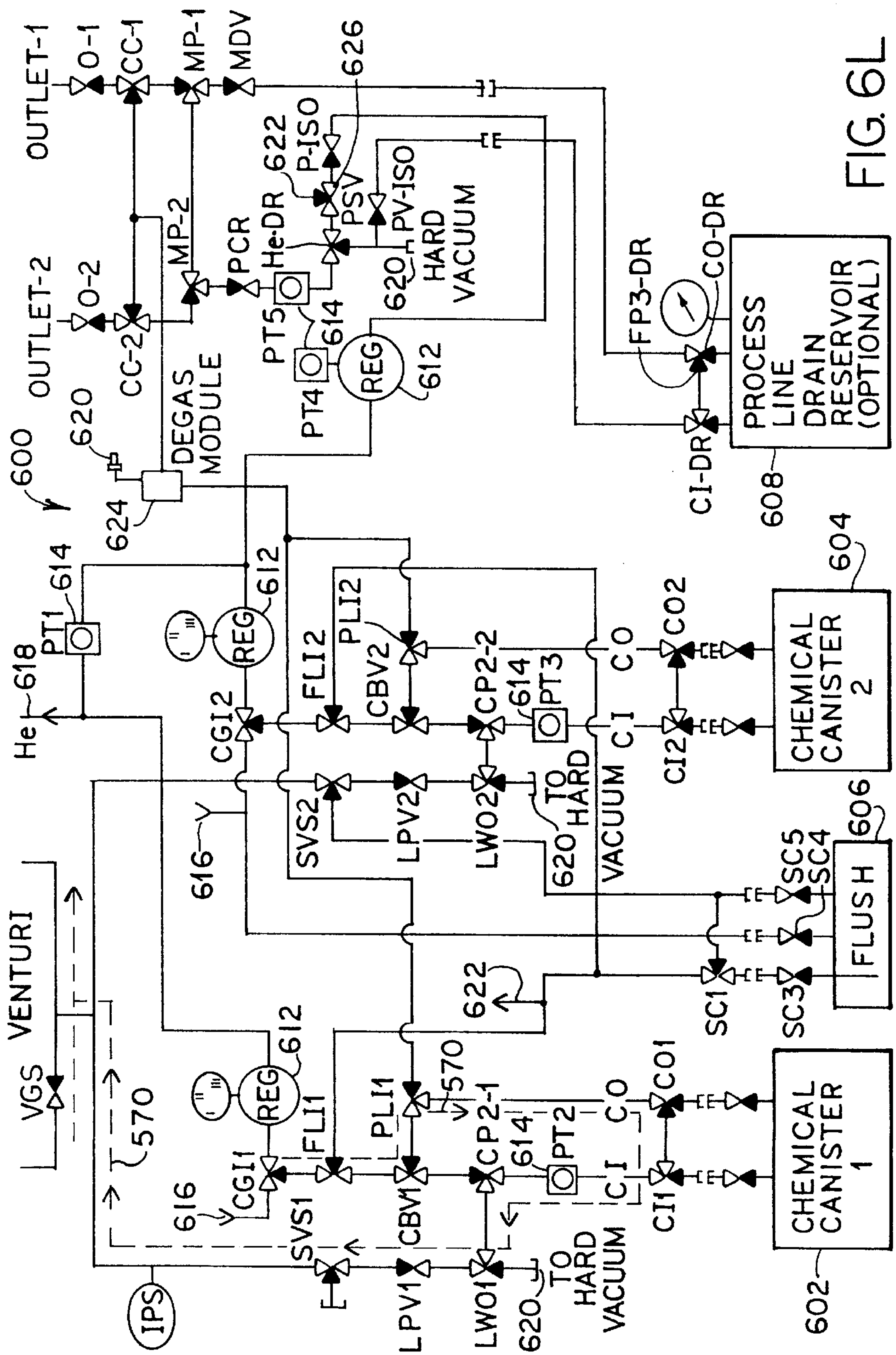
Figure 6M:
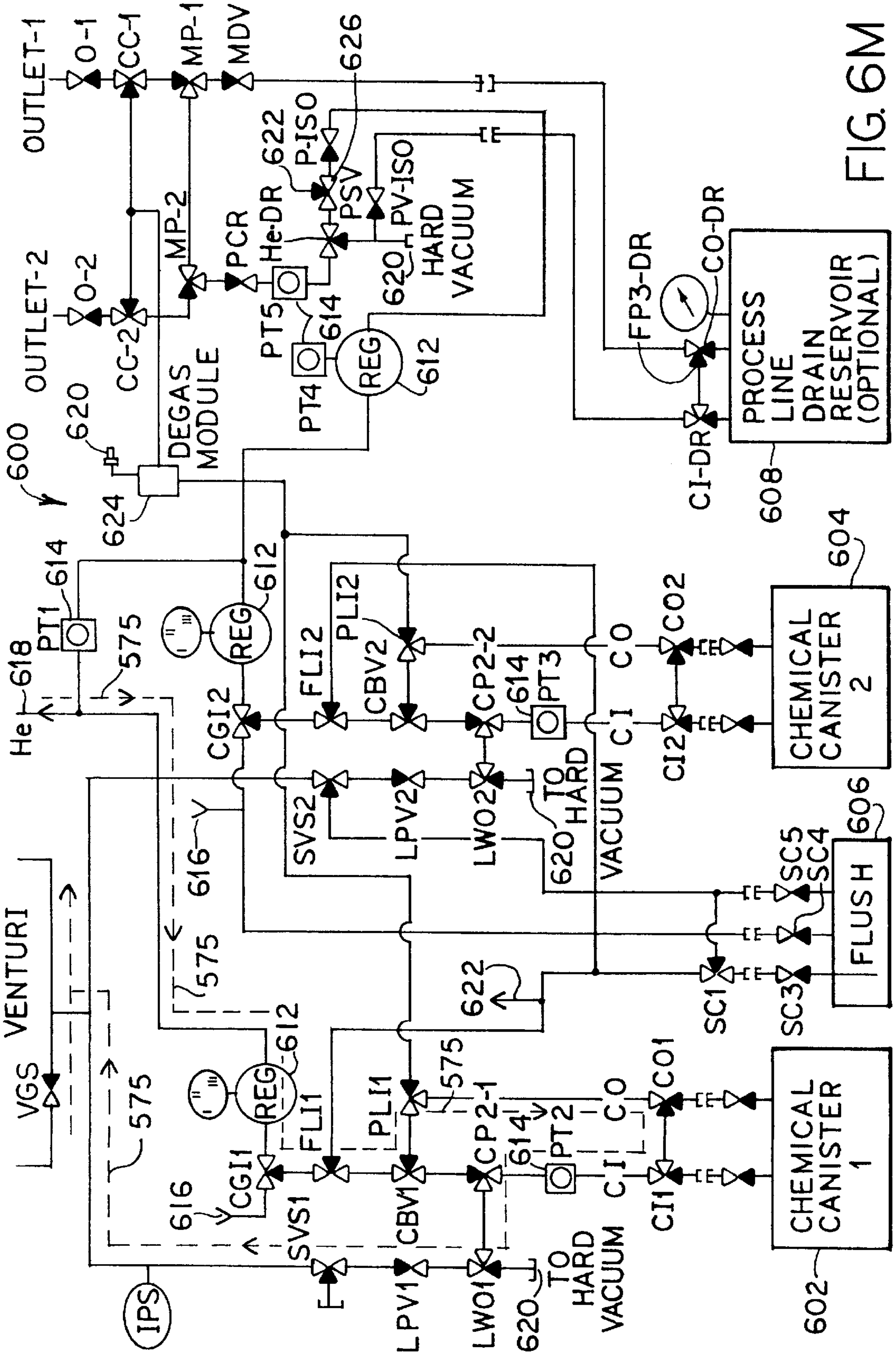
Figure 6N:
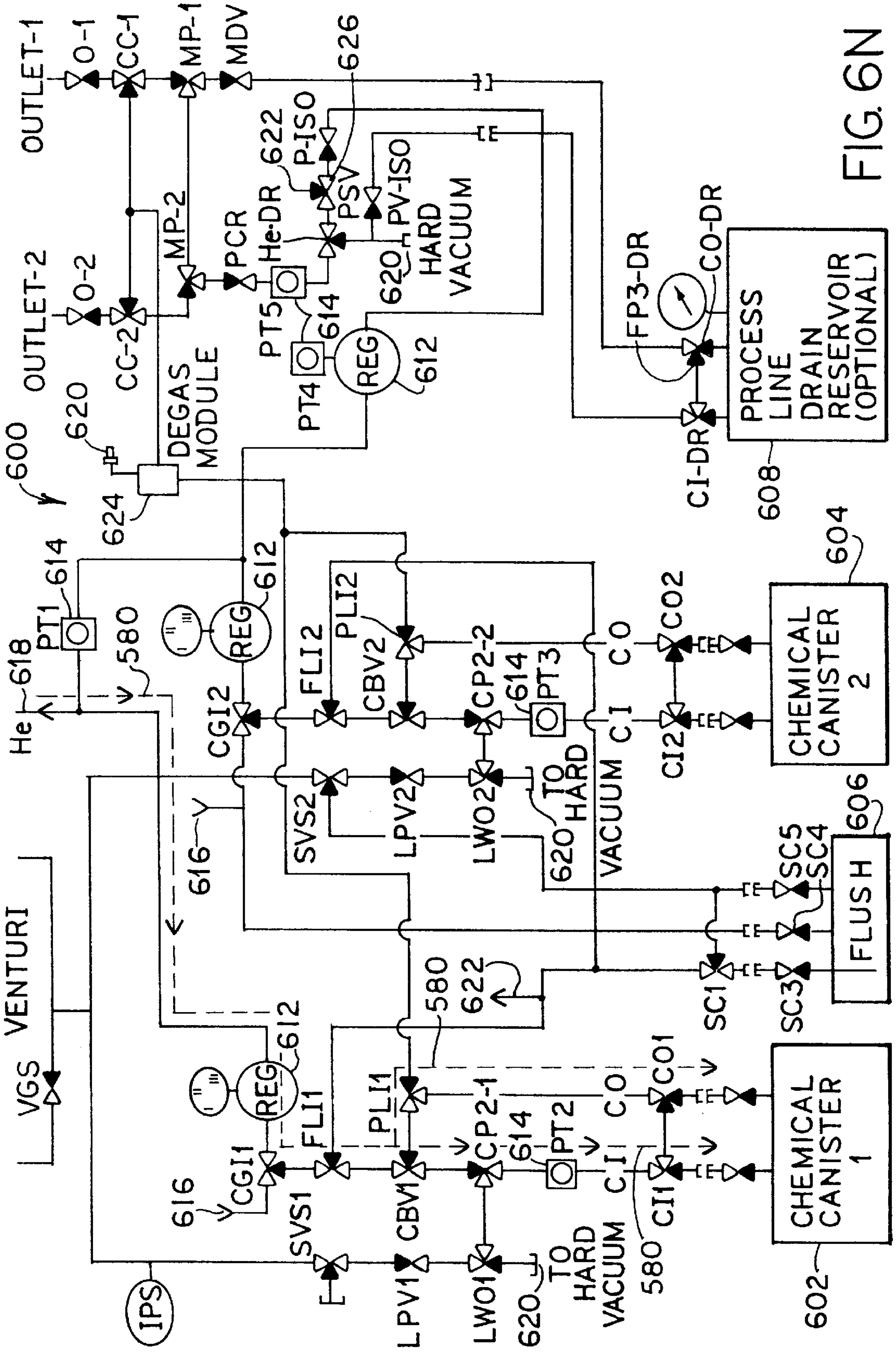

Yet another embodiment of the present invention is shown in FIGS. 6A–6N. The embodiment of FIGS. 6A–6N is a dual tank non-refillable chemical delivery system 600. The chemical delivery system 600 may be utilized such that one chemical may be supplied from either of the chemical source canisters 602 or 604 with the system switching from one canister to the next when the chemical level in one canister is low. The embodiment of FIGS. 6A–6N may be used for delivery liquid chemicals, such as for example, TDEAT or TaEth. As shown in FIGS. 6A–6N, this embodiment includes the use of multiple purge techniques. This techniques include a medium level vacuum (for example a Venturi vacuum source), a flowing purge, flush liquid purge, and/or a hard vacuum. A liquid flush source 606 such as a solvent containing canister is provided as shown. The liquid flush waste may be disposed of within an empty chemical source canister 602 or 604 (i.e. the canister being changed out). Alternatively, a dedicated liquid flush waste canister such as shown in FIG. 5A may be utilized. In yet another alternative, the liquid waste may be flushed to a hard vacuum. As will be discussed in greater detail below, a flush liquid purge may also be optionally utilized for aiding the draining of process lines to a process line drain reservoir 608.

Associated with the first source canister 602 are valves FLI1, CGI1, CBV1, CP2-1, CI1, CO1, LPV1, LWO1, SVS1, and PLI1 which are coupled similar to that as described with reference to FIG. 5A. A similar set of valves FLI2, CGI2, CBV2, CP2-2, C12, C02, LPV2, PLI2, LWO2 and SVS2 are associated with the second source canister 604. The valves associated with each canister 602 and 604 may be contained in a single manifold or may be contained in two or more separate manifolds of the chemical delivery system 600.

As also shown within FIG. 6A, the liquid flush source 606 may be coupled to valves SC1–SC5. The chemical delivery system may further include regulators 612, pressure transducers 614, inert gas source 618 (for example helium) and over-pressure check valves 616 as shown. A degas module 624 may be utilized to remove gas (such as helium) from the liquid being supplied to the process tool. Various portions of the chemical delivery system 600 may be connected to a hard vacuum as shown by hard vacuum connections 620. OUTLETS which supply liquid chemical to a process tool are also provided. A flush line 622 between valve SCI and valve 626 is not shown in its entirety so as to simplify the illustration, however, the flush line 622 is one continuously connected line.

The operation of the chemical delivery system may be seen with reference to FIGS. 6B–6N which illustrate the supply of chemical from the first chemical source canister 602 while the second chemical source canister 604 is idle and the steps performed when the first chemical source canister 602 is replaced. FIG. 6B illustrates the chemical delivery run mode of the chemical delivery system 600. As shown in FIG. 6B, dashed line 628 indicates the flow of gas (for example He gas) from a gas source 618 to a canister 602. The gas is used to force chemical from the canister 602 to the outlets OUTLET-1 and OUTLET-2 as indicated by dashed line 629. The use of two or more outlets allows chemical to be supplied from a single chemical canister to two or more process tools. Thus, the chemical outlet is configured in a multi-branch outlet configuration. Further, chemical supply to OUTLET-1 and OUTLET-2 may be independently controlled through valves CC-1 and CC-2 respectively. Thus, chemical may supplied from both outlets at the same time or from only OUTLET-1 or from only OUTLET-2. Valves 0–1 and 0–2 may be manual valves which are left open during normal operations.

The purging of the sequences of FIGS. 6C–6N may be performed after the run mode of FIG. 6B is halted. While the lines and valves associated with one canister are being purged, the other canister may be operating in the run mode. As shown in the figures, the purging sequence will be illustrated with reference to the lines and valves associated with the first chemical source canister 602, however, it will be recognized that a similar sequence may be utilized with respect to the second chemical source canister. After the run mode of the first chemical source canister 602 is halted, a cycle purge step comprised of a Venturi vacuum dry down step and a flowing purge step may be performed. The Venturi vacuum dry down step is shown by dashed line 630 of FIG. 6C and the flowing purge step is shown be dashed line 635 of FIG. 6D. The cycle purge may be repeatedly performed. Then a canister depressurization may be performed as shown by dashed line 640 in FIG. 6E by use of the Venturi vacuum. A line drain of the outlet line may then be performed as shown by dashed line 645 of FIG. 6F. During the line drain, portions of the system may be maintained under vacuum as shown by dashed line 647. Next, another canister depressurization step may be performed as shown by dashed line 650 of FIG. 6G.

Figure 61:
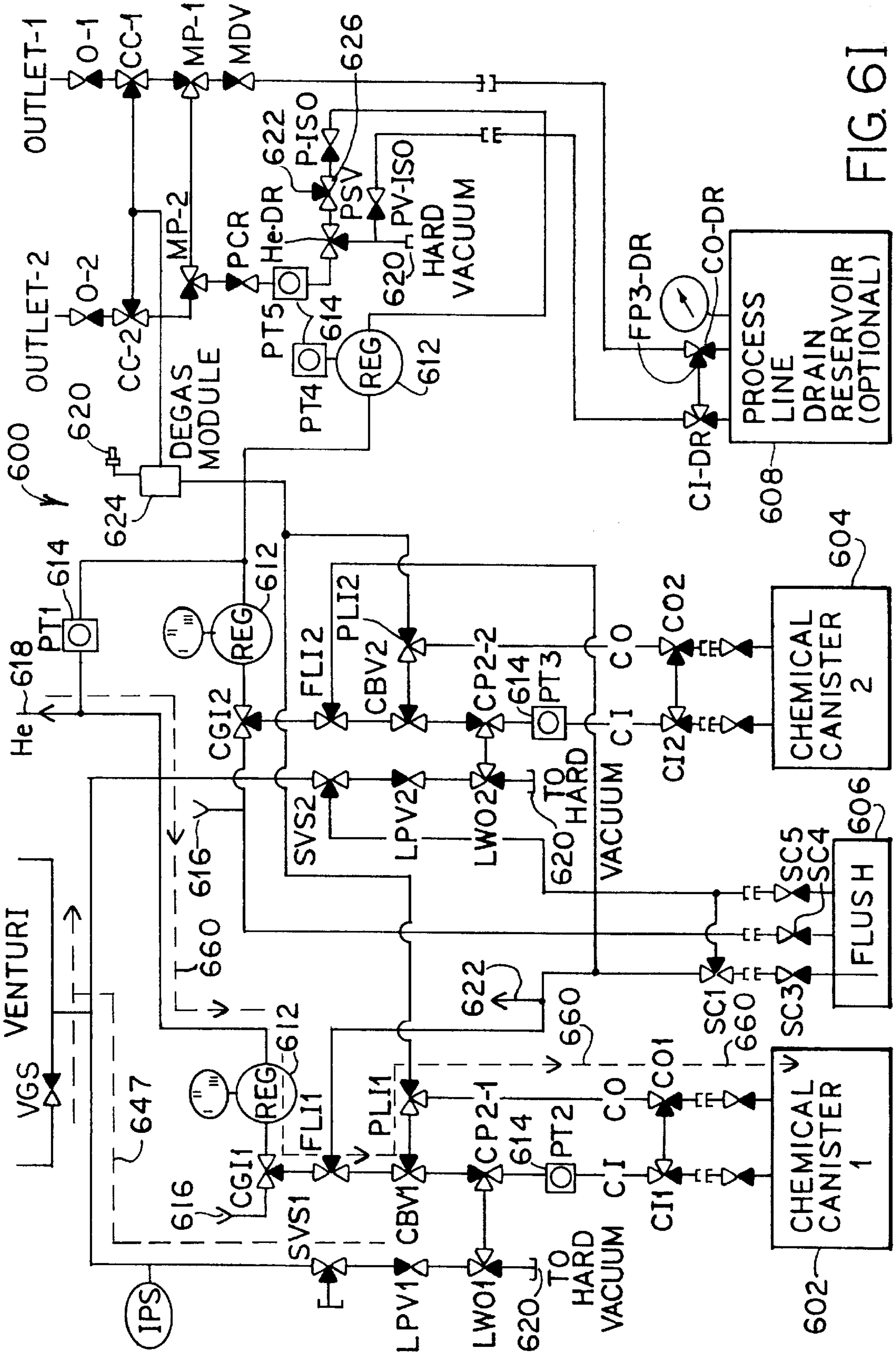

A solvent flush may be accomplished by allowing gas from the gas inlet 618 (as indicated by dashed line 653 to force solvent from the liquid flush canister 606 to the chemical source container 602 as shown by dashed line 655 in FIG. 6H. In this manner, residual source chemical within the valves and lines of the chemical delivery system may be flushed by a solvent liquid. During this step, portions of the system may be maintained under vacuum as shown by dashed line 647. After the solvent flush, a liquid drain step may be performed to drain to the liquid waste container any of the solvent liquid remaining in the lines as indicated by dashed line 660 of FIG. 6I. Again, during this step portions of the system may be maintained under vacuum as shown by dashed line 647. The steps of FIGS. 6G, 6H, and 61 may then be repeatedly performed in order to obtain a satisfactory purge of the source chemical from the systems valves and lines.

Alternatively, rather than the steps of FIGS. 6H and 6I, the liquid waste may be flushed to a hard vacuum source. Thus, the step of FIG. 6J may be used in place of the step of FIG. 6H. As shown by dashed line 656 in FIG. 6J, the solvent from the liquid flush canister 606 may be flushed to a hard vacuum connection 620 (rather than the chemical source canister as shown in FIG. 6H). Then after the solvent flush of FIG. **6*j*, a liquid drain step may be performed to drain to the liquid waste container any of the solvent liquid remaining in the lines as indicated by dashed line 661 of FIG. 6K. Again, during this step portions of the system may be maintained under vacuum as shown by dashed line 647. The steps of FIGS. 6G, 6K, and 6J** may then be repeatedly performed in order to obtain a satisfactory purge of the source chemical from the systems valves and lines.

After the liquid flush steps, the system may be prepared for a canister change (the first source canister 602 in the example discussed herein) by a cycle purge comprised of a vacuum step and a flowing purge step as shown in FIGS. 6L and 6M. As shown in FIG. 6L, the dashed line 570 indicates the vacuum step and as shown in FIG. 6M the dashed line 575 indicates the flowing purge step. The two step cycle purge process may be performed repeatedly. While a canister is disconnected during the canister exchange, a positive pressure and gas flow may be kept on the lines which connect to the canister inlet and outlet as shown in FIG. 6N by dashed line 580. After reconnection of another canister, additional cycle purges comprised of the vacuum step of FIG. 6L followed by the flowing step of FIG. 6M may then be performed repeatedly.

The flush line 622 may be utilized to provide a liquid flush for use in flushing the process lines connected between the outlets (OUTLET-1 and OUTLET-2) and the process tool.

Thus, liquid solvent may be provided from the liquid flush canister 606 to the flush line 622 through the valve 626 so that the process lines may be flushed with the liquid solvent similar to the techniques described above the for flushing the other lines exposed to the chemical supplied from the source chemical canisters. The waste from the process line drain may be provided to the process line drain reservoir 608. The reservoir 608 may or may not be enclosed within the cabinet housing the chemical delivery system. In another embodiment, a reservoir 608 may not be utilized, but rather the liquid waste may be provided to a hard vacuum connection similar to the technique discussed with reference to FIGS. 6J and 6K. Thus, the liquid waste may be disposed off through the hard vacuum connection 620 that is located proximate the valve 626. In either cases, multiple purge techniques including vacuum, flowing inert gas, and liquid flush techniques may be utilized to purge the process lines and associated valves.

A process for draining and flushing the process line may be seen in more detail with reference to FIG. 6A. The draining and flushing process is described herein with reference to OUTLET-1 (thus valve O–1 will be open through this example), but it will be recognized that a similar process may be utilized to drain the process lines between OUTLET-2 and the process tool. Moreover, the draining and flush process described herein with reference to OUTLET-1 may be performed while chemical is being supplied through OUTLET-2 or vice-versa. Thus, one branch of the outlets may be purged while the other branch is still operating to provide chemical to the process tool.

To initialize the process line drain and flush, the process line drain reservoir 608 may be depressurized by use of the hard vacuum connection 620 and opening valves PV-ISO and CI-DR. Then pressure in the process line drain reservoir outlet line may be relieved by opening the CO-DR and MDV valves. Next valve MP-1 may be opened so that the line to the process tool is now under vacuum and liquid will drain to the reservoir. After the process line has been placed under vacuum, the next step is to flow an inert gas (supplied by the process tool) from the process tool through the valves OUTLET-1, CC-1, MP-1, MDV to the process line drain reservoir through valve CO-DR. This flowing purge step pushes any fluid in the process lines into the reservoir 608. Multiple cycles of the vacuum and inert gas push steps may be performed.

Next, valve MP-1 may be closed and another canister depressurization performed by opening valves PV-ISO and CI-DR. After depressurization, the valves PV-ISO and CI-DR may be closed. Then any liquid in the line between the valves MP-2 and MP-1 may be pushed to the drain reservoir by using the inert gas source 618 by opening valves P-ISO, PCR, MDV and CO-DR.

Next a hard vacuum followed by a liquid flush may be repeatedly performed. First, the process lines may be put under the hard vacuum by opening valves PV-ISO, FP3-DR, MDV, and MP-1. After the hard vacuum is ceased, the process lines may be subjected to a liquid flush by opening valves PSV, PCR, and MP-1. This allows flush liquid to be pushed up to the process tool. Then the PSV valve may be closed and the MDV and CO-DR valves opened to allow the 1 liquid in the process lines to drain down into the drain reservoir 608. These hard vacuum and liquid flush steps may then be repeated (for example 3–5 cycles).

Thus, the valves and lines associated with the multi-branch outlets and the reservior (valves 0-1, 0-2, CC-1, CC-2, MP-1, MP-2, PCR, MDV, HE-DR, P-ISO, PSV, PV-ISO and associated lines, which collectively may be referred to as a distribution or outlet manifold) may be purged by utilizing multiple purge techniques. Thus, it may be seen that the use of multiple purge techniques described with reference to purging valves associated with a chemical supply canister is also beneficial for use with purging other valves of the chemical delivery system. When utilized with valves associated with a supply canister, the multiple purge techniques may provide benefits for limiting contamination which may occur during canister change-outs, canister refills, etc. When utilized with the valves associated with the multi-branch outlets (the distribution manifold), the multiple purge techniques provide benefits for limiting contamination which may occur when a process line is taken off-line and/or during start-up of use of a process line. Moreover, the multiple purge techniques may be utilized on one branch of the outlets (for example OUTLET-1) while the other branch is still supplying chemical (for example OUTTET-2) or vice versa. Thus, the use of multiple purge techniques to limit contamination is useful for the canister manifold (the valves associated with a given canister) and the distribution manifold. Though discussed herein as separate manifolds, it will be recognized that the canister manifold and distribution manifold may be considered as sub-parts of one larger manifold which includes some or all the valves of FIG. 6A.

Yet another embodiment of the present invention is shown in FIGS. 7A–7M. The embodiment of FIGS. 7A–7M is a dual tank refill chemical delivery system 700. The embodiment of FIGS. 7A–7M may be used for delivery liquid chemicals, such as for example, TDEAT. As shown in FIGS. 7A–7M, this embodiment includes the use of multiple purge techniques. This techniques include a medium level vacuum, a flowing purge, and a hard vacuum. As will be discussed in greater detail below, a liquid flush may also be optionally utilized with this embodiment for aiding the draining of process lines. The optional liquid flush may be advantageous in that the long length of the process lines and their size may prevent an adequate purge of those process lines for very low vapor pressure chemicals such as TDEAT when only a medium level vacuum, a flowing purge, and a hard vacuum are used. If the purge of the process lines is inadequate, the flush liquid purge will complete the purge process.

Figure 7A:
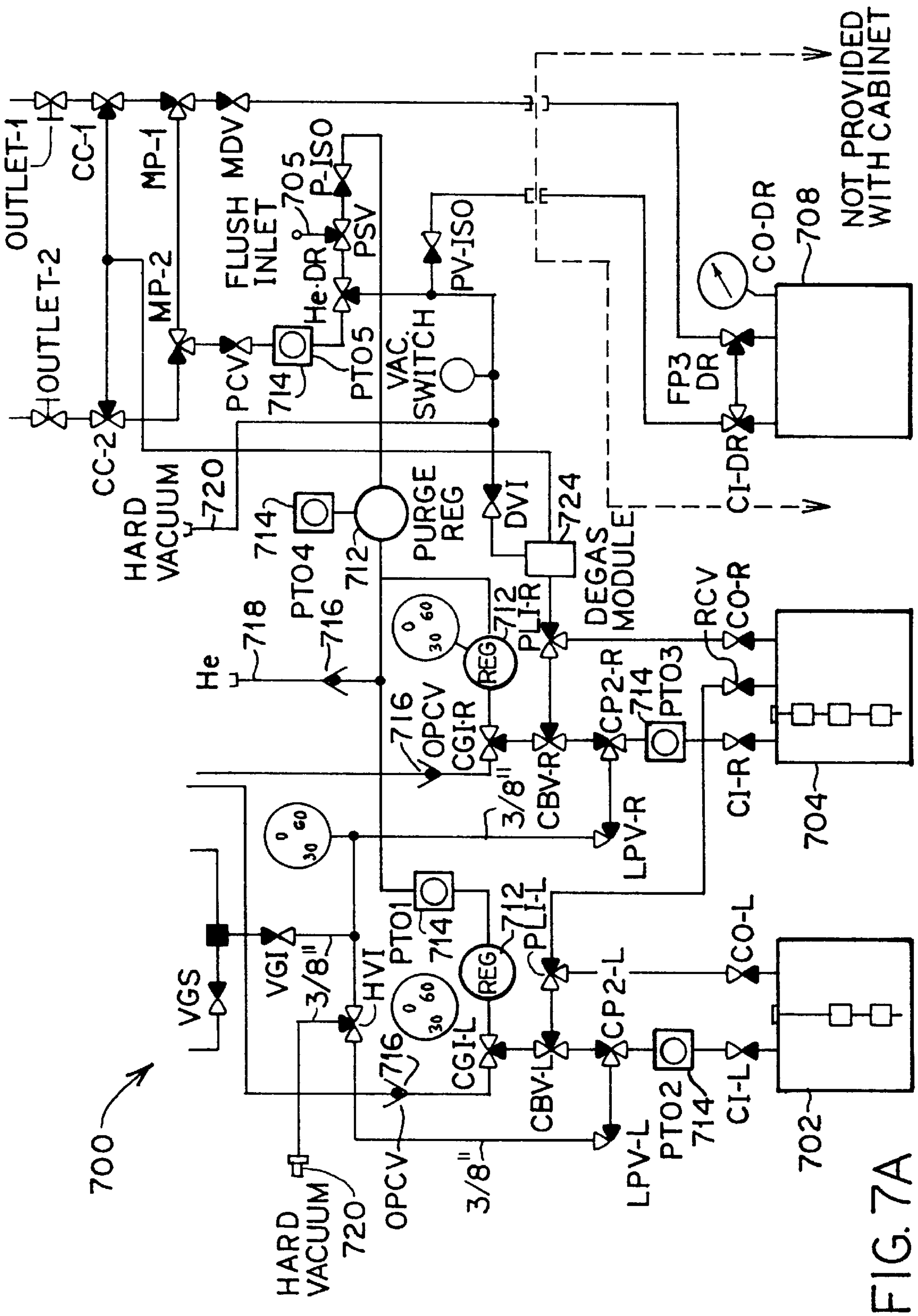

The chemical delivery system 700 of FIG. 7A may be utilized such that one chemical may be supplied from the process canister 704 (for example a 4 liter canister) to the process tool. The process canister 704 may be refilled from a bulk canister 702 (for example a 5 gallon canister). The system is designed to allow the bulk canister 702 to be removed and replaced when the chemical level of the bulk canister is low. The system also includes a process line drain reservoir 708, a liquid flush inlet 705 (which may be connected to a user's facility solvent lines or a solvent containing canister similar to as described above), and a hard vacuum connection 720 which is coupled to a hard vacuum source (for example the hard vacuum of a process tool). Associated with the bulk canister 702 are valves CGI-L, CBV-L, CP2-L, CI-L, CO-L, LPV-L, and PLI-L and associated with the process canister 704 are valves CGI-R, CBV-R, CP2-R, CI-R, CO-R, LPV-R, and PLI-R (as used in FIGS. 7A–7M "—L" indicates valves associated with the bulk canister and "—R" indicates valves associated with the process canister). A valve HVI is coupled to the hard vacuum 720 as shown and a valve VGI is coupled to the VGS valve. The various valves may be contained in a single manifold or may be contained in two or more separate manifolds of the chemical delivery system 700. The chemical delivery system may further include regulators 712, pressure transducers 714, inert gas source 718 (for example helium) and over-pressure check valves 716 as shown. A degas module 724 may be utilized to remove gas (such as helium) from the liquid being supplied to the process tool. Various portions of the chemical delivery system 600 may be connected to a hard vacuum as shown by hard vacuum connections 720. OUTLET1 and OUTLET2 supply liquid chemical to a process tool in a multi-branch outlet configuration similar to as discussed above with reference to FIG. 6B.

Figure 7B:
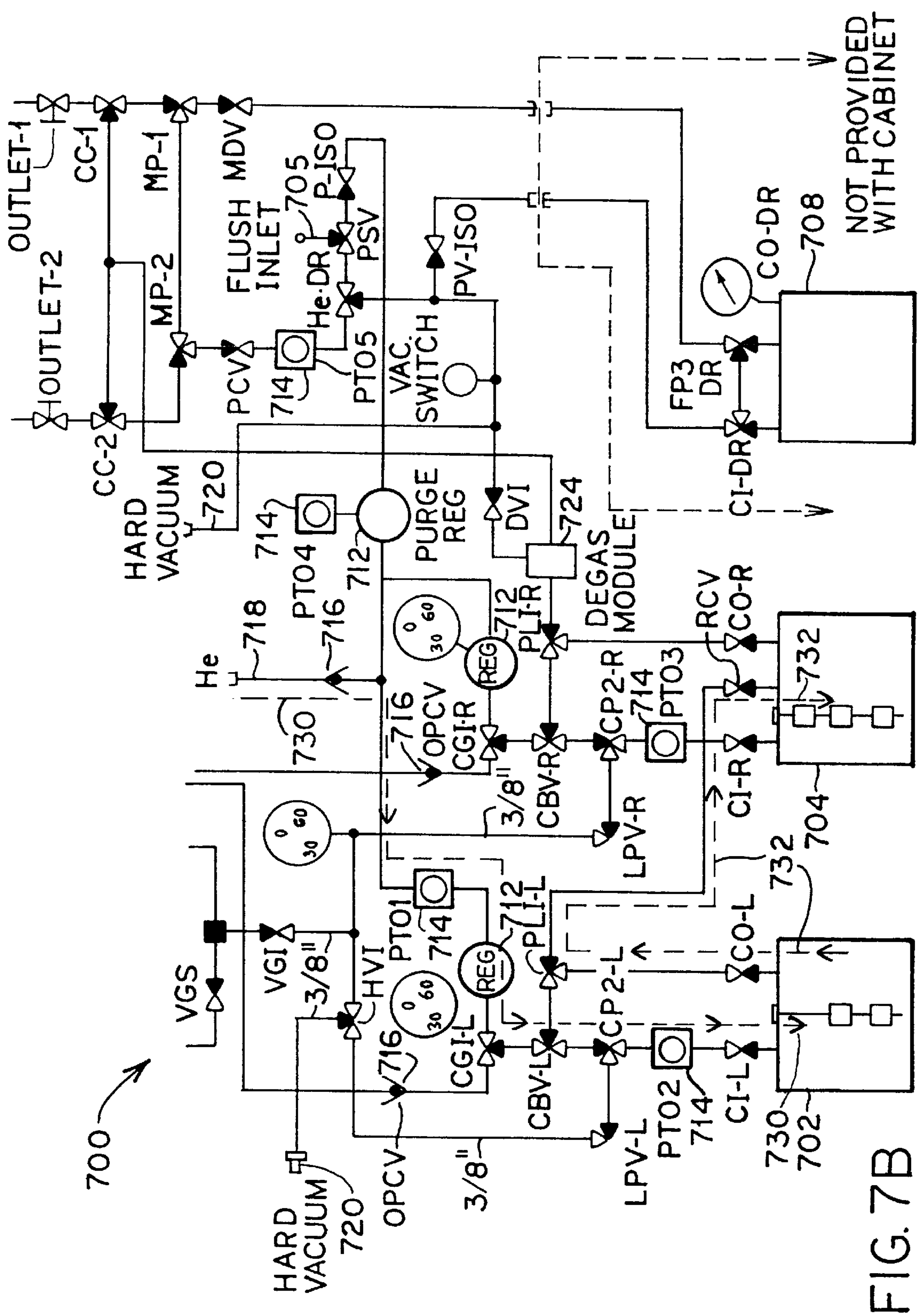
Figure 7C:
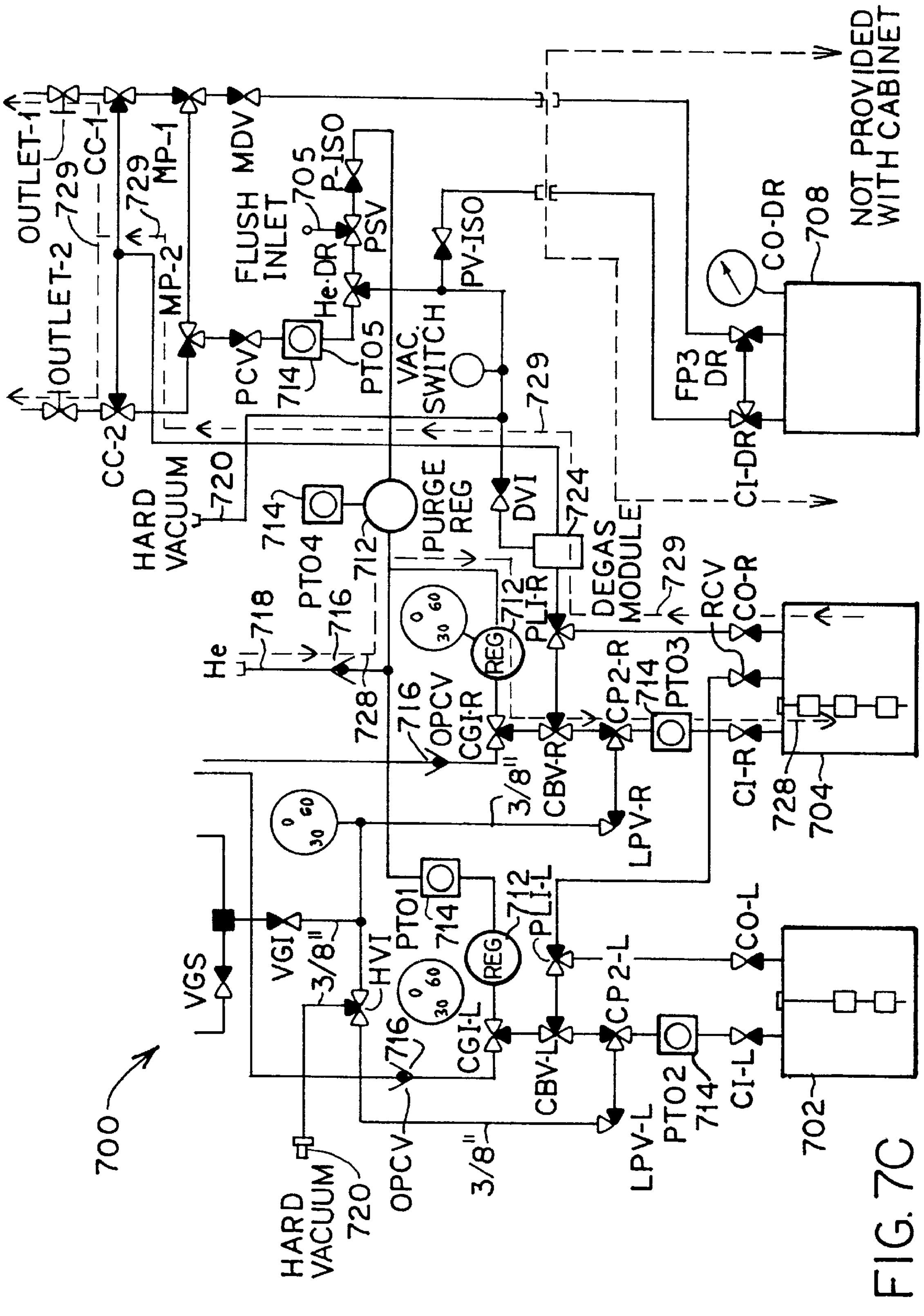
Figure 7D:
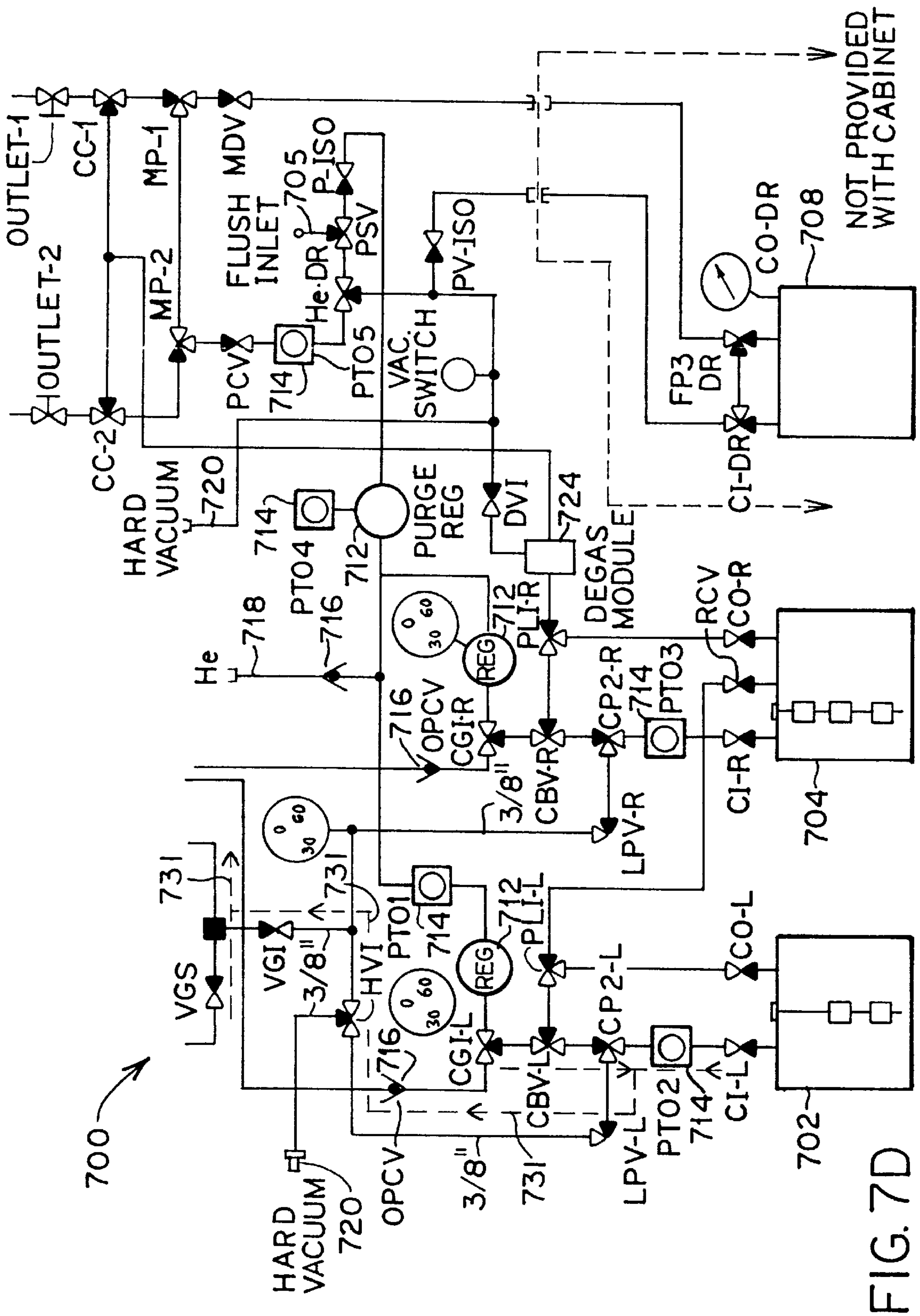
Figure 7E:
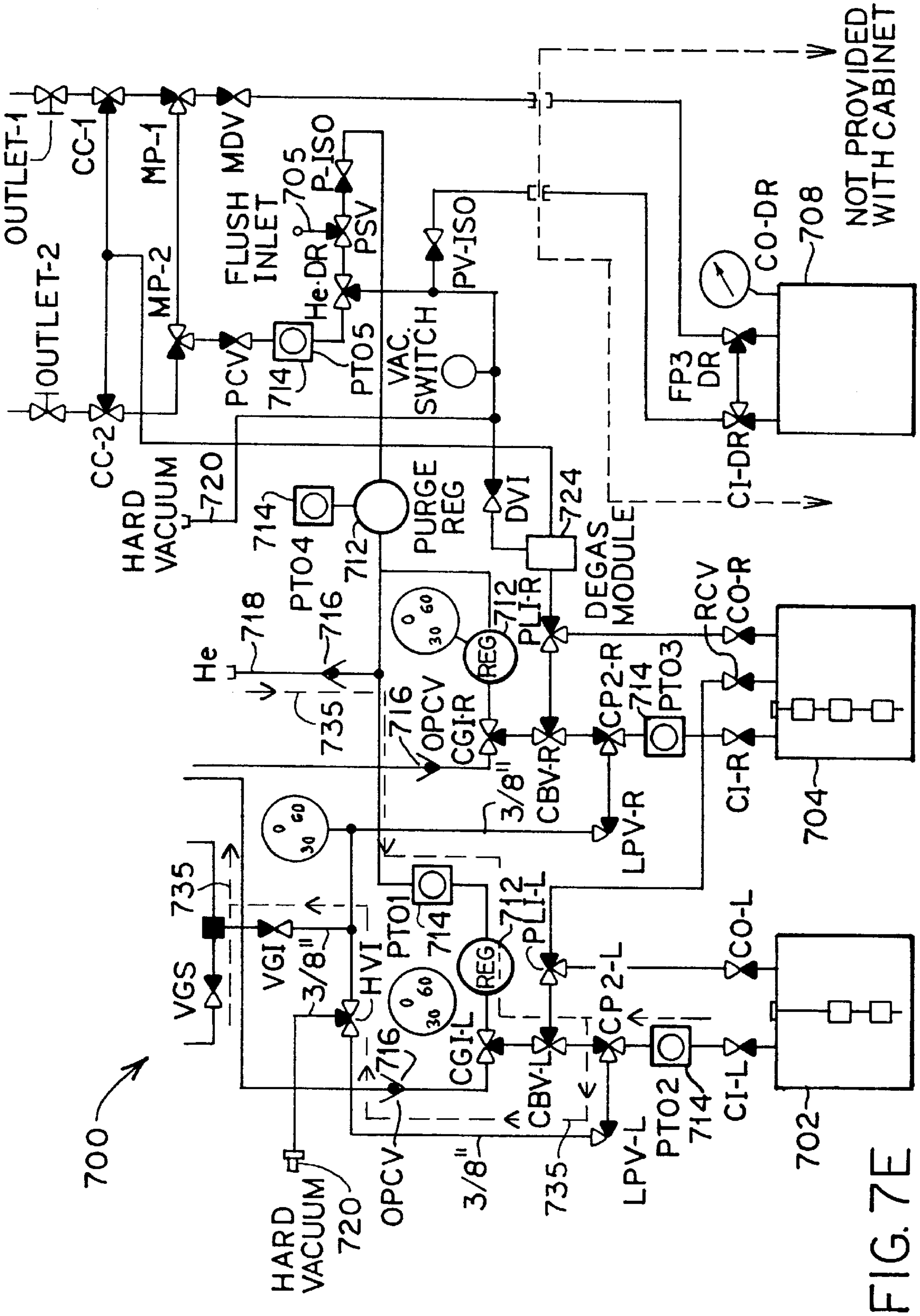
Figure 7F:
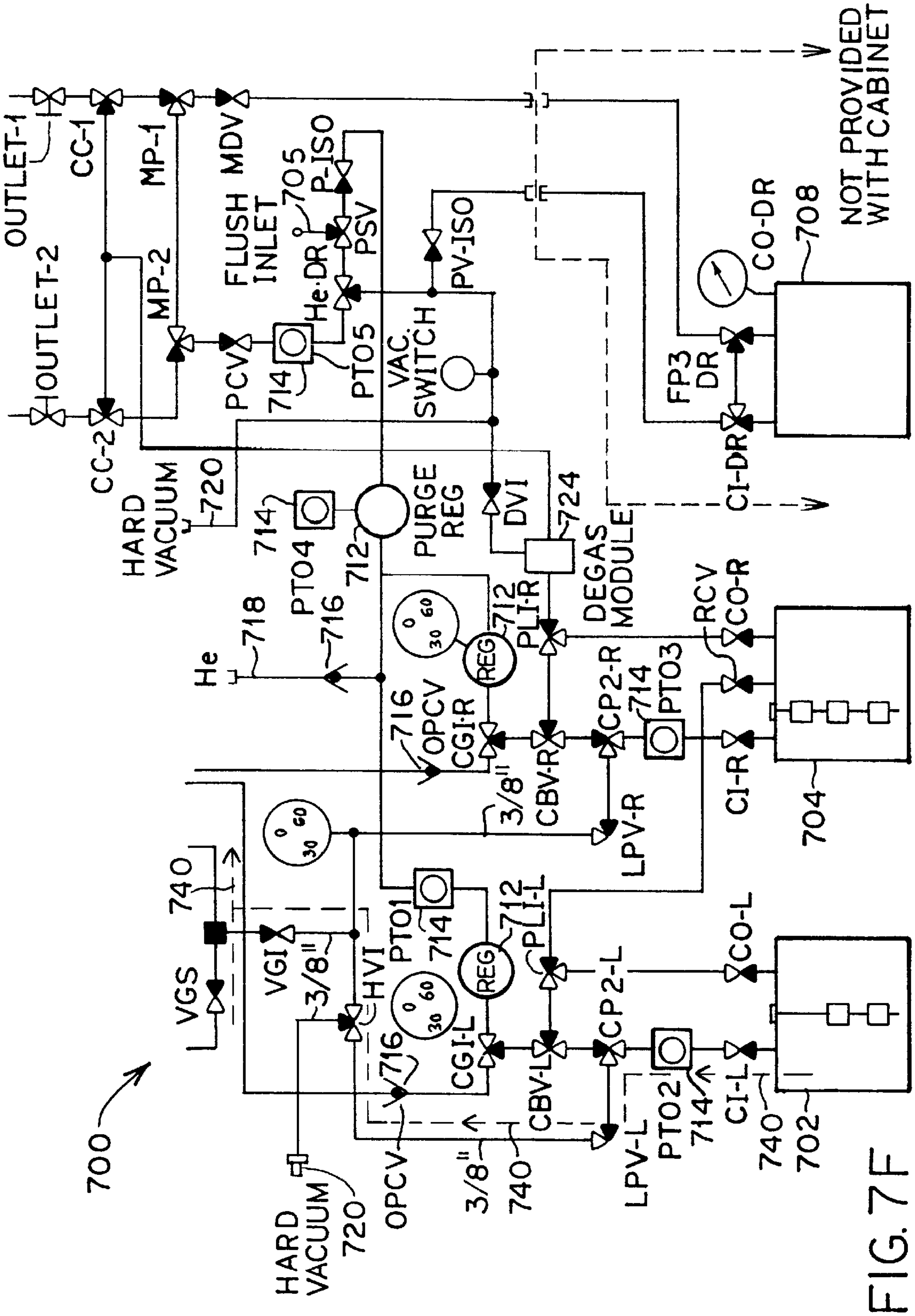
Figure 7G:
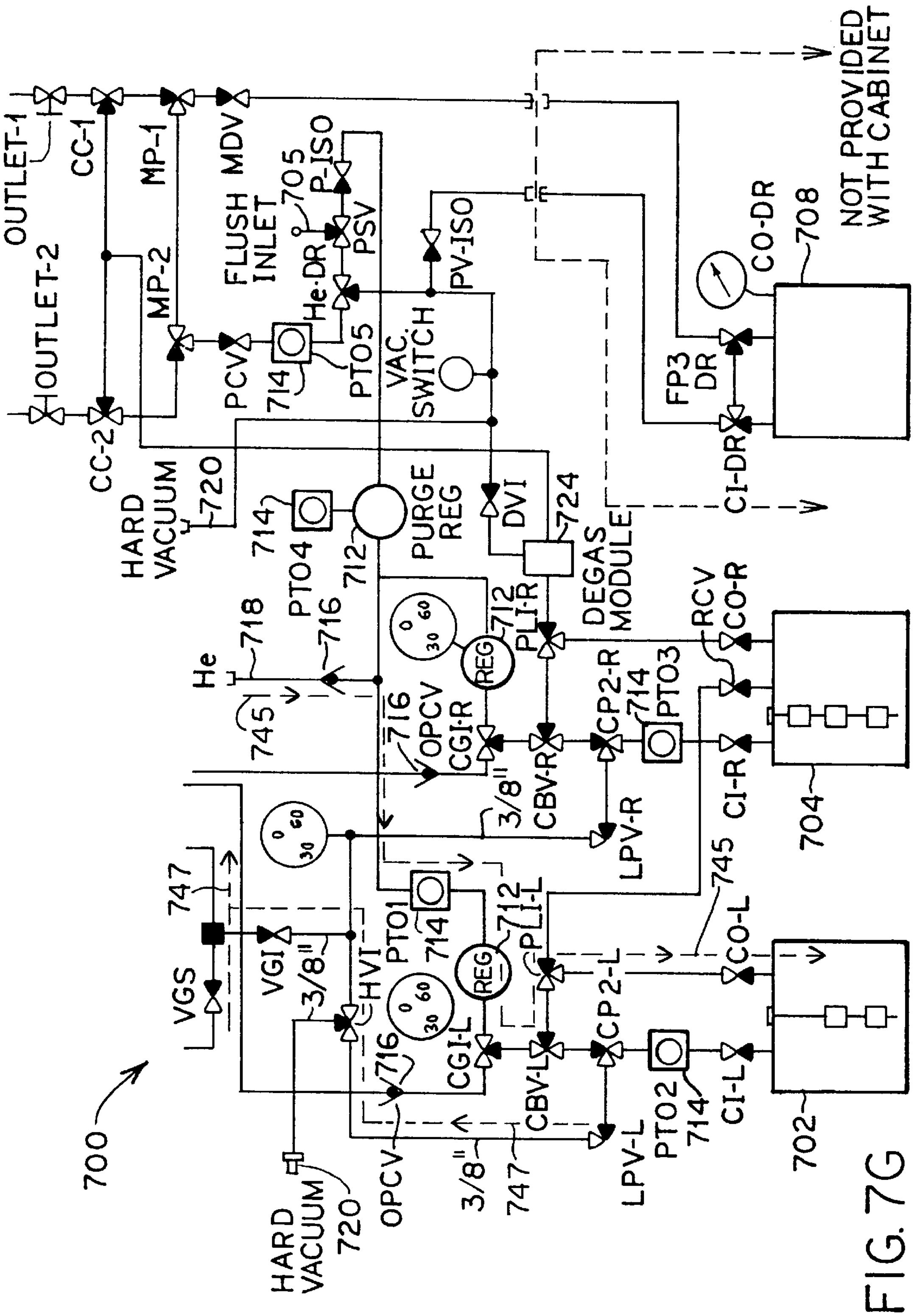
Figure 7H:
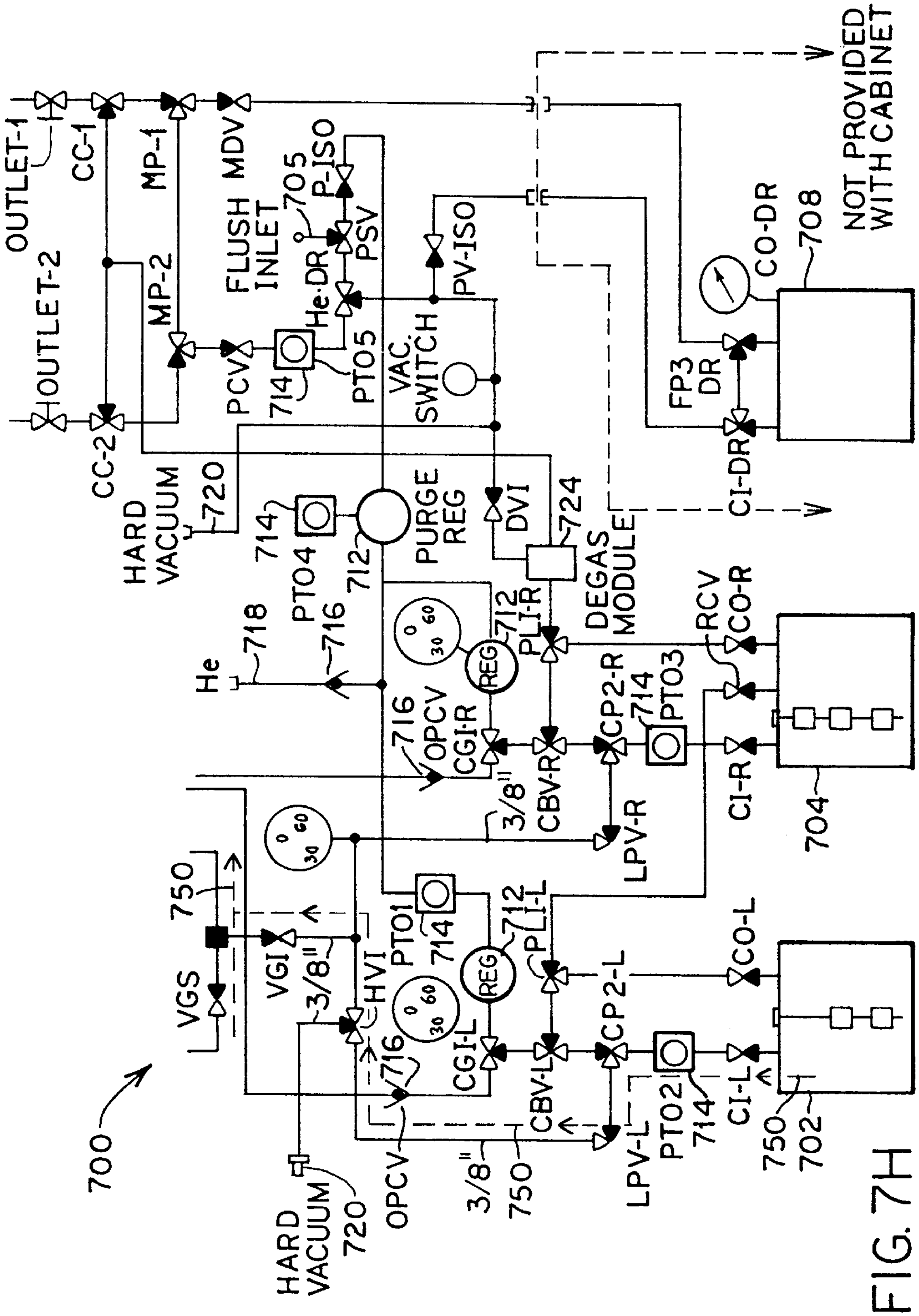
Figure 71:
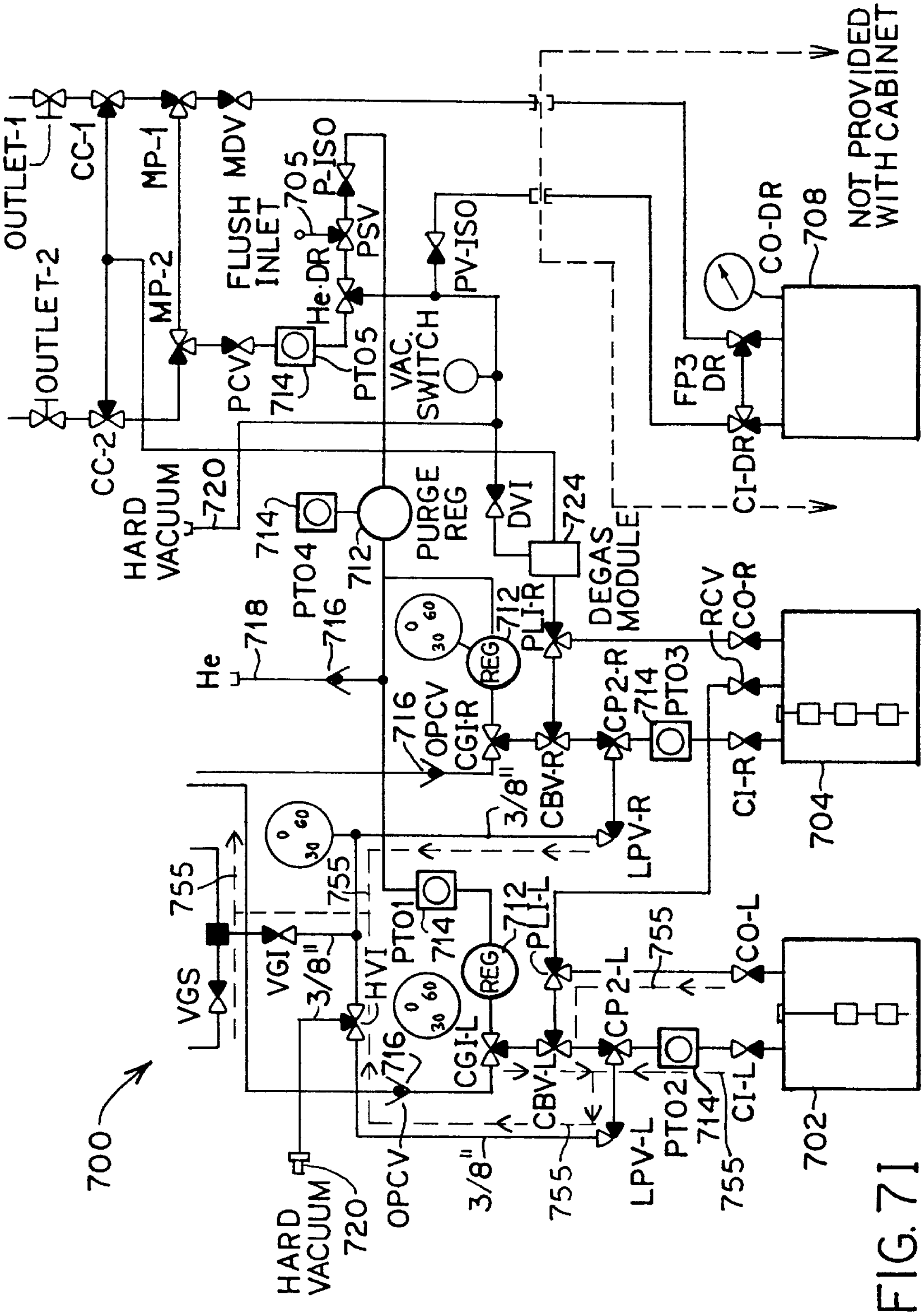
Figure 7J:
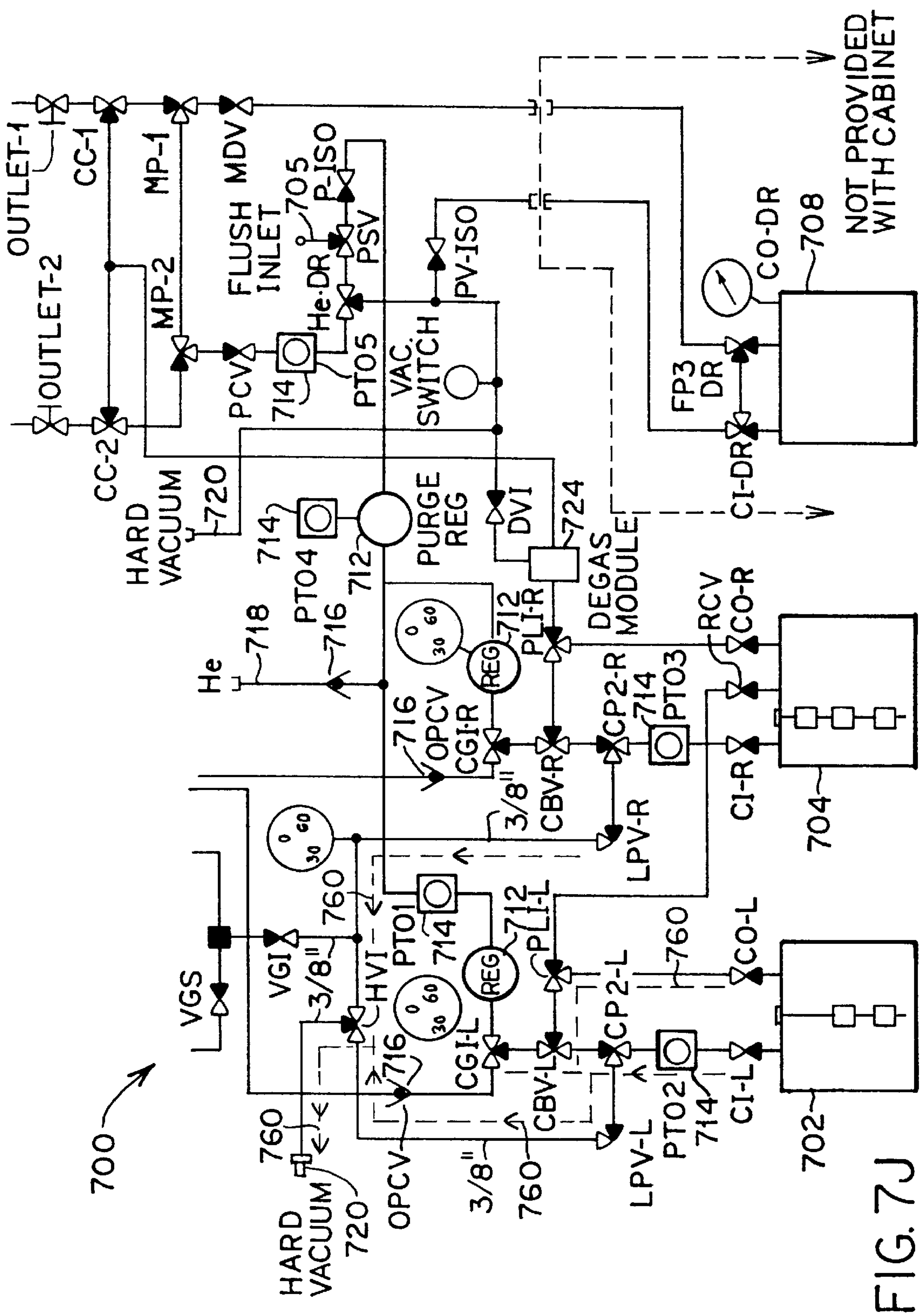

A refill step is illustrated in FIG. 7B. As shown in FIG. 7B, gas flow indicated by dashed line 730 forces chemical from the bulk canister 702 to the process canister 704 as indicated by dashed line 732. FIG. 7C illustrates the chemical delivery run mode of the chemical delivery system 700. As shown in FIG. 7C, dashed line 728 indicates the flow of gas (for example He gas) from a gas source 718 to a canister 704. The gas is used to force chemical from the canister 704 to the OUTLET1 and OUTLET2 as indicated by dashed line 729.

The purging of the sequences of FIGS. 7D–7M may be performed when it is desired to change the bulk canister 702. The purging techniques of FIGS. 7D–7M may be performed while the system is delivering chemical from process canister 704 to the process tool as shown in FIG. 7C by dashed lines 728 and 729. Thus, though not shown in FIGS. 7D–7M the gas and chemical flows indicated in FIG. 7C by dashed lines 728 and 729 may be present within each step of those figures. When a purge is desired, a cycle purge step comprised of a Venturi vacuum dry down step and a flowing purge step may be performed. The Venturi vacuum dry down step is shown by dashed line 730 of FIG. 7D and the flowing surge step is shown be dashed line 735 of FIG. 7E. The cycle purge may be repeatedly performed. Then a canister depressurization may be performed as shown by dashed line 740 in FIG. 7F by use of the Venturi vacuum. A line drain of the outlet line may then be performed as shown by dashed line 745 of FIG. 7G. During the line drain, portions of the system may be maintained under vacuum as shown by dashed line 747. Next, another canister depressurization step may be performed as shown by dashed line 750 of FIG. 7H.

Figure 7K:
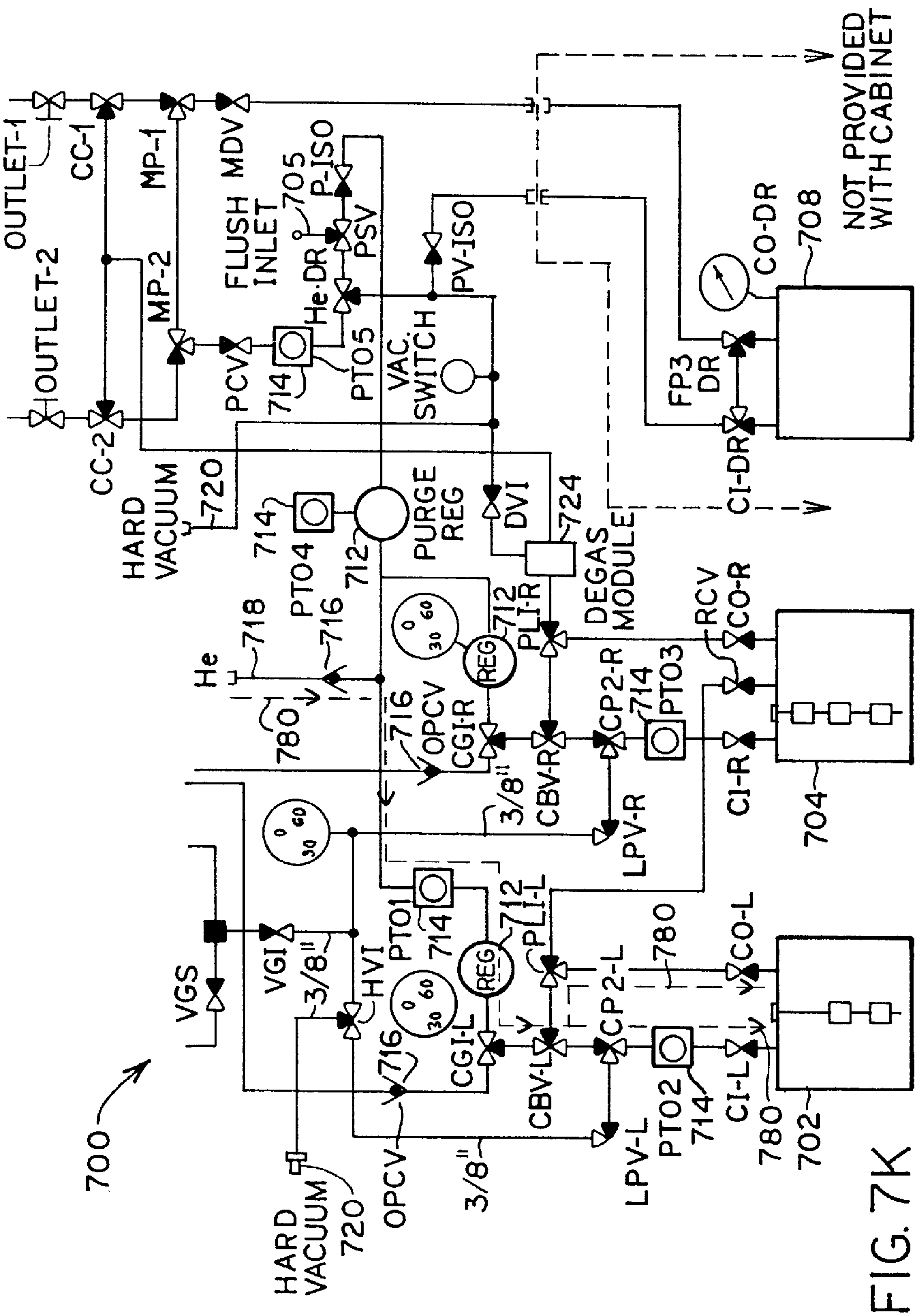
Figure 7L:
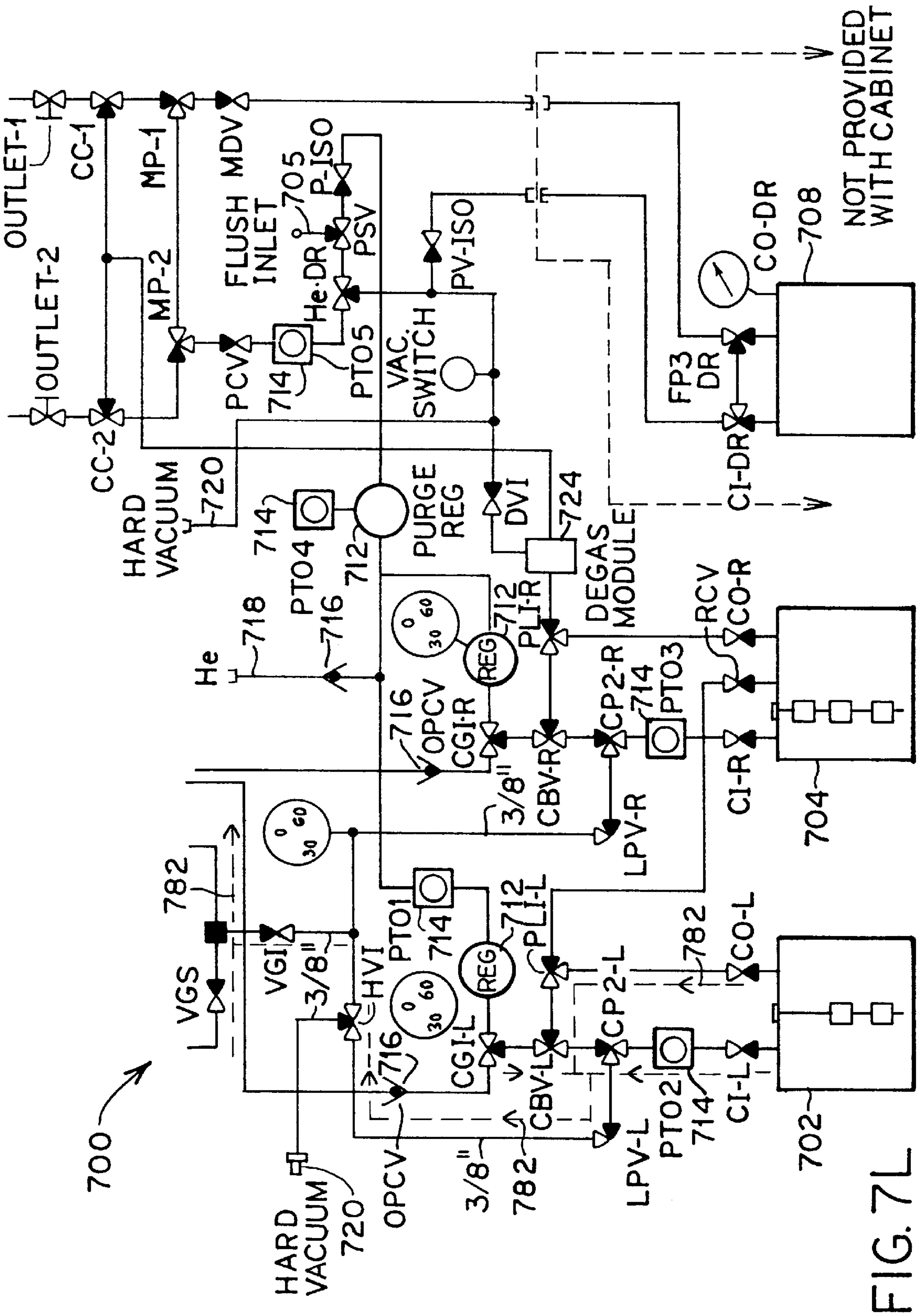
Figure 7M:
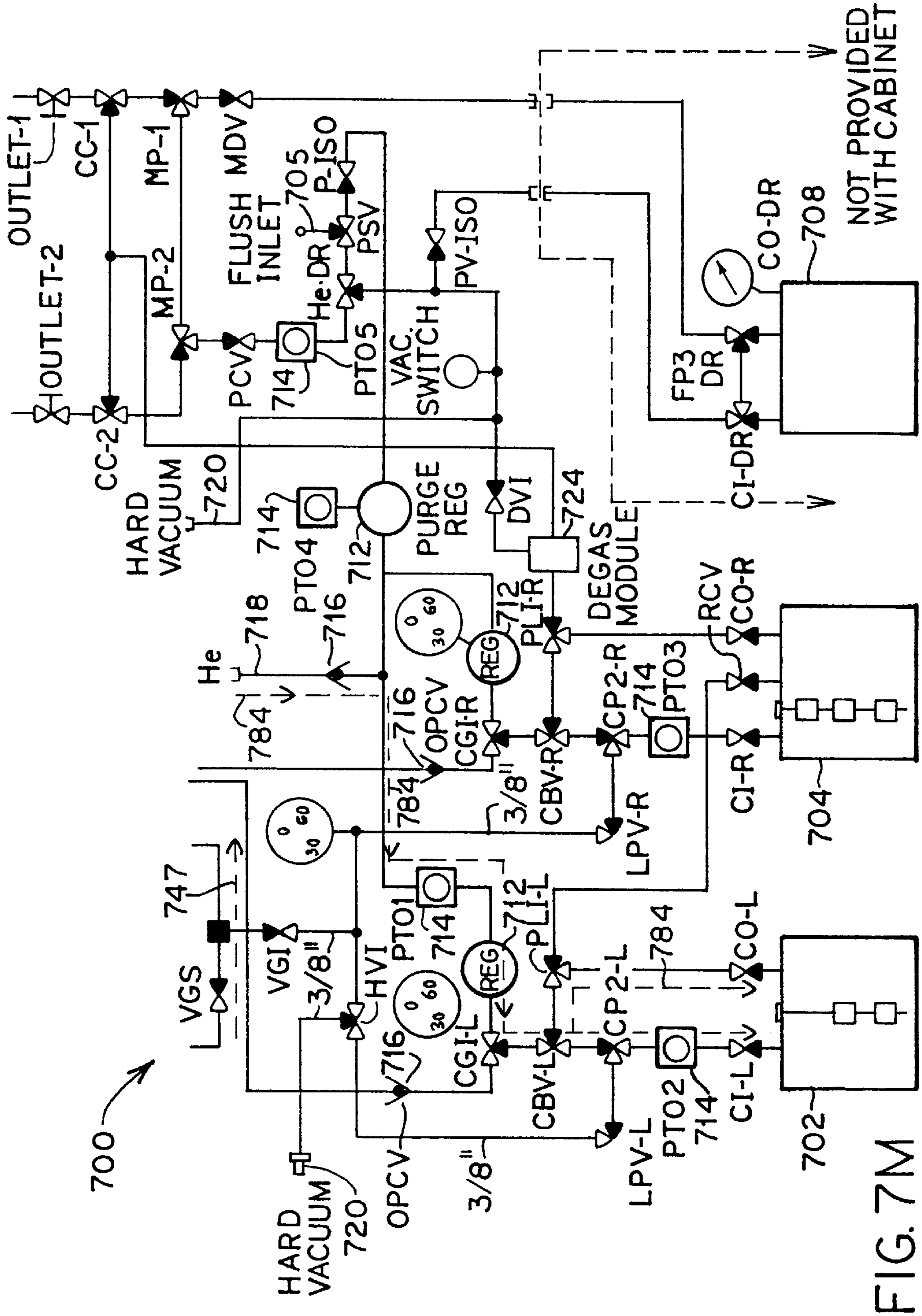

The system may then be prepared for a hard vacuum purge by first performing a Venturi vacuum as indicated by dashed lines 755 of FIG. 7I. The hard vacuum purge may then be performed as indicated by dashed lines 760 of FIG. 7J. After the system is subjected to a hard vacuum, a positive pressure and gas flow may be kept on the lines which connect to the canister inlet and outlet as shown in FIG. 7K by dashed line 780 and the canister 702 may be disconnected from the system. After reconnection of another canister 702, a Venturi vacuum step as indicated by dashed line 782 of FIG. 7L may be performed followed by a pressurization step as indicated by dashed line 784 of FIG. 7M. The vacuum and pressurization steps of FIGS. 7L and 7M may then be performed repeatedly with the cycle ending with a Venturi vacuum step as shown in FIG. 7L. Finally, a hard vacuum step as shown by dashed line 760 of FIG. 7J may be performed At this point the system is ready to utilize the new bulk canister 702.

Similar to as described above with respect to the system 600, a flush inlet 705 is provided to system 700 of FIG. 7A to allow for a liquid purge of the process lines. The waste from the liquid purge of the process lines may be collected in a process line drain reservoir utilizing the techniques as disclosed herein. The process line drain reservoir 708 may or may not be located within the same cabinet as the rest of the system 700. Moreover as with system 600, the draining and flush process of OUTLET-l may be performed while chemical is being supplied through OUTLET-2 or vice-versa. Thus, one branch of the outlets may be purged while the other branch is still operating to provide chemical to the process tool. Moreover as also discussed above with reference to FIG. 6A, the purging of the outlets takes advantage of the benefits of a multiple technique purge of the present invention (including for example, a vacuum purge, a flowing gas purge and a liquid flush purge).

Figure 8:
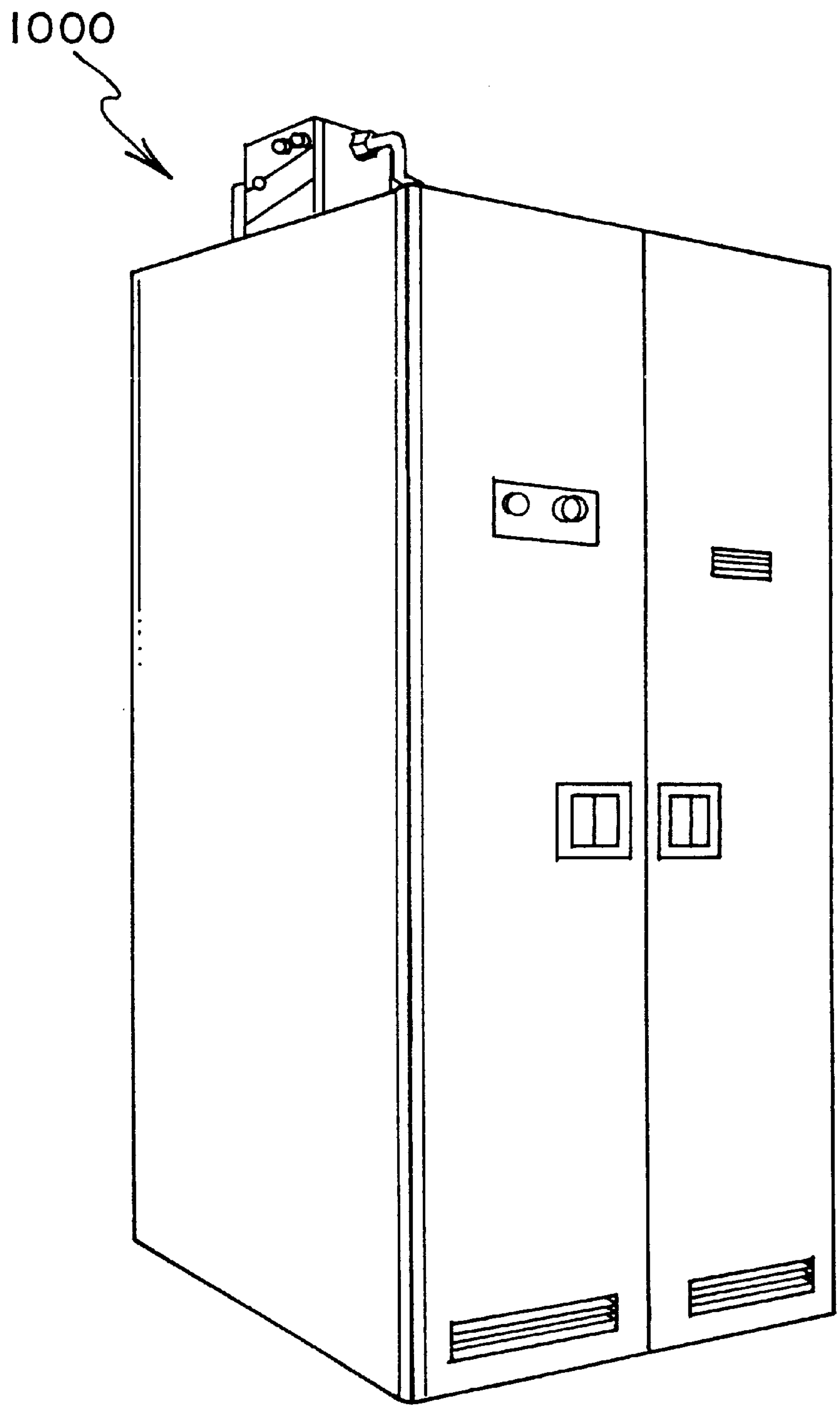
FIG. 8 illustrates a cabinet for a chemical delivery system.

The cabinet for housing a chemical delivery system of the present invention may be constructed in a wide variety of manners. Exemplary cabinet designs are shown in U.S. Pat. No. 5,711,354 and pending application Ser. No. 09/141,865 filed Aug. 28, 1998, the disclosures of which are expressly incorporated herein by reference. FIG. 8 shows a general chemical delivery system cabinet 1000. As shown in FIG. 8, the cabinet includes a plurality of cabinet walls. The walls may include sides, a top and a bottom which define an interior cabinet space. In one embodiment, the cabinet may be constructed to render it suitable for use in hazardous, explosive environments. In general, this is accomplished by isolating all electronic components in areas that are blanketed with an inert gas. In this way, a spark emanating from an electronic component will be in an environment having essentially no oxygen, which significantly reduces the likelihood of an explosion due to vapors that may be present in the cabinet.

Because some of the chemicals described above may crystallize at or near room temperature it may be desirable to provide temperature control of the environment within the cabinet 1000. Thus, for example, a desired cabinet temperature for TaEth may be maintained at an internal temperature of approximately 30 degrees Celsius. Additionally, by heating the cabinet the evaporation of chemicals from the manifold lines may be accelerated thus improving the purge of chemicals in the manifold.

Figure 9A:
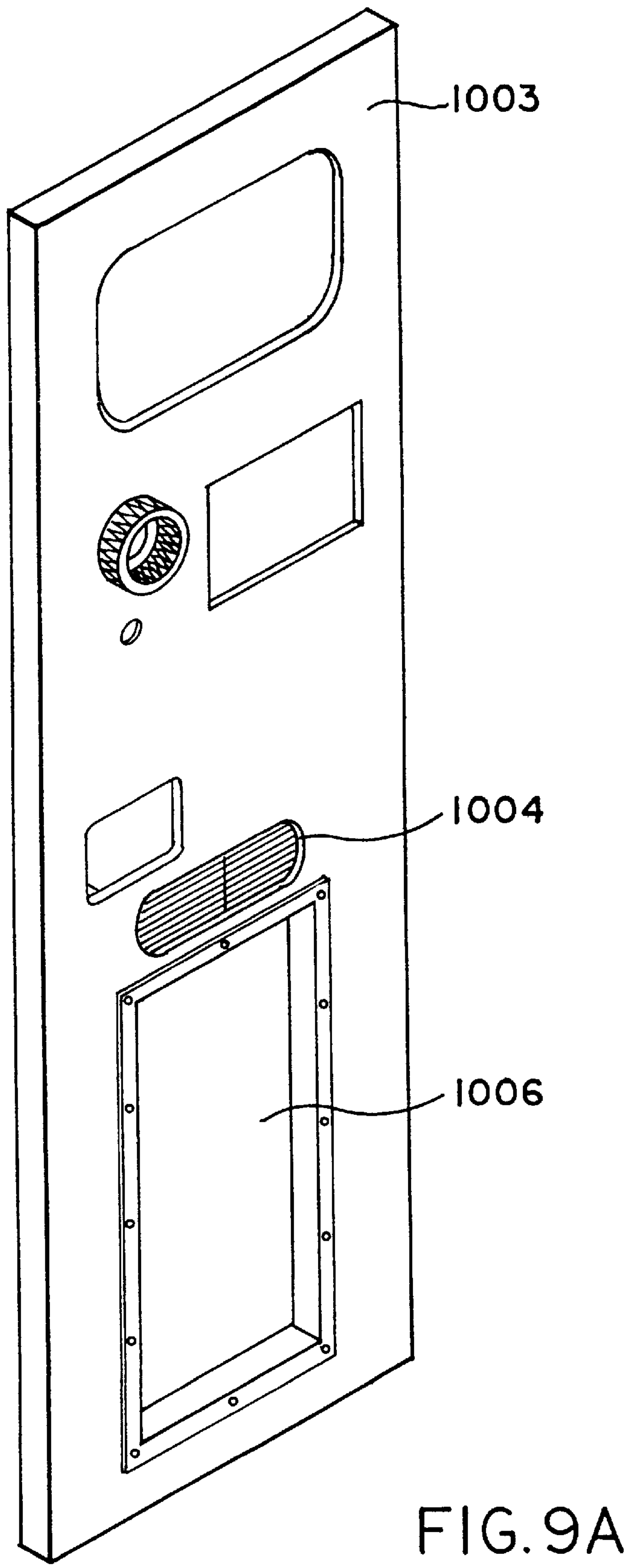
FIGS. 9A and 9B illustrate a door for use with a chemical delivery system cabinet.
Figure 9B:
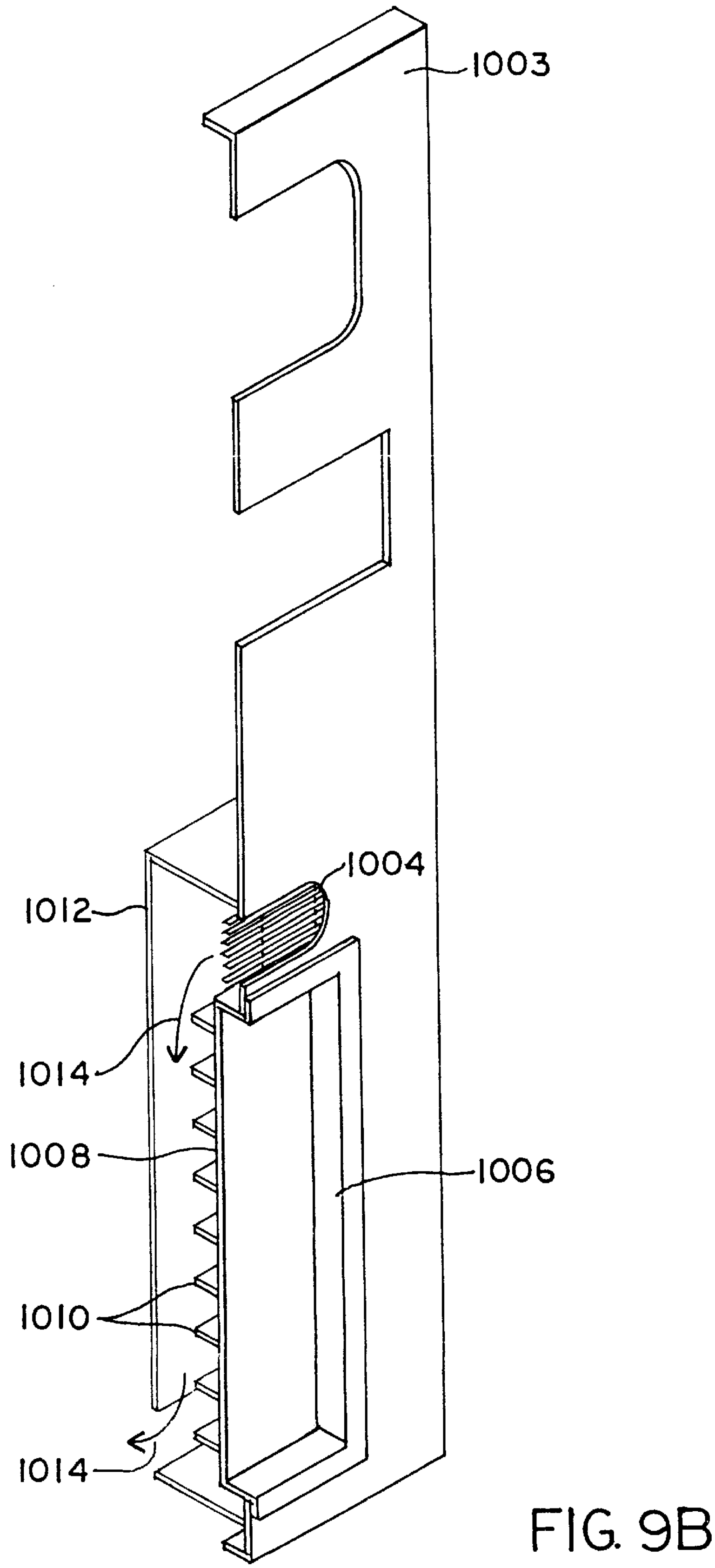

In one embodiment, the cabinet may be heated by attaching a heating element to at least one door of the cabinet. A door suitable for use with a heating element is shown in FIGS. 9A and 9B. As shown in FIG. 9A, the door 1003 may include an air vent 1004 and a heater interface 1006. Generally a positive flow of air into the cabinet is maintained (independent of use of a heater) through a vent such as air vent 1004 for safety considerations by venting an exhaust line out of the cabinet.

As can be seen in more detail in FIG. 9B, the heater interface 1006 may be a recessed cavity having a back wall 1008 recessed into the door 1003. Within the heater interface 1006 a flat heater element (for example an 8×18 inches flat electric silicon heater) may be adhered to the heater interface back wall 1008. The heater interface 1006 may be formed as an aluminum insert placed into a cavity of the door. The use of aluminum or any other material that allows for heat transfer will result in heat transferring from the heater interface to the inside of the cabinet. Placement of the heater element in this manner conveniently allows access to the heater from the front of a cabinet and helps isolate the heater from any explosive gases within the cabinet. Though not shown, a cover may be placed over the heater interface 1006 to protect the heater element and the end user.

The transfer of heat from the heater element to the cabinet is also aided through the use of air vent 1004, fins 1010 and an airflow structure 1012 that serves to funnel a flow of air over the fins 1010. Thus, the structure 1012 and heater serve to form a confined passage for the flow of air. Aluminum fins 1010 attached to the heater interface back wall 1008 act to increase the metal surface area for improved heat transfer. Air flow structure 1012 provides a path to force air which flows in air vent 1004 (as indicated by air flow arrow 1014) to flow past the back wall 1008 and fins 1010. Warm air may then enter the cabinet as indicated by air flow arrow 1014. In this manner the cabinet may be heated in an efficient and cost effective manner through the use of a heater element coupled to the front door of the cabinet. Though the heater interface of FIGS. 9A and 9B is shown as a cavity recessed into the door 1003, the heater interface may be configured in other manners. For example, the back wall of the heater interface may be placed on an outside panel of the door and thus the heater interface and element may protrude outside of the door. Similarly, the back wall of the heater interface may be placed in an opening of the door such that the back wall is flush with the door. Moreover, the heater element may be coupled to other cabinet walls such as the sides, back, top or bottom in similar manners. Thus, heat may be transferred through the walls and into the cabinet from an element external to the cabinet walls.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements may be substituted for those illustrated and described herein, and certain features of the invention may be utilized independently of the use of other features, all as would be apparent to one skilled in the art after having the benefit of this description of the invention.

What is claimed is:

1. A method of purging a low vapor pressure chemical from a plurality of valves and lines within, a chemical delivery system having a chemical source container comprising:

utilizing a first purge source to provide a first purging technique to remove chemical, gas, or contaminants from within at least some of the valves and lines;

utilizing a second purge source to provide a second purging technique to remove chemical, gas, or contaminants from within at least some of the valves and lines; and utilizing a third purge source to provide a third purging technique to remove chemical, gas, or contaminants from within at least some of the valves and lines, wherein the first, second and third purge sources are separate from the chemical source container; and wherein each of the first, second and third purging techniques are different.

2. The method of claim 1, the first purging technique being a first vacuum step, and the second purging technique being a flowing purge step utilizing an inert gas.

3. The method of claim 2, the third purging technique being a liquid flush step.

4. The method of claim 2, the third purging technique being a second vacuum step, the first and second vacuum steps utilizing different types of vacuum sources.

5. The method of claim 4, the first vacuum step utilizing a Venturi vacuum source.

6. The method of claim 5, the second vacuum step utilizing a hard vacuum source.

7. The method of claim 6, the hard vacuum source being provided from a process tool.

8. The method of claim 1, further comprising a fourth purging technique.

9. The method of claim 8, the first purging technique being a first vacuum step, the second purging technique being a flowing purge step utilizing an inert gas, the third purging technique being a liquid flush step, and the fourth purging technique being a second vacuum step, the first and second vacuum steps utilizing different types of vacuum sources.

10. The method of claim 9, the first vacuum step utilizing a Venturi vacuum source and the second vacuum step utilizing a hard vacuum source.

11. A method of operating a chemical delivery system for delivery of chemicals to a semiconductor process tool, comprising:

providing at least one liquid chemical from the chemical delivery system to the semiconductor process tool;

purging at least a portion of the chemical delivery system of gas, the liquid chemical or contaminants, the purging including the use of at least three different purging techniques each having a separate source that is separate from a chemical source container containing the liquid chemical; and changing at least one canister of the chemical delivery system, the canister containing the at least one liquid chemical.

12. The method of claim 11, the chemical delivery system having at least a first canister and a second canister.

13. The method of claim 12, the at least one liquid chemical being provided to the semiconductor process tool from the second canister, the chemical delivery system being capable of refilling the second canister from the first canister.

14. The method of claim 12, the chemical delivery system being capable of providing liquid chemical from both the first canister and the second canister to the semiconductor process tool.

15. The method of claim 11, the at least three different purging techniques comprising at least a first vacuum step and a flowing purge step utilizing an inert gas.

16. The method of claim 15, the at least three different purging techniques further comprising a liquid flush step.

17. The method of claim 16, the chemical delivery system having at least a first canister and a second canister.

18. The method of claim 17, the at least one liquid chemical being provided to the semiconductor process tool from the second canister, the chemical delivery system being capable of refilling the second canister from the first canister.

19. The method of claim 17, the chemical delivery system being capable of providing liquid chemical from both the first canister and the second canister to the semiconductor process tool.

20. The method of claim 15, the first vacuum step utilizing a Venturi vacuum source.

21. The method of claim 15, the first vacuum step utilizing a hard vacuum source.

22. The method of claim 15, the at least three different purging techniques further comprising a second vacuum step, the first and second vacuum steps utilizing different types of vacuum sources.

23. The method of claim 22, the chemical delivery system having at least a first canister and a second canister.

24. The method of claim 23, the at least one liquid chemical being provided to the semiconductor process tool from the second canister, the chemical delivery system being capable of refilling the second canister from the first canister.

25. The method of claim 13, the chemical delivery system being capable of providing liquid chemical from both the first canister and the second canister to the semiconductor process tool.

26. The method of claim 22, the first vacuum step utilizing a Venturi vacuum source.

27. The method of claim 22, the second vacuum step utilizing a hard vacuum source.

28. The method of claim 27, the hard vacuum source being provided from the semiconductor process tool.

29. The method of claim 11, the purging including the use of a fourth purging technique.

30. The method of claim 29, the first purging technique being a first vacuum step, the second purging technique being a flowing purge step utilizing an inert gas, the third purging technique being a liquid flush step, and the fourth purging technique being a second vacuum step, the first and second vacuum steps utilizing different types of vacuum sources.

31. The method of claim 30, the chemical delivery system having at least a first canister and a second canister.

32. The method of claim 31, the at least one liquid chemical being provided to the semiconductor process tool from the second canister, the chemical delivery system being capable of refilling the second canister from the first canister.

33. The method of claim 31, the chemical delivery system being capable of providing liquid chemical from both the first canister and the second canister to the semiconductor process tool.

34. The method of claim 30, the first vacuum step utilizing a Venturi vacuum source and the second vacuum step utilizing a hard vacuum source.

35. The method of claim 34, the hard vacuum source being provided from the semiconductor process tool.

36. The method of claim 35, the chemical delivery system having at least a first canister and a second canister.

37. The method of claim 36, the at least one liquid chemical being provided to the semiconductor process tool from the second canister, the chemical delivery system being capable of refilling the second canister from the first canister.

38. The method of claim 36, the chemical delivery system being capable of providing liquid chemical from both the first canister and the second canister to the semiconductor process tool.

39. A method of purging a low vapor pressure liquid chemical from a chemical delivery system, comprising:

providing a chemical source container containing the low vapor pressure liquid chemical that is being delivered to at least one line or valve of the chemical delivery system; and purging the at least one line or valve of the low vapor pressure liquid chemical utilizing at least three different purge sources that are separate from the chemical source container containing the low vapor pressure, liquid chemical, the purging including the use of at least three different purging techniques.

40. The method of claim 39, the low vapor pressure liquid chemical being TaEth.

41. The method of claim 40, the chemical delivery system having at least a first canister and a second canister, the low vapor pressure liquid chemical being provided to the semiconductor process tool from the second canister, the chemical delivery system being capable of refilling the second canister from the first canister.

42. The method of claim 40, the chemical delivery system having at least a first canister and a second canister, the chemical delivery system being capable of providing the low vapor pressure liquid chemical from both the first canister and the second canister to a semiconductor process tool.

43. The method of claim 40, the at least three different purging techniques comprising at least a first vacuum step and a flowing purge step utilizing an inert gas.

44. The method of claim 43, the at least three different purging techniques further comprising a liquid flush step.

45. The method of claim 39, the low vapor pressure liquid chemical being TDEAT.

46. The method of claim 45, the chemical delivery system having at least a first canister and a second canister, the TDEAT being provided to the semiconductor process tool from the second canister, the chemical delivery system being capable of refilling the second canister from the first canister.

47. The method of claim 45, the chemical delivery system having at least a first canister and a second canister, the chemical delivery system being capable of providing TDEAT from both the first canister and the second canister to the semiconductor process tool.

48. The method of claim 45, the at least three different purging techniques comprising at least a first vacuum step and a flowing purge step utilizing an inert gas.

49. The method of claim 48, the at least three different purging techniques further comprising a liquid flush step.

50. The method of claim 39, the low vapor pressure liquid chemical being BST.

51. The method of claim 50, the chemical delivery system having at least a first canister and a second canister, the BST being provided to the semiconductor process tool from the second canister, the chemical delivery system being capable of refilling the second canister from the first canister.

52. The method of claim 50, the chemical delivery system having at least a first canister and a second canister, the chemical delivery system being capable of providing BST from both the first canister and the second canister to the semiconductor process tool.

53. The method of claim 50, the at least three different purging techniques comprising at least a first vacuum step and a flowing purge step utilizing an inert gas.

54. The method of claim 53, the at least three different purging techniques further comprising a liquid flush step.

55. A chemical delivery system, comprising:

at least one canister inlet and at least one canister outlet line capable of coupling at least one chemical canister source holding a chemical;

a plurality of manifold valves and lines;

a first purge source inlet coupling a first purge source to the plurality of manifold valves and lines;

a second purge source inlet coupling a second purge source to the plurality of manifold valves and lines; and a third purge source inlet coupling a third purge source to the plurality of manifold valves and lines, the first, second and third purge sources each being different types of purge sources wherein the first, second and third purge sources are separate from the at least one chemical canister source.

56. The system of claim 55, the first purge source being a first vacuum source, and the second purge source being a gas source.

57. The system of claim 56, the third purge source being a liquid source.

58. The system of claim 56, further comprising a liquid waste output line.

59. The system of claim 56, the third purge source being a second vacuum source, the first and second vacuum sources being different types of vacuum sources.

60. The system of claim 59, the first vacuum source being a Venturi vacuum source.

61. The system of claim 60, the second vacuum source being a hard vacuum source.

62. The system of claim 61, the hard vacuum source being provided from a process tool.

63. The system of claim 55, further comprising a fourth purge source.

64. The system of claim 63, the first purge being a first vacuum source, the second purge being an inert gas source, the third purge being a liquid source, and the fourth purge source being a second vacuum source, the first and second vacuum sources being different types of vacuum sources.

65. The system of claim 64, the first vacuum source being a Venturi vacuum source and the second vacuum source being a hard vacuum source.

66. A chemical delivery system for delivery of low vapor pressure liquid chemicals to a semiconductor process tool, comprising:

at least one chemical output line, the chemical output line coupled to the manifold of the chemical delivery system and operable to provide the low vapor pressure liquid chemical to the semiconductor process tool;

at least three purge source inlet lines, the purge source inlet lines coupling at least three different purge sources to the manifold for purging the manifold for purging the manifold; and one or more refillable canisters coupled to the manifold wherein the at least three different purge sources are separate from said one or more refillable canister.

67. The system of claim 66, the one or more refillable canisters comprising at least a first canister and a second canister.

68. The system of claim 57, the low vapor pressure liquid chemical being provided to the semiconductor process tool from the second canister, the chemical delivery system being capable of refilling the second canister from the first canister.

69. The system of claim 67, the chemical delivery system being capable of providing liquid chemical from both the first canister and the second canister to the semiconductor process tool.

70. The system of claim 66, the at least three different purge sources comprising at least a first vacuum source and a gas source.

71. The system of claim 60, the at least three different purge sources further comprising a liquid source.

72. The system of claim 71, the chemical delivery system having at least a first canister and a second canister.

73. The system of claim 72, the at low vapor pressure liquid chemical being provided to the semiconductor process tool from the second canister, the chemical delivery system being capable of refilling the second canister from the first canister.

74. The system of claim 72, the chemical delivery system being capable of providing liquid chemical from both the first canister and the second canister to the semiconductor process tool.

75. The system of claim 70, the first vacuum source being a Venturi vacuum source.

76. The system of claim 70, the first vacuum source being a hard vacuum source.

77. The system of claim 70, the at least three different purge sources further comprising a second vacuum source, the first and second vacuum sources being different types of vacuum sources.

78. The system of claim 77, the chemical delivery system having at least a first canister and a second canister.

79. The system of claim 78, the low vapor pressure liquid chemical being provided to the semiconductor process tool from the second canister, the chemical delivery system being capable of refilling the second canister from the first canister.

80. The system of claim 78, the chemical delivery system being capable of providing liquid chemical from both the first canister and the second canister to the semiconductor process tool.

81. The system of claim 77, the first vacuum source being a Venturi vacuum source.

82. The system of claim 77, the second vacuum source being a hard vacuum source.

83. The system of claim 82, the hard vacuum source being provided from the semiconductor process tool.

84. The system of claim 66, further comprising a fourth purge source inlet line, the fourth purge source inlet line coupling a fourth purge source to the manifold.

85. The system of claim 84, the first purge source being a first vacuum source, the second purge source being an inert gas source, the third purge source being a liquid source, and the fourth purge source being a second vacuum source, the first and second vacuum sources being different types of vacuum sources.

86. The system of claim 85, the chemical delivery system having at least a first canister and a second canister.

87. The system of claim 86, the low vapor pressure liquid chemical being provided to the semiconductor process tool from the second canister, the chemical delivery system being capable of refilling the second canister from the first canister.

88. The system of claim 86, the chemical delivery system being capable of providing liquid chemical from both the first canister and the second canister to the semiconductor process tool.

89. The system of claim 85, the first vacuum source being a Venturi vacuum source and the second vacuum source being a hard vacuum source.

90. The system of claim 89, the hard vacuum source being provided from the semiconductor process tool.

91. The system of claim 90, the chemical delivery system having at least a first canister and a second canister.

92. The system of claim 91, the low vapor pressure liquid chemical being provided to the semiconductor process tool from the second canister, the chemical delivery system being capable of refilling the second canister from the first canister.

93. The system of claim 91, the chemical delivery system being capable of providing liquid chemical from both the first canister and the second canister to the semiconductor process tool.

* * * * *

UNITED STATES PATENT AND TRADEMARK OFFICE
CERTIFICATE OF CORRECTION

PATENT NO. : 6,199,599 B1
DATED : March 13, 2001
INVENTOR(S) : Gregg et al.

It is certified that error appears in the above-identified patent and that said Letters Patent is hereby corrected as shown below:

Column 2, claim 1,
Line 36, delete the "," after the word "within".

Signed and Sealed this

Twentieth Day of November, 2001

*Attest:*

Nicholas P. Godici

NICHOLAS P. GODICI

*Attesting Officer* *Acting Director of the United States Patent and Trademark Office*